US007796204B2

(12) United States Patent
Chang et al.

(10) Patent No.: US 7,796,204 B2
(45) Date of Patent: Sep. 14, 2010

(54) ARRAY SUBSTRATE HAVING COLOR FILTER ON THIN FILM TRANSISTOR STRUCTURE FOR LCD DEVICE AND METHOD OF FABRICATING THE SAME

(75) Inventors: Youn-Gyoung Chang, Gyeonggi (KR); Seung-Ryull Park, Incheon (KR); Woong-Kwon Kim, Gyeonggi (KR); Jong-Hwae Lee, Seoul (KR)

(73) Assignee: LG Display Co., Ltd., Seoul (KR)

( * ) Notice: Subject to any disclaimer, the term of this patent is extended or adjusted under 35 U.S.C. 154(b) by 209 days.

(21) Appl. No.: 12/155,933

(22) Filed: Jun. 11, 2008

(65) Prior Publication Data
US 2008/0287029 A1 Nov. 20, 2008

Related U.S. Application Data

(62) Division of application No. 11/652,039, filed on Jan. 11, 2007, now Pat. No. 7,400,366, which is a division of application No. 10/724,892, filed on Dec. 2, 2003, now Pat. No. 7,180,559.

(30) Foreign Application Priority Data

Dec. 9, 2002 (KR) .................. 10-2002-0078007
Dec. 11, 2002 (KR) .................. 10-2002-0078910

(51) Int. Cl.
G02F 1/136 (2006.01)
G02F 1/1333 (2006.01)
G02F 1/1345 (2006.01)
(52) U.S. Cl. .................. 349/43; 349/110; 349/149
(58) Field of Classification Search .................. 349/43, 349/106, 110
See application file for complete search history.

(56) References Cited

U.S. PATENT DOCUMENTS 5,264,728 A * 11/1993 Ikeda et al. .................. 257/761
5,710,606 A * 1/1998 Nakajima et al. ............. 349/42
5,976,734 A 11/1999 Yamaguchi (Continued)

FOREIGN PATENT DOCUMENTS

JP 07-072473 3/1995

(Continued)

OTHER PUBLICATIONS

Birendra Bahadur, Liquid Crystals Applications and Uses 1990, World Scientific, vol. 1, pp. 171-194.*

Primary Examiner—David Nelms
Assistant Examiner—David Y Chung
(74) Attorney, Agent, or Firm—McKenna Long & Aldridge LLP

(57) ABSTRACT

An array substrate device includes a gate line formed on a substrate extending along a first direction having a gate electrode, a data line formed on the substrate extending along a second direction having a data pad disposed apart from a first end of the data line, the data and gate lines defining a pixel region, a gate pad formed on the substrate disposed apart from a first end of the gate line, a thin film transistor formed at a crossing region of the gate and data lines and including the gate electrode, a semiconductor layer, a source electrode, and a drain electrode, a black matrix overlapping the thin film transistor, the gate line, and the data line except for a first portion of the drain electrode, a first pixel electrode at the pixel region contacting the first portion of the drain electrode and the substrate, a color filter on the first pixel electrode at the pixel region, and a second pixel electrode on the color filter contacting the first pixel electrode.

7 Claims, 82 Drawing Sheets

U.S. PATENT DOCUMENTS

| | | | |
|---|---|---|---|
| 6,255,130 B1 | 7/2001 | Kim | |
| 6,287,899 B1 | 9/2001 | Park et al. | |
| 6,335,276 B1 | 1/2002 | Park et al. | |
| 6,504,585 B2 | 1/2003 | Ohkawara et al. | |
| 6,525,791 B1 * | 2/2003 | Tsuda et al. | 349/106 |
| 6,744,486 B2 | 6/2004 | Kim et al. | |
| 6,768,535 B2 | 7/2004 | Yasukawa et al. | |
| 6,873,382 B2 | 3/2005 | Chang et al. | |
| 6,879,359 B1 * | 4/2005 | Kikkawa et al. | 349/113 |
| 6,900,856 B2 | 5/2005 | Kim et al. | |
| 7,133,104 B2 | 11/2006 | Kim et al. | |

FOREIGN PATENT DOCUMENTS

| | | |
|---|---|---|
| JP | 09-113922 | 5/1997 |
| JP | 09-292633 | 11/1997 |
| JP | 10-062812 | 3/1998 |
| JP | 11-024094 | 1/1999 |
| JP | 2000-162625 | 6/2000 |
| JP | 2001-066417 | 3/2001 |
| JP | 2001-195005 | 7/2001 |
| JP | 2001-201761 | 7/2001 |
| JP | 2002-169182 | 6/2002 |
| JP | 2002-006773 | 11/2002 |
| JP | 2004-094206 | 3/2004 |
| JP | 2004-310039 | 11/2004 |
| KR | 1020010010743 | 2/2001 |
| KR | 10-2001-0066174 A | 7/2001 |
| KR | 10-2002-0007037 A | 1/2002 |
| KR | 1020020045256 | 6/2002 |
| KR | 1020040050236 | 6/2004 |

* cited by examiner

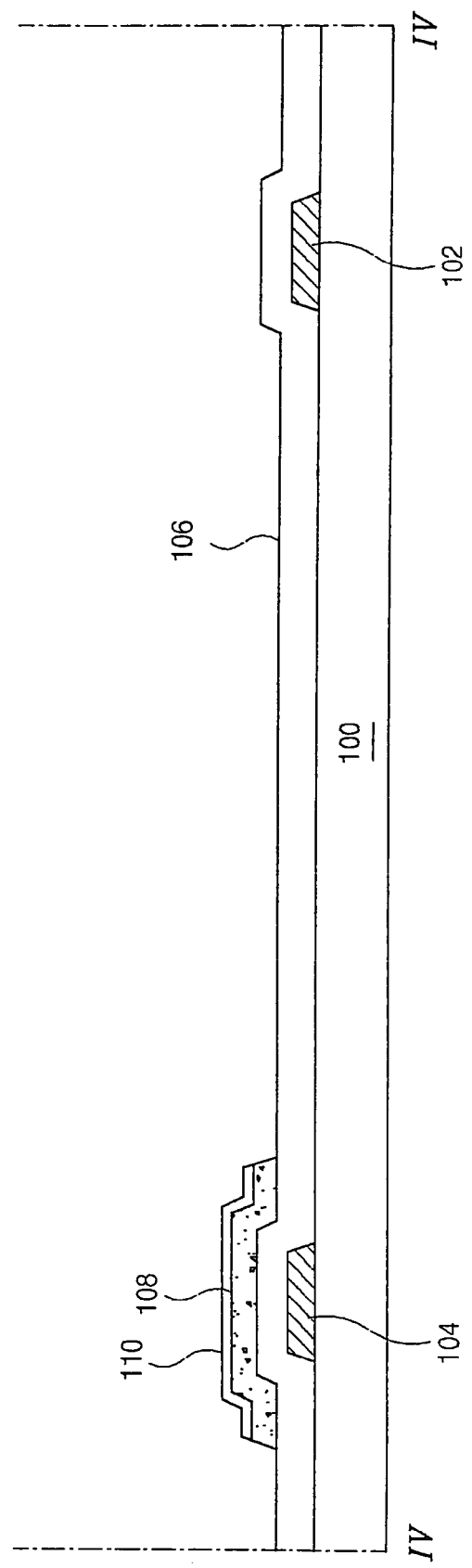

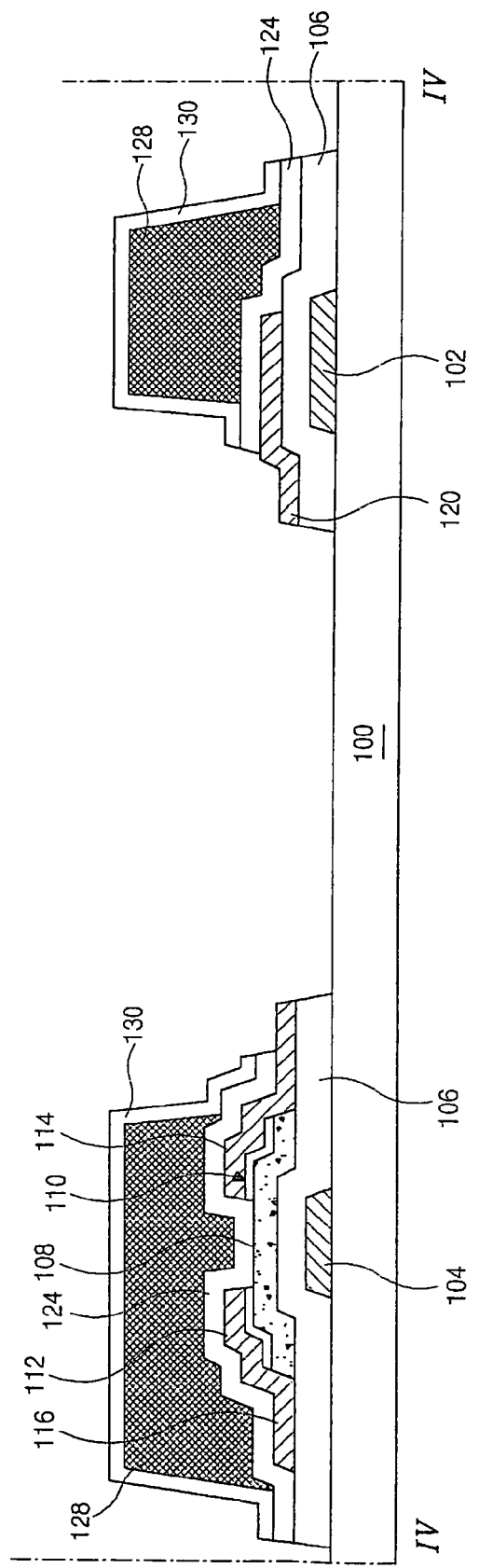

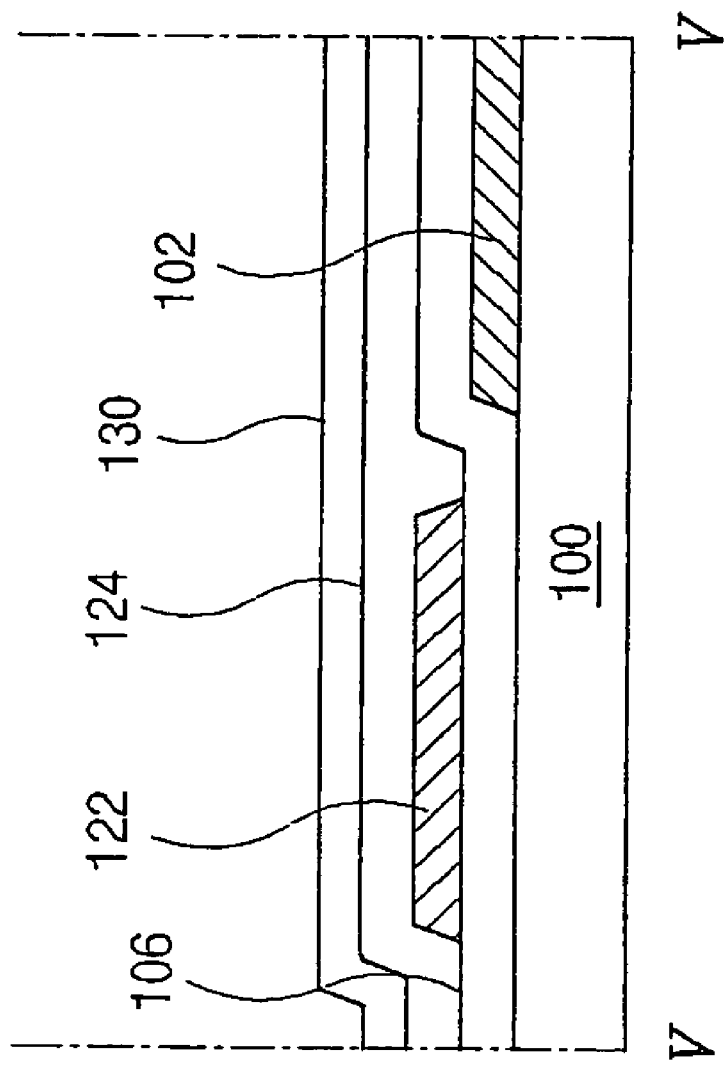

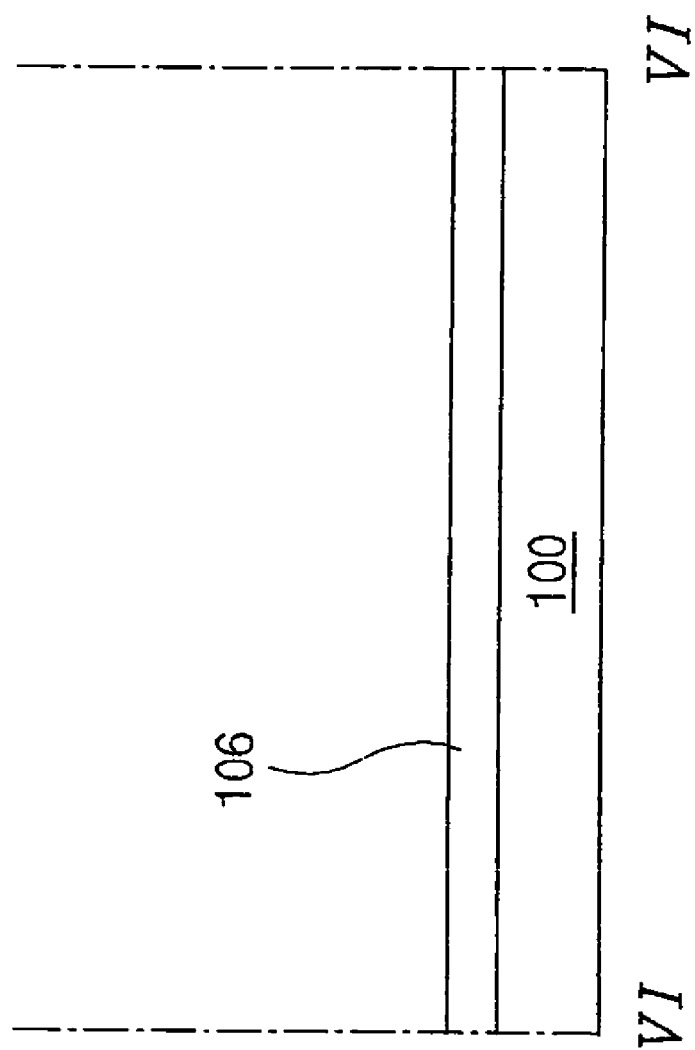

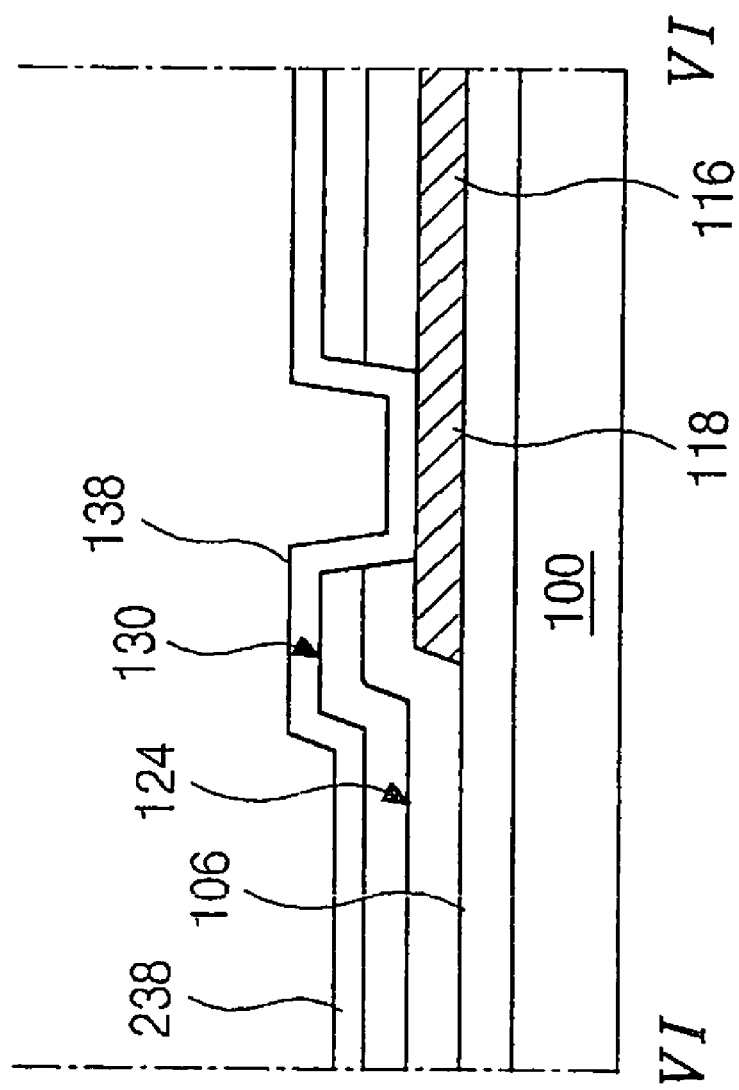

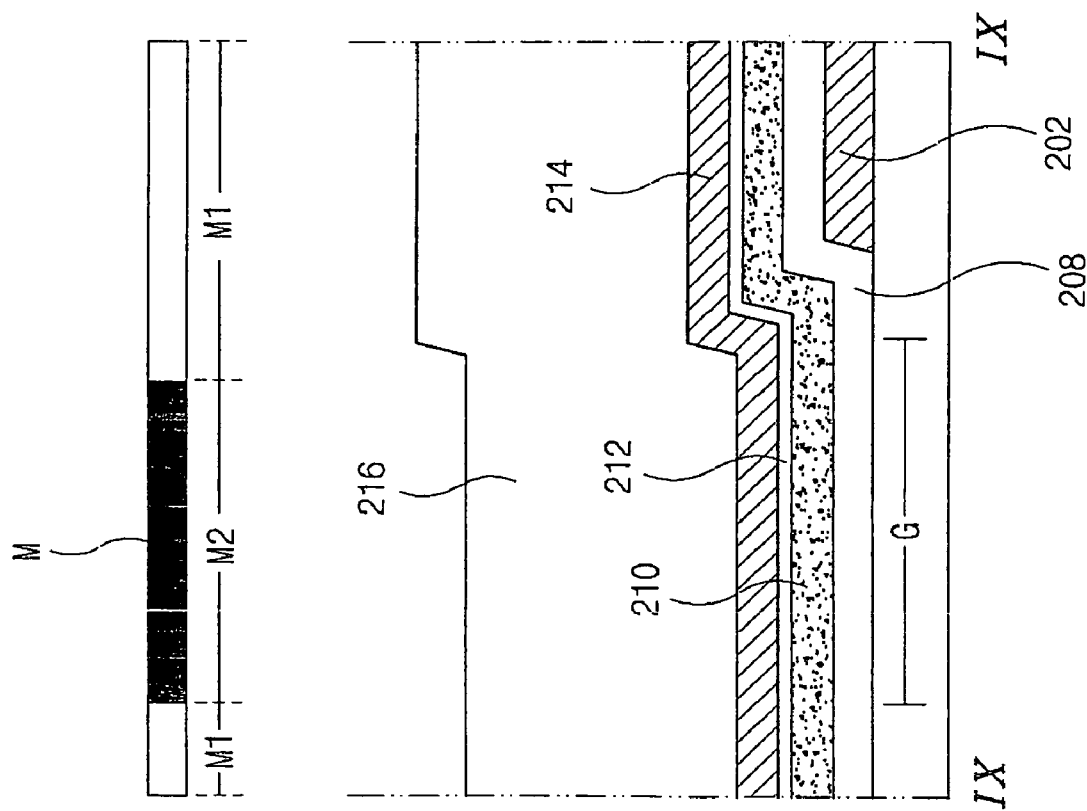

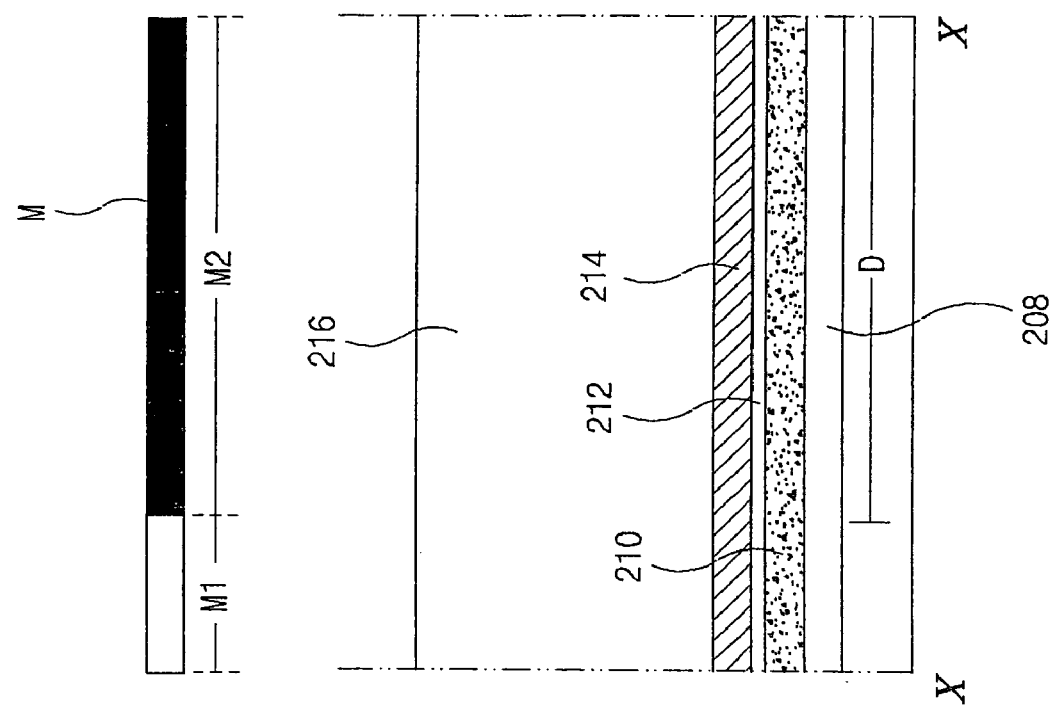

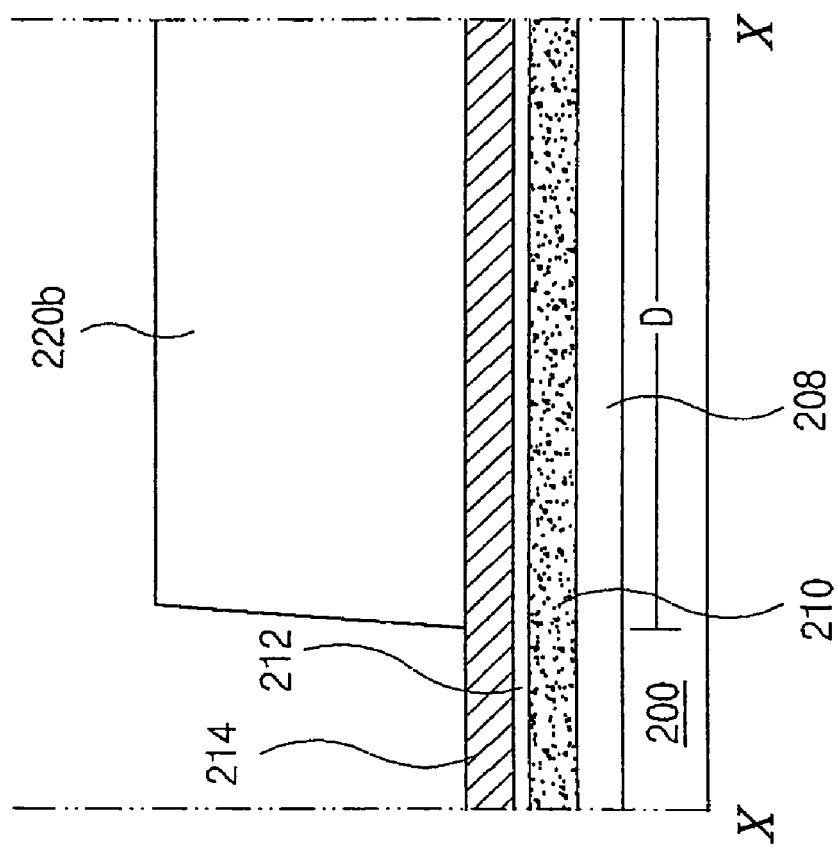

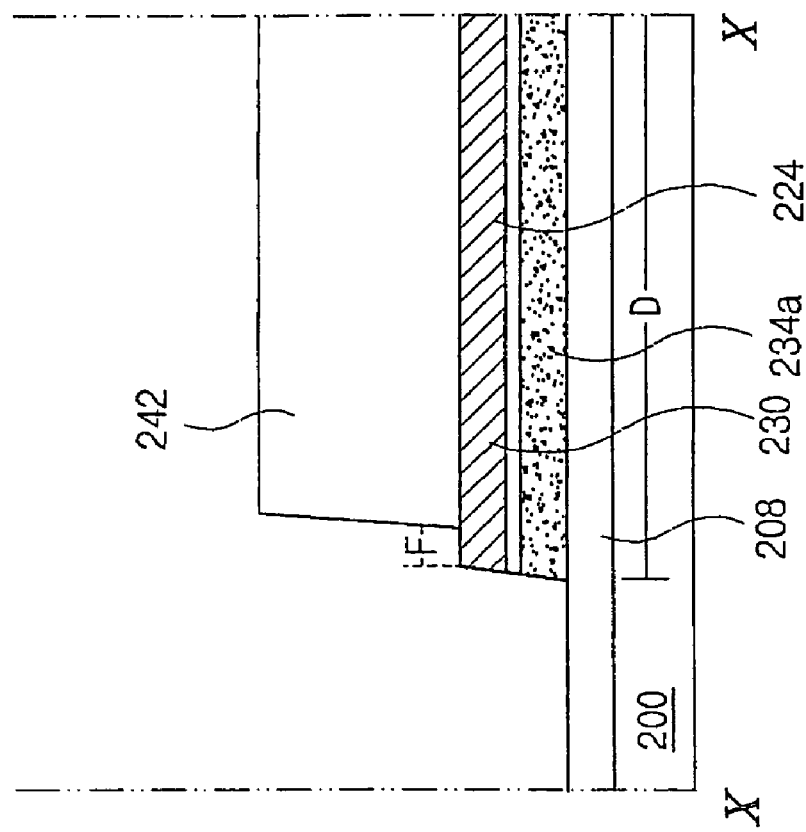

ARRAY SUBSTRATE HAVING COLOR FILTER ON THIN FILM TRANSISTOR STRUCTURE FOR LCD DEVICE AND METHOD OF FABRICATING THE SAME

This application is a divisional application of U.S patent application Ser. No. 11/652,039, filed Jan. 11, 2007, now U.S. Pat. No. 7,400,366 which is a divisional of U.S. patent application Ser. No. 10/724,892, filed Dec. 2, 2003, which is now U.S. Pat. No. 7,180,559 and claims priority to Korean Patent Application Nos.: 10-2002-0078910, filed Dec. 11, 2002, and 10-2002-0078007, filed Dec. 9, 2002, all of which are incorporated by reference for all purposes as if fully set forth herein.

BACKGROUND OF THE INVENTION

1. Field of the Invention

The present invention relates to a liquid crystal display device and a method of fabricating a liquid crystal display device, and more particularly, to an array substrate having a color filter on thin film transistor structure and a method of fabricating an array substrate having a color filter on thin film transistor structure.

2. Discussion of the Related Art

In general, since flat panel display devices are thin, light weight, and have low power consumption, they are commonly used in portable devices. Among the various types of flat panel display devices, liquid crystal display (LCD) devices are commonly used in laptop and desktop computer monitors because of their superior resolution, color image display, and display quality.

In the LCD devices, optical anisotropy and polarization properties of liquid crystal molecules are utilized to generate images. The liquid crystal molecules have specific alignment characteristics that can be modified by application of an electric field. Accordingly, due to the optical anisotropy, incident light is refracted according to the alignment of the liquid crystal molecules.

The LCD devices include upper and lower substrates having electrodes that are spaced apart from and face each other, and a liquid crystal material is interposed therebetween. Accordingly, when an electric field is induced to the liquid crystal material when a voltage is supplied to the electrodes of the upper and lower substrates, an alignment direction of the liquid crystal molecules changes in accordance with the supplied voltage. By controlling the supplied voltage, the LCD devices provide various light transmittances in order to display image data.

The LCD devices are commonly incorporated in office automation (OA) devices and video equipment due to their light weight, thin design, and low power consumption. Among the different types of LCD devices, active matrix LCDs (AM-LCDs) have thin film transistors and pixel electrodes arranged in a matrix configuration and offer high resolution and superiority in displaying moving images. A typical LCD panel has an upper substrate, a lower substrate, and a liquid crystal material layer interposed therebetween. The upper substrate, which is commonly referred to as a color filter substrate, includes a common electrode and color filters. The lower substrate, which is commonly referred to as an array substrate, includes switching elements, such as thin film transistors (TFT's), and pixel electrodes.

The operation of an LCD device is based on the principle that the alignment direction of the liquid crystal molecules is dependent upon an induced electric field between the common electrode and the pixel electrode. Accordingly, the liquid crystal molecules function as an optical modulation element having variable optical characteristics that depend upon the polarity of the supplied voltage.

FIG. 1 is a perspective view of a liquid crystal display device according to the related art. In FIG. 1, an LCD device 11 includes an upper substrate 5, which is commonly referred to as a color filter substrate, and a lower substrate 22, which is commonly referred to as an array substrate, having a liquid crystal material layer 14 interposed therebetween. On the upper substrate 5, a black matrix 6 and a color filter layer 8 are formed in a matrix configuration including a plurality of red (R), green (G), and blue (B) color filters surrounded by the black matrix 6. In addition, a common electrode 18 is formed on the upper substrate 5 to cover the color filter layer 8 and the black matrix 6.

On the lower substrate 22, a plurality of thin film transistors T are formed in matrix configuration corresponding to the color filter layer 8. A plurality of crossing gate lines 13 and data lines 15 are perpendicularly positioned such that each TFT T is located adjacent to each intersection of the gate lines 13 and the data lines 15. Furthermore, a plurality of pixel electrodes 17 are formed on a pixel region P defined by the gate lines 13 and the data lines 15 of the lower substrate 22, and the pixel electrodes 17 include a transparent conductive material having high transmissivity, such as indium-tin-oxide (ITO) or indium-zinc-oxide (IZO).

In FIG. 1, a storage capacitor C is disposed to correspond to each pixel P, and is connected in parallel to each pixel electrode 17. The storage capacitor C is comprised of a portion of the gate line 13 that functions as a first capacitor electrode, a storage metal layer 30 that functions as a second capacitor electrode, and an interposed insulator 16 (in FIG. 2). Since the storage metal layer 30 is connected to the pixel electrode 17 through a contact hole, the storage capacitor C electrically contacts the pixel electrode 17.

In FIG. 1, a scanning signal is supplied to a gate electrode of the thin film transistor T through the gate line 13, and a data signal is supplied to a source electrode of the thin film transistor T through the data line 15. As a result, the liquid crystal molecules of the liquid crystal material layer 14 are aligned and arranged by operation of the thin film transistor T, and incident light passing through the liquid crystal layer 14 is controlled to display an image. For example, the electric fields induced between the pixel and common electrodes 17 and 18 re-arrange the liquid crystal molecules of the liquid crystal material layer 14 so that the incident light can be converted into the desired images in accordance with the induced electric fields.

When fabricating the LCD device 11 of FIG. 1, the upper substrate 5 is aligned with and attached to the lower substrate 22. During this process, the upper substrate 5 may be misaligned with the lower substrate 22, and light leakage may occur in the completed LCD device 11 due to a marginal error in attaching the upper and lower substrate 5 and 22 together.

FIG. 2 is a schematic cross sectional view along II-II of FIG. 1 according to the related art. In FIG. 2, the thin film transistor T is formed on the front surface of the lower substrate 22, and includes a gate electrode 32, an active layer 34, a source electrode 36, and a drain electrode 38. A gate insulation layer 16 is interposed between the gate electrode 32 and the active layer 34 to protect the gate electrode 32 and the gate line 13. As shown in FIG. 1, the gate electrode 32 extends from the gate line 13 and the source electrode 36 extends from the data line 15. All of the gate, source, and drain electrodes 32, 36, and 38 are formed of a metallic material, whereas the active layer 34 is formed of silicon. In addition, a passivation layer 40 is formed on the thin film transistor T for protection.

In the pixel region P, the pixel electrode 17 that is formed of a transparent conductive material is disposed on the passivation layer 40 and contacts the drain electrode 38 and the storage metal layer 30.

In FIG. 2, the upper substrate 5 is spaced apart from the lower substrate 22 over the thin film transistor T. On the rear surface of the upper substrate 5, a black matrix 6 is disposed in the position corresponding to the thin film transistor T, the gate line 13 and the data line 15. The black matrix 6 is formed on the entire surface of the upper substrate 5 and has openings corresponding to the pixel electrode 17 of the lower substrate 22, as shown in FIG. 1. The black matrix 6 prevents light leakage in the LCD panel except for the portions for the pixel electrodes 17, and protects the thin film transistor T from the light to prevent generation of photo currents in the thin film transistor T. The color filter layer 8 is formed on the rear surface of the upper substrate 5 to cover the black matrix 6, wherein each of the color filters 8 has one of the red 8a, green 8b, and blue 8b colors and corresponds to one pixel region P where the pixel electrode 17 is located. A common electrode 18 of a transparent conductive material is disposed on the color filter layer 8 over the upper substrate 5.

In FIGS. 1 and 2, the pixel electrode 17 has a one-to-one correspondence with the color filters 8. Furthermore, as shown in FIG. 2, in order to prevent cross-talk between adjacent pixel electrodes 17 and the gate and data lines 13 and 15, the pixel electrodes 17 are spaced apart from the data lines 15 by a distance A and are spaced apart from the gate lines 13 by a distance B. The open spaces A and B between the pixel electrode 17 and the data and gate lines 15 and 13 cause light leakage in the LCD device. For example, the light leakage mainly occurs within the open spaces A and B so that the black matrix 6 formed on the upper substrate 5 should cover those open spaces A and B. However, when arranging the upper substrate 5 with the lower substrate 22 or vice versa, misalignment may occur between the upper substrate 5 and the lower substrate 22. Therefore, the black matrix 6 extends to fully cover those open spaces A and B, such that the black matrix 6 is designed to provide an aligning margin to prevent light leakage. However, when extending the black matrix 6, an aperture ratio of the liquid crystal panel is reduced as much as the aligning margin of the black matrix 6. Moreover, if there are errors in the aligning margin of the black matrix 6, the light leakage still occurs within the open spaces A and B, and deteriorates the image quality of the LCD device.

SUMMARY OF THE INVENTION

Accordingly, the present invention is directed to a liquid crystal display device having an array substrate of a color filter on a thin film transistor (COT) structure and a method of fabricating an array substrate of a color filter on a thin film transistor (COT) structure that substantially obviates one or more of problems due to limitations and disadvantages of the related art.

An object of the present invention is to provide an array substrate for a liquid crystal display device that provides a high aperture ratio.

Another object of the present invention is to provide a method of fabricating an array substrate for a liquid crystal display device having simplified and stabilized fabricating processes and to increase manufacturing yield.

Additional features and advantages of the invention will be set forth in the description which follows and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, an array substrate device includes a gate line formed on a substrate extending along a first direction having a gate electrode, a data line formed on the substrate extending along a second direction having a data pad disposed apart from a first end of the data line, the data and gate lines defining a pixel region, a gate pad formed on the substrate disposed apart from a first end of the gate line, a thin film transistor formed at a crossing region of the gate and data lines and including the gate electrode, a semiconductor layer, a source electrode, and a drain electrode, a black matrix overlapping the thin film transistor, the gate line, and the data line except for a first portion of the drain electrode, a first pixel electrode at the pixel region contacting the first portion of the drain electrode and the substrate, a color filter on the first pixel electrode at the pixel region, and a second pixel electrode on the color filter contacting the first pixel electrode.

In another aspect, a method of forming an array substrate includes forming a gate line on a substrate extending along a first direction having a gate electrode extending from the gate line, sequentially forming an active layer of intrinsic amorphous silicon and an ohmic contact layer of extrinsic amorphous silicon layer over the gate electrode, simultaneously forming a data line, a data pad, a gate pad, a source electrode, and a drain electrode, the data line disposed to perpendicularly cross the gate line and defining a pixel region, wherein the gate electrode, the active and ohmic contact layers, and the source and drain electrode constitute a thin film transistor, forming a black matrix to overlap the thin film transistor, the gate line, and the data line except for a first portion of the drain electrode, forming a first transparent electrode layer to overlap the black matrix, the first transparent electrode contacting the portion of the drain electrode, forming a color filter on the first transparent electrode layer in the pixel region and a color filter pattern above a first end of the gate line, and forming a second transparent electrode layer along an entire surface of the substrate to cover the color filter, the color filter pattern, and the first transparent electrode layer.

In another aspect, a method of forming an array substrate includes forming a gate line extending along a first direction includes a gate electrode extending from the gate line using a first metal layer, forming a first insulating layer on the substrate to cover the gate line and the gate electrode, forming an intrinsic amorphous silicon layer, an extrinsic amorphous silicon layer, and a second metal layer on the first insulating layer, patterning the intrinsic amorphous silicon layer, the extrinsic amorphous silicon layer, and the second metal layer to form a data line, a data pad, a gate pad, a source electrode, a drain electrode, and a plurality of semiconductor patterns, wherein the data line is disposed to perpendicularly cross the gate line and define a pixel region, etching a portion of the extrinsic amorphous silicon pattern between the source and drain electrodes to from an active layer of intrinsic amorphous silicon pattern and an ohmic contact layer of extrinsic amorphous silicon pattern, wherein the gate electrode, the active and ohmic contact layers, and the source and drain electrodes constitute a thin film transistor at the crossings of the gate and data lines, forming a black matrix to overlap the thin film transistor, the gate line, and the data line except for a first portion of the drain electrode, forming a first transparent electrode layer to overlap the black matrix and contact the first portion of the drain electrode, forming a color filter on the first transparent electrode layer in the pixel region and a color filter pattern above a first end of the gate line, and forming a second transparent electrode layer to cover the color filter, the color filter pattern, and the first transparent electrode layer.

In another aspect, an array substrate device having a color filter on a thin film transistor (COT) structure for use in a liquid crystal display device includes a substrate having a display area, a non-display area, and a boundary area, the boundary area disposed between the display area and the non-display area, a plurality of gate lines on the substrate within the display area, a plurality of gate pads on the substrate within the non-display area, a plurality of gate link lines on the substrate disposed in the non-display area and in the boundary area connecting the gate lines to the gate pads, a plurality of data lines crossing the gate lines and defining a plurality of pixel regions, a plurality of thin film transistors each near the crossings of the gate and data lines and including a gate electrode, an active layer, a source electrode, and a drain electrode, a black matrix disposed above the thin film transistors, the gate lines, and the data lines, a plurality of color filters disposed in the pixel regions, a light-shielding pattern disposed in the non-display area and the boundary area corresponding to the gate link lines and spaces between the gate link lines, and a plurality of pixel electrodes disposed in the pixel regions, each of the pixel electrodes contacting the drain electrode of the thin film transistor.

In another aspect, an array substrate device having a color filter on a thin film transistor (COT) structure for use in a liquid crystal display device includes a substrate having a display area, a non-display area, and a boundary area, the boundary area disposed between the display area and the non-display area, a plurality of gate lines on the substrate in the display area, a plurality of gate pads on the substrate in the non-display area, a plurality of gate link lines on the substrate disposed in the non-display area and in the boundary area, each of the gate link lines connects one of the gate lines to one of the gate pads, a plurality of data lines crossing the gate line and defining a plurality of pixel regions, a plurality of thin film transistors near the crossings of the gate and data lines and including a gate electrode, an active layer, a source electrode, and a drain electrode, a black matrix above the thin film transistors, the gate lines, and the data lines, a plurality of color filters disposed in the pixel regions, a light-shielding pattern disposed in the non-display area and the boundary area corresponding to spaces between the gate link lines, an inorganic insulator on the black matrix and the light-shielding pattern, and a plurality of pixel electrodes disposed in the pixel regions, each of the pixel electrodes contacting the drain electrode of the thin film transistor.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings:

FIGS. 4A-4I are cross sectional views along IV-IV of FIG. 3 showing exemplary processing steps according to the present invention;

FIGS. 5A-5I are cross sectional views along V-V of FIG. 3 showing exemplary processing steps according to the present invention;

FIGS. 6A-6I are cross sectional views along VI-VI of FIG. 3 showing exemplary processing steps according to the present invention;

FIGS. 9A-9M are cross sectional views along IX-IX of FIG. 7 showing exemplary processing steps according to the present invention;

FIGS. 10A-10M are cross sectional views along X-X of FIG. 7 showing exemplary processing steps according to the present invention;

DETAILED DESCRIPTION OF THE PREFERRED EMBODIMENTS

Reference will now be made in detail to the preferred embodiments of the present invention, examples of which are illustrated in the accompanying drawings.

Figure 1:
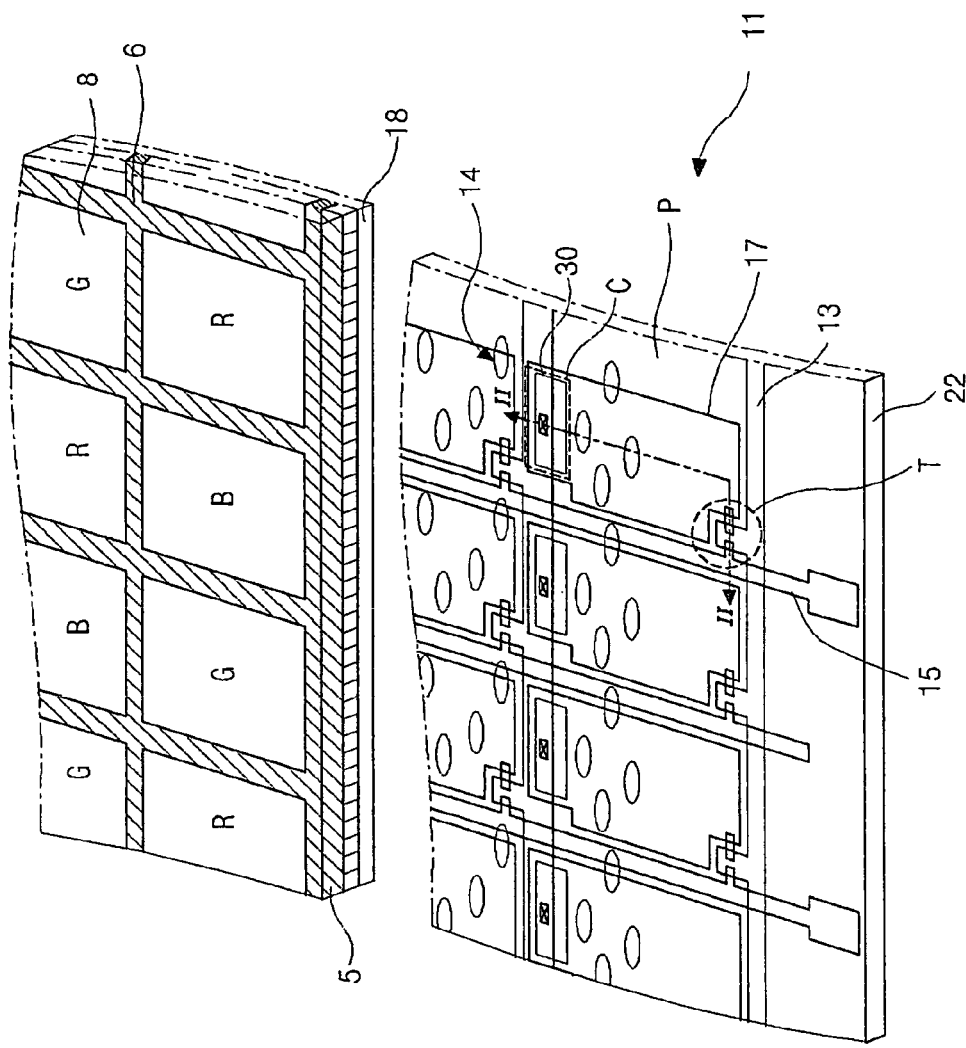
FIG. 1 is a perspective view of a liquid crystal display device according to the related art.
Figure 2:
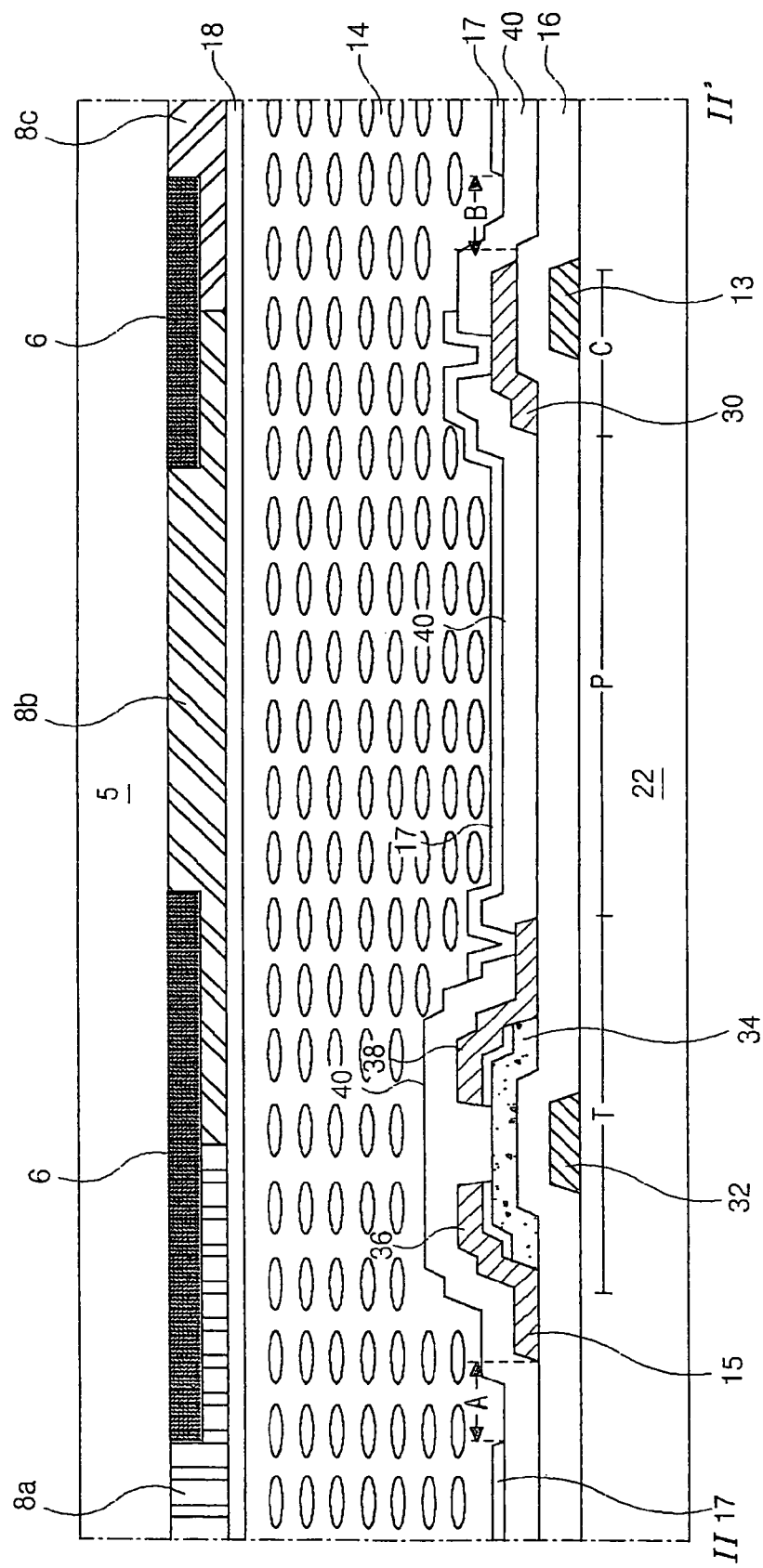
FIG. 2 is a schematic cross sectional view along II-II of FIG. 1 according to the related art.
Figure 3:
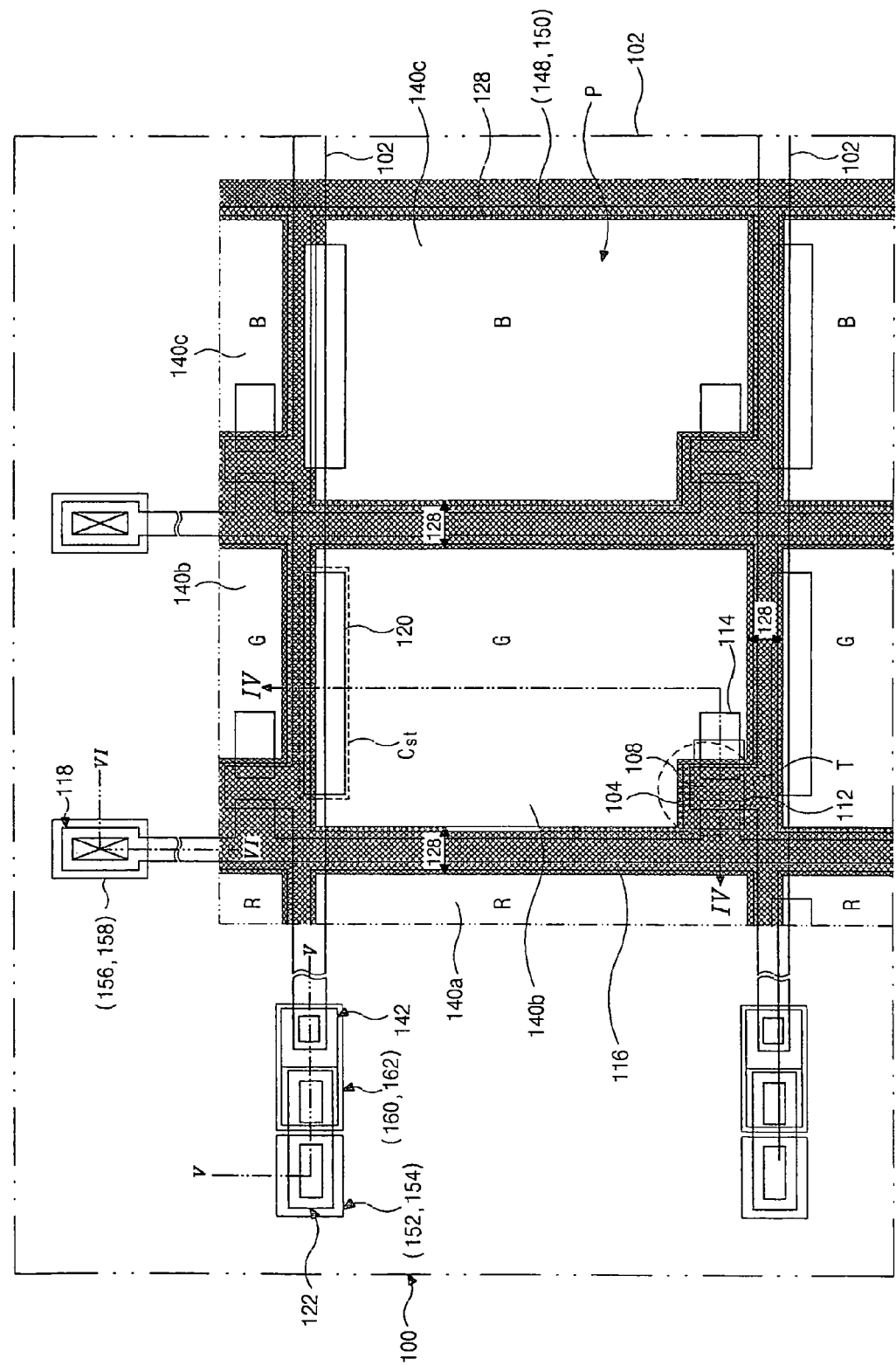
FIG. 3 is a plan view of an exemplary array substrate having a color filter on thin film transistor structure according to the present invention.

FIG. 3 is a plan view of an exemplary array substrate having a color filter on thin film transistor structure according to the present invention. In FIG. 3, an array substrate 100 may include a plurality of gate lines 102 disposed along a first direction and a plurality of data lines 116 disposed along a second direction perpendicular to the first direction. Accordingly, the plurality of gate lines 102 and the plurality of data lines 116 cross one another to define a plurality of pixel regions P. Each of the data lines 116 may include a data pad 118 disposed at least at one end of the data lines 116, and each of the gate lines 102 may include a gate pad 122 disposed at least at one end of the gate lines 102. Alternatively, multiple data and gate pads 118 and 122 may be disposed at opposing ends of the data and gate lines 116 and 102, respectively. A thin film transistor T may be formed at each crossing portion of the gate line 102 and the data line 116, and may include a gate electrode 104, an active layer 108, a source electrode 112, and a drain electrode 114. Within the pixel regions P defined by the plurality of gate lines and data lines 102 and 116, a plurality of red (R), green (G), and blue (B) color filters 140a, 140b, and 140c may be located therein. In addition, a double-layered pixel electrode comprised of first and second pixel electrodes 148 and 150 may be disposed corresponding to each of the pixel regions P. The first pixel electrode 148 and the second pixel electrode 150 may have similar shapes. Although not shown in FIG. 3, the first pixel electrode 148 may be disposed beneath the color filter 140 and may contact the drain electrode 114, and the second pixel electrode 150 may be disposed on the color filter 140 and may contact the first pixel electrode 148. For example, each of the color filters 140 may be located between the first and second pixel electrodes 148 and 150, and the second pixel electrode 150 may electrically contact the drain electrode 114 through the first pixel electrode 148.

In FIG. 3, a storage capacitor $C_{st}$ may be included within a portion of the gate line 102 and a storage metal layer 120. Accordingly, a portion of the gate line 102 may function as a first electrode of the storage capacitor $C_{st}$, and the storage metal layer 120 may function as a second electrode of the storage capacitor $C_{st}$. In addition, the first and second pixel electrodes 148 and 150 may electrically contact the storage metal layer 120 so that they are electrically connected to the storage capacitor $C_{st}$ in parallel.

The array substrate 100 of FIG. 3 may be defined as a color filter on thin film transistor (COT) structure. In such a COT structure, a black matrix 128 and the color filters 140 may be formed on the array substrate 100, wherein the black matrix 128 may be disposed to correspond to all of the thin film transistors T, the gate lines 102, and the data lines 116 to prevent light leakage in the LCD device. The black matrix 128 may be formed of opaque organic material to block the light incident to the thin film transistors T and to protect the thin film transistors T from external impact.

In addition in the COT structure shown in FIG. 3, the gate pads 122 may be simultaneously formed along with the data lines 116 and data pads 118 using the same material. The gate pad 122 may be formed of material that is resistant enough to chemicals used to pattern the color filters 140a, 140b, and 140c. Moreover, a double-layered gate pad terminal may be comprised of a first gate pad terminal 152 and a second gate pad terminal 154 disposed over a portion of the gate pad 122 to be in electrical communication with the gate pad 122. Furthermore, a double-layered data pad terminal comprised of a first data pad terminal 156 and a second data pad terminal 158 may be disposed over the data pad 118. A double-layered connecting electrode comprised of a first connecting electrode 160 and a second connecting electrode 162 may be disposed above a portion of the gate pad 122 and an end portion of the gate line 102. The double-layered connecting electrode may electrically connect the end of the gate line 102 to the gate pad 122.

In addition, a color filter pattern 142 may be interposed between the first and second gate connecting electrodes 160 and 162. Since the gate line 102 is chemically weak to etching and developing solutions used for patterning the insulators, color filters, and conductive layers, the color filter pattern 142 may be formed over the end of the gate line 102 to protect the gate line 102 from the etching and developing solutions. For example, the color filter pattern 142 may prevent etchant and developer solutions from affecting and deteriorating the gate line 102. Moreover, since the etchant and developer solutions may cause Galvanic corrosion between the pad terminals 152, 154, 156, and 158 and the gate line 102, the color filter pattern 142 may be placed over the end of the gate line 102, especially between the first and second connecting electrodes 160 and 162. Thus, the etchant and developer solution may not damage the gate line 102 that is formed of aluminum-based material.

FIGS. 4A-4I are cross sectional views along IV-IV of FIG. 3 showing exemplary processing steps according to the present invention, and illustrate processing steps for forming a pixel region of an array substrate having the color filter on thin film transistor (COT) structure. FIGS. 5A-5I are cross sectional views along V-V of FIG. 3 showing exemplary processing steps according to the present invention, and illustrate processing steps for forming a gate pad of an array substrate having the color filter on thin film transistor (COT) structure. FIGS. 6A-6I are cross sectional views along VI-VI of FIG. 3 showing exemplary processing steps according to the present invention, and illustrate processing steps for forming a data pad of an array substrate having the color filter on thin film transistor (COT) structure.

Figure 4B:
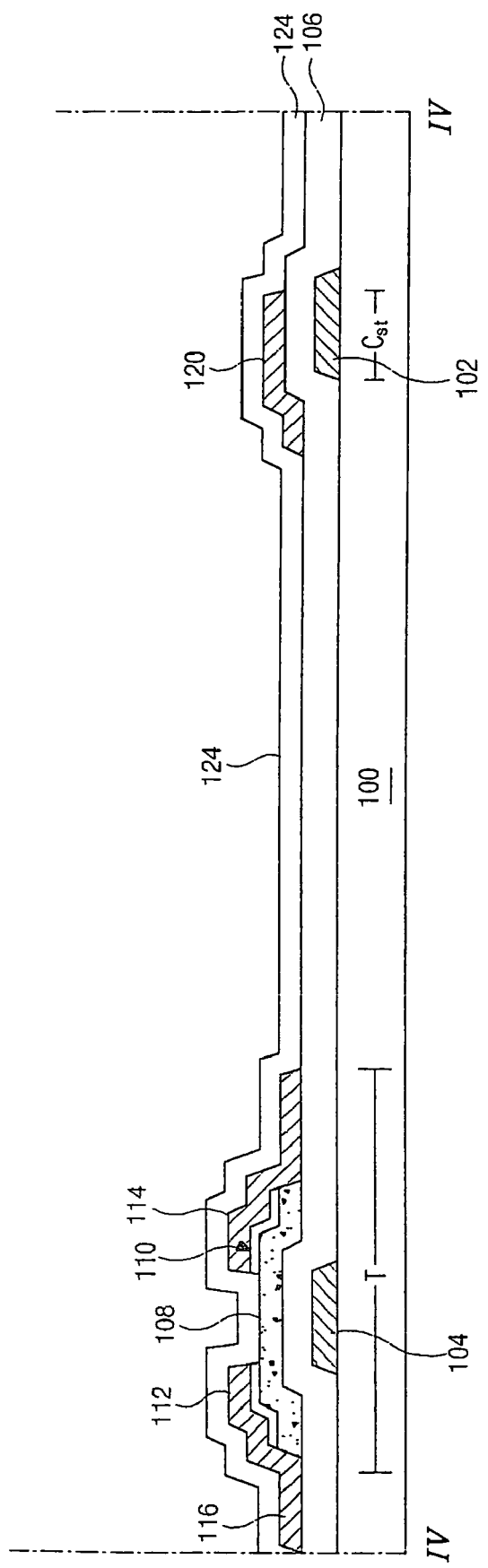
Figure 5A:
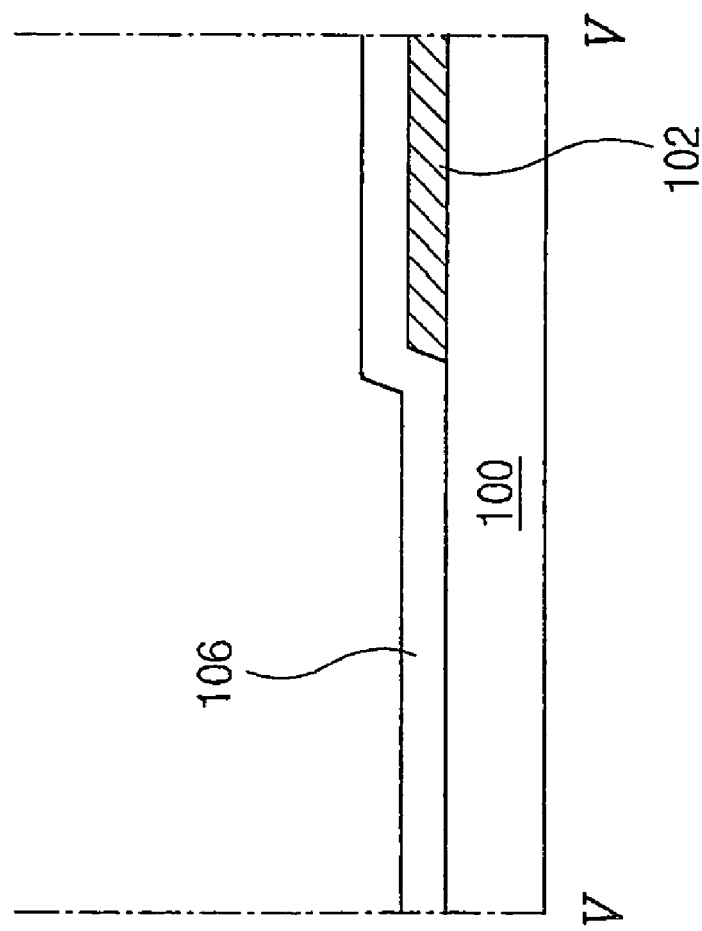

In FIGS. 4A, 5A, and 6A, a first metal layer may be deposited onto a surface of a substrate 100, and patterned using a first mask process to form a gate line 102 and a gate electrode 104, wherein the gate electrode 104 may extend from the gate line 102. The first meal layer may be an aluminum-based material that has a low electrical resistance in order to prevent signal delay. However, since the aluminum-based material has poor corrosion resistance so that it is very weak at the etching/developing solution patterning the insulator, color filters, and other conductive materials, the aluminum-based material may be damaged by the etching/developing solutions. For example, if a transparent conductive material is formed over the substrate 100, the etching/developing solutions may cause Galvanic corrosion between the transparent conductive material and the aluminum-based gate line 102 and gate electrode 104, and thus the aluminum-based elements will be damaged.

After forming the gate line 102 and the gate electrode 104 on the substrate 100, a gate insulation layer 106 (or a first insulating layer) may be formed on the substrate 100 to cover the gate line 102 and the gate electrode 104. The first insulation layer 106 may be formed of inorganic material, such as silicon nitride ($SiN_x$) and silicon oxide ($SiO_2$). Then, an intrinsic amorphous silicon layer (e.g., a-Si:H) and a doped amorphous silicon layer (e.g., $n^+$a-Si:H) may be sequentially deposited along an entire surface of the first insulation layer 106, and simultaneously patterned using a second mask process to form an active layer 108 and an ohmic contact layer 110. The active layer 108 may be located above the gate electrode 104, and the ohmic contact layer 110 may be located on the active layer 108.

Figure 5B:
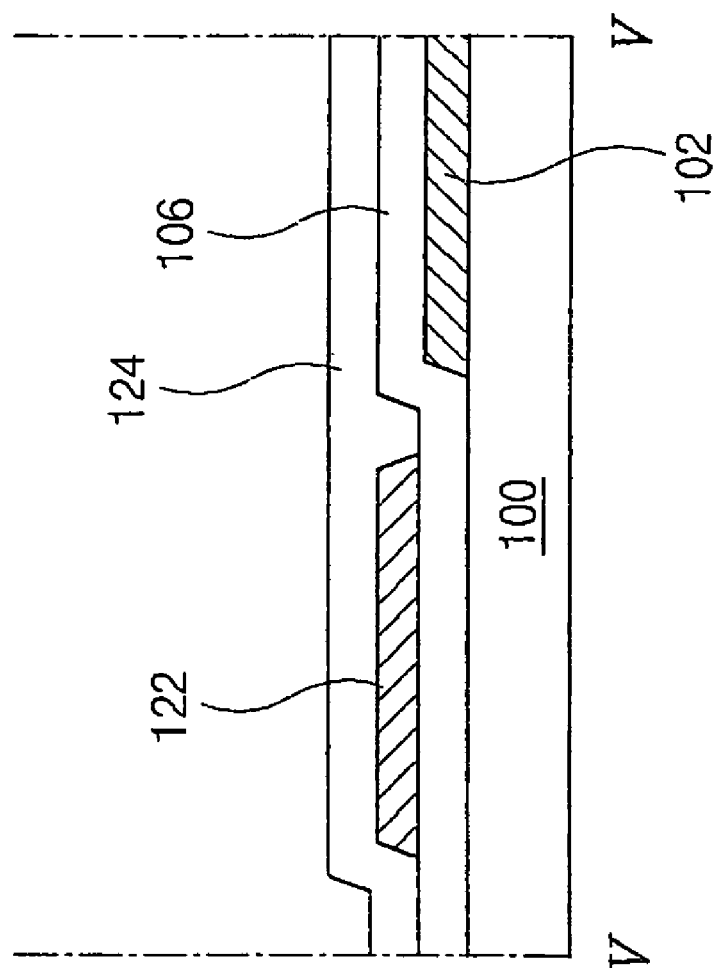
Figure 6B:
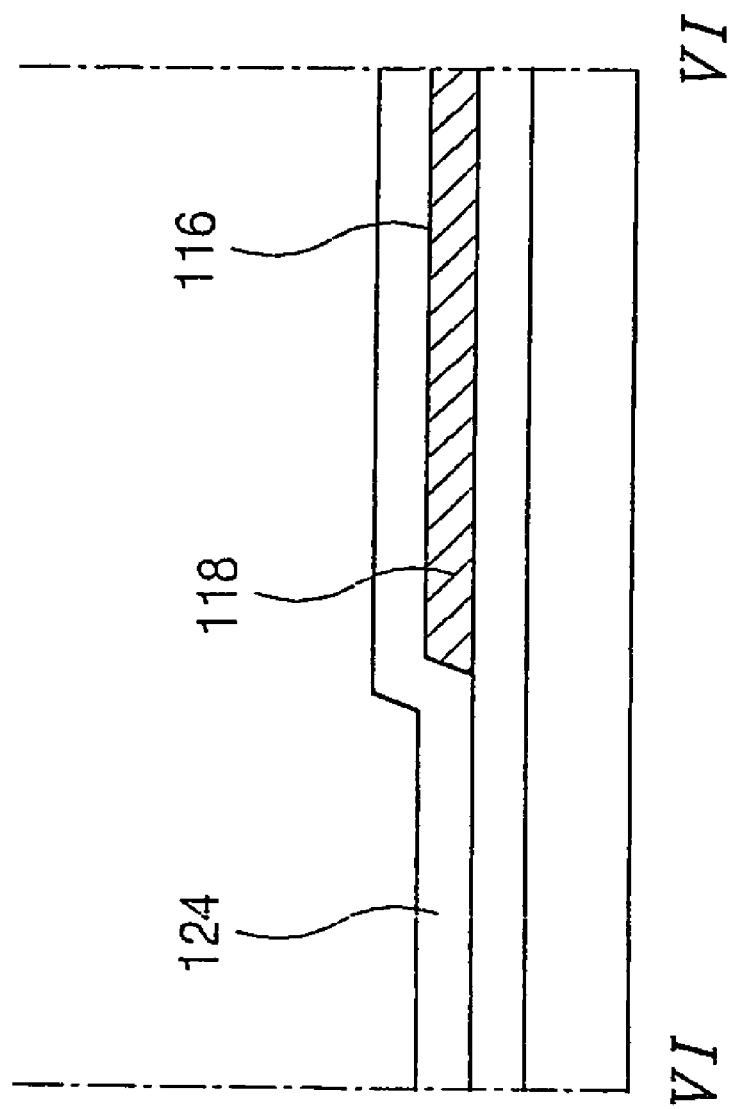

In FIGS. 4B, 5B, and 6B, after forming the active layer 108 and the ohmic contact layer 110, a second metal layer may be deposited over the substrate 100, and patterned using a third mask process to form a source electrode 112, a drain electrode 114, a data line 116, a data pad 118, a storage metal layer 120, and a gate pad 122. The second metal layer may be formed of one of chromium (Cr), molybdenum (Mo), tungsten (W), titanium (Ti), copper (Cu), and an alloy of any combination thereof. The source electrode 112 may extend from the data line 116 and may contact one portion of the ohmic contact layer 110. The drain electrode 114 may be spaced apart from the source electrode 112, and may contact another portion of the ohmic contact layer 110. The data pad 118 may be connected to the data line 116 at the end of the data line 116, and the storage metal layer 120 may have an island shape and overlap a portion of the gate line 102. The gate pad 122 may have an island shape and may be spaced apart from the end of the gate line 102. As shown in FIG. 5B, the gate pad 122 may be electrically isolated from the gate line 102 by the first insulation layer 106.

After patterning the second metal layer to form the above-detailed metal patterns, a portion of the ohmic contact layer 110 between the source and drain electrodes 112 and 114 may be etched by using the source and drain electrodes 112 and 114 as masks. Thus, a thin film transistor T and a storage capacitor C may be formed. Namely, as described with reference to FIG. 3, the thin film transistor T may comprise the gate electrode 104, the active layer 108, the ohmic contact layer 110, the source electrode 112, and the drain electrode 114. In addition, the storage capacitor $C_{st}$ may comprise a portion of the gate line 102, the storage metal layer 120, and the interposed first insulation layer 106.

Next, a second insulation layer 124 may be deposited along an entire surface of the substrate 100 to cover the patterned second metal layer, and may be formed of silicon nitride ($SiN_x$) or silicon oxide ($SiO_2$). The second insulation layer 124 may enhance adhesion of subsequently-formed organic layers to the substrate 100, wherein the second insulation layer 124 may prevent poor contact properties between the active layer 108 and the organic layers. If poor contact properties do not occur between the active layer 108 and the organic layers, the second insulation layer 124 may not be necessary.

Figure 4C:
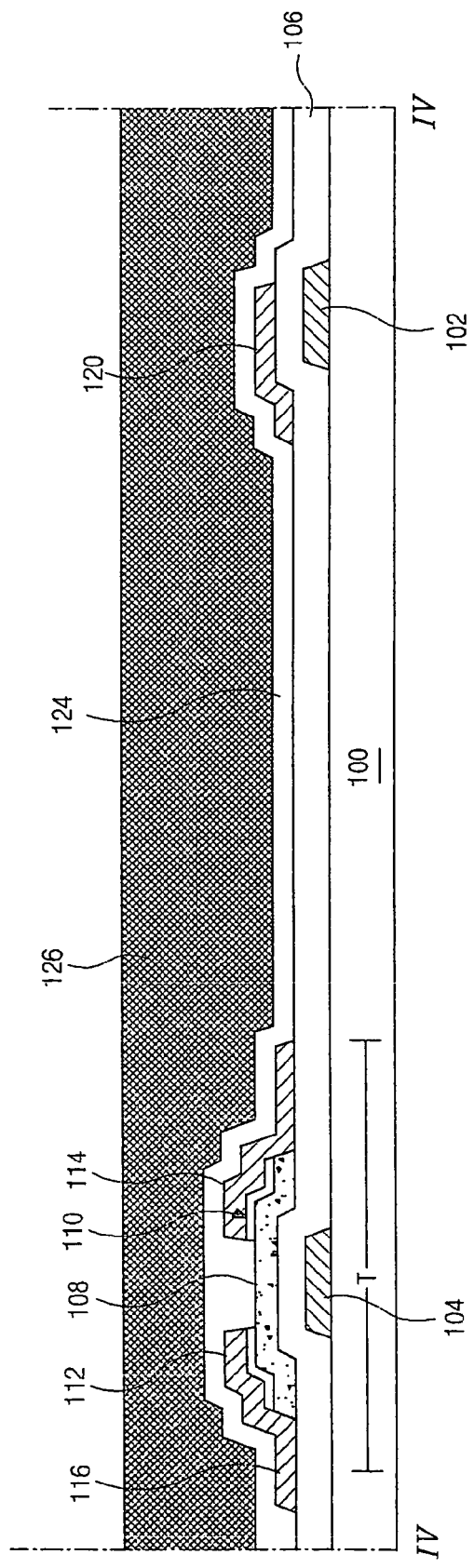
Figure 5C:
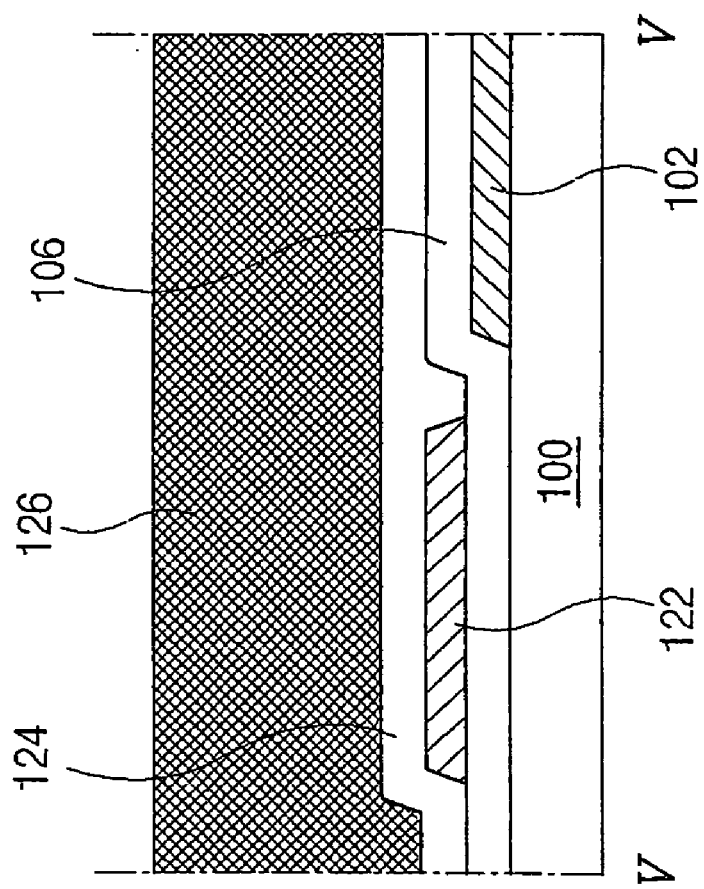
Figure 6C:
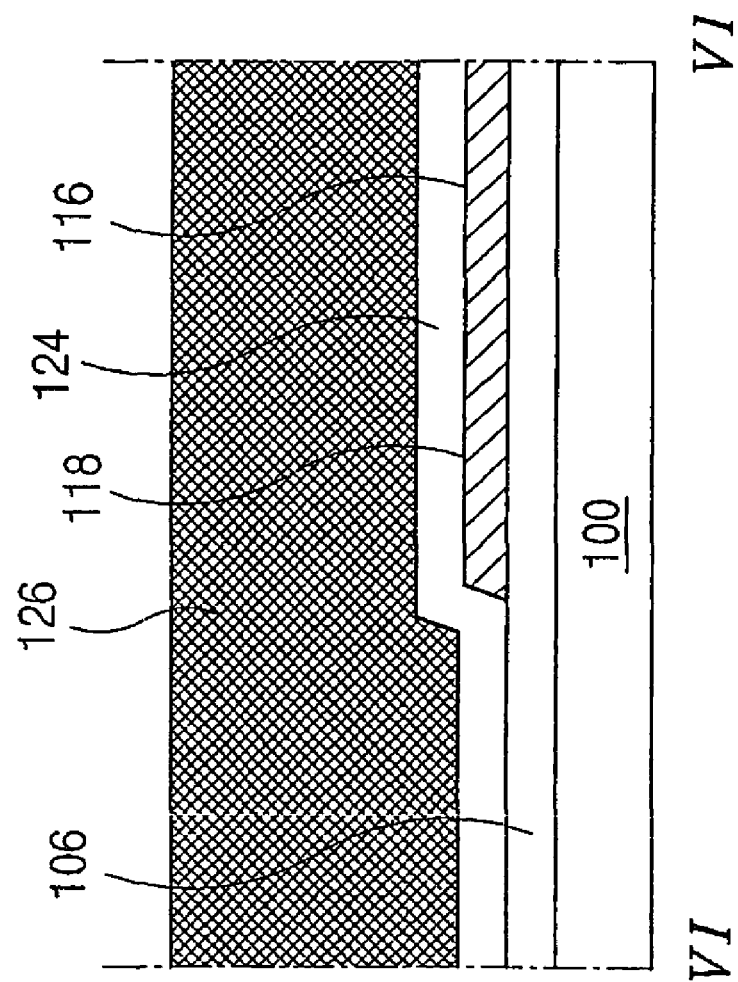

In FIGS. 4C, 5C, and 6C, an opaque organic material 126 having a low dielectric constant may be deposited on the second insulation layer 124. The opaque organic material 126 may have a black color so that it may function as a black matrix.

Figure 4D:
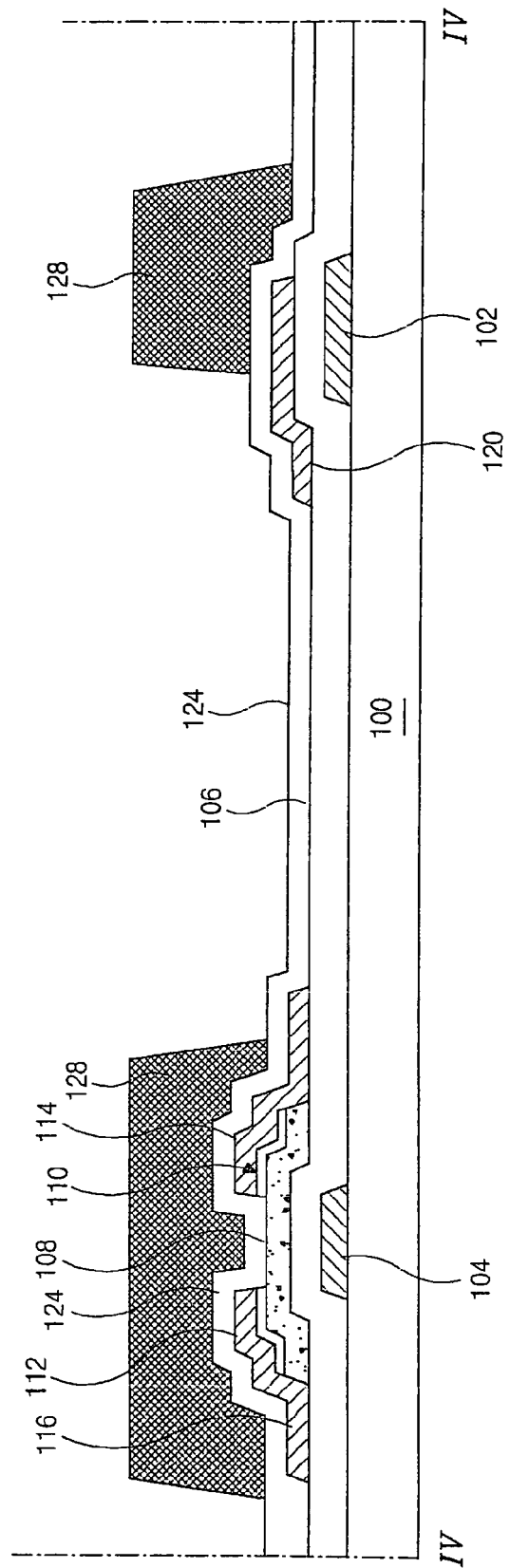
Figure 5D:
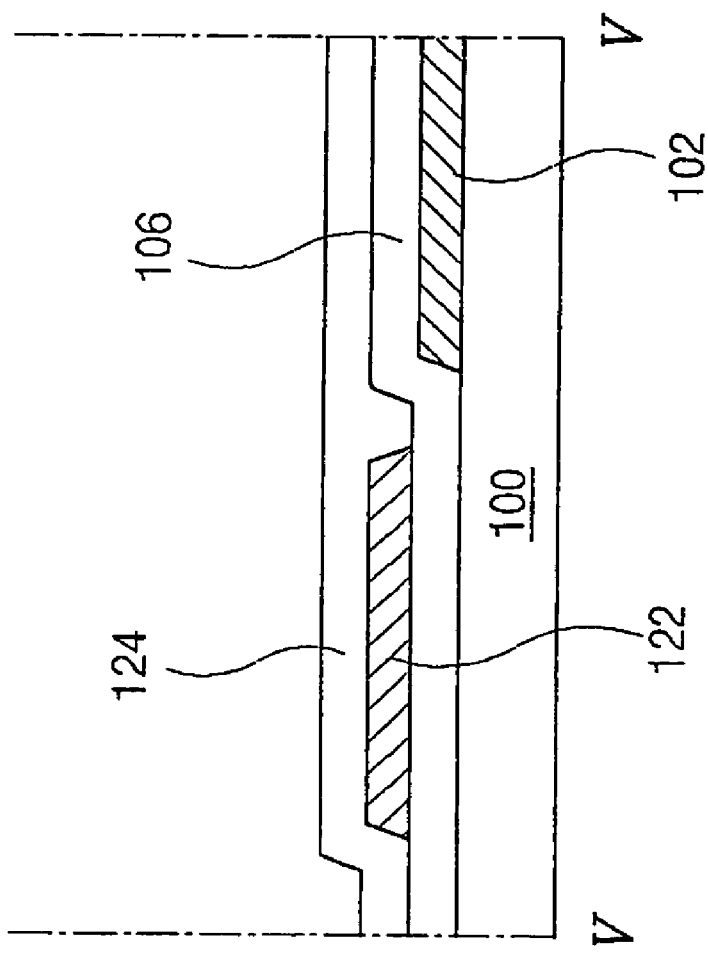
Figure 6D:
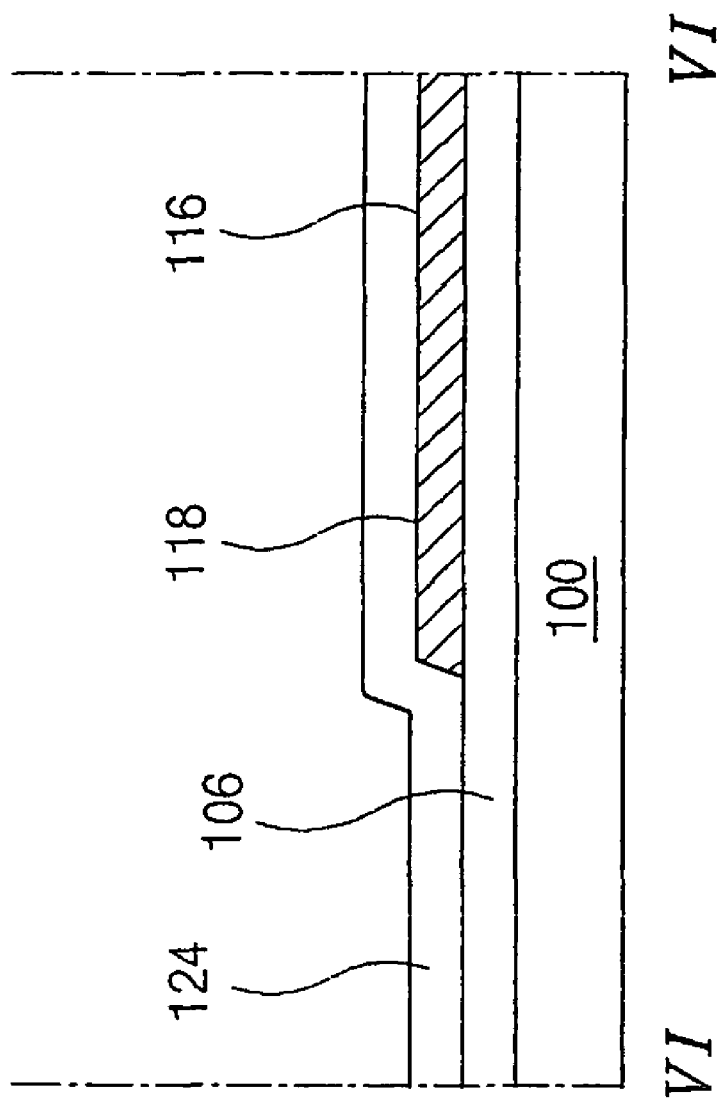

In FIGS. 4D, 5D, and 6D, the opaque organic material 126 formed on the second insulation layer 124 may be patterned using a fourth mask process to form a black matrix 128. As shown in FIGS. 3 and 4D, the black matrix 128 may be formed over the thin film transistor T (in FIG. 3), the gate line 102, and the data line 116 disposed within a display area. Since the black matrix 128 may be formed of organic material, it may protect the thin film transistor T. In addition, since the black matrix 128 covers a portion of the storage metal layer 120, it may also protect the storage capacitor.

Figure 4E:
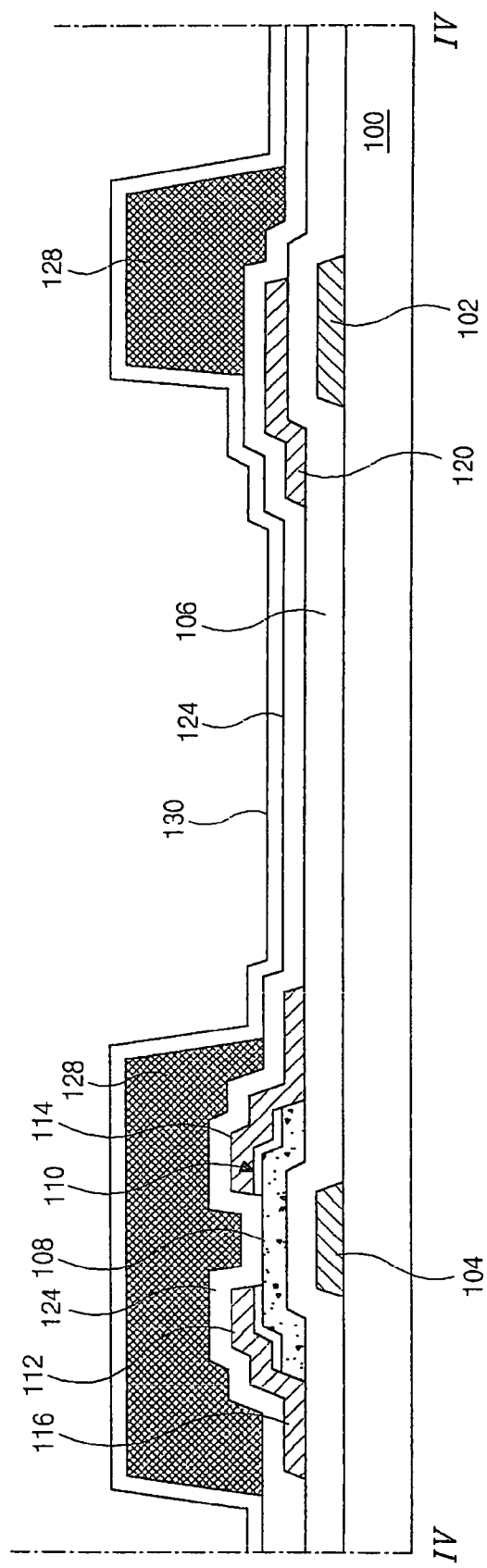
Figure 6E:
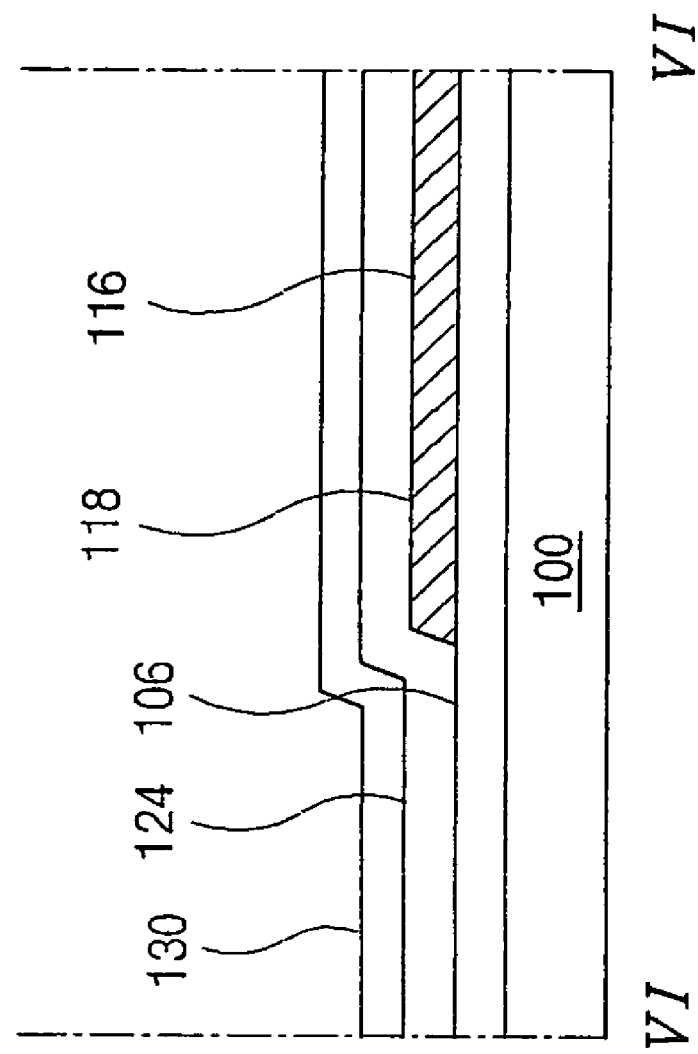

In FIGS. 4E, 5E, and 6E, a third insulation layer 130 may be formed over an entire surface of the substrate 100 to cover the black matrix 128. The third insulating layer 130 may be formed of inorganic insulating material, such as silicon nitride ($SiN_x$) or silicon oxide ($SiO_2$).

Figure 5F:
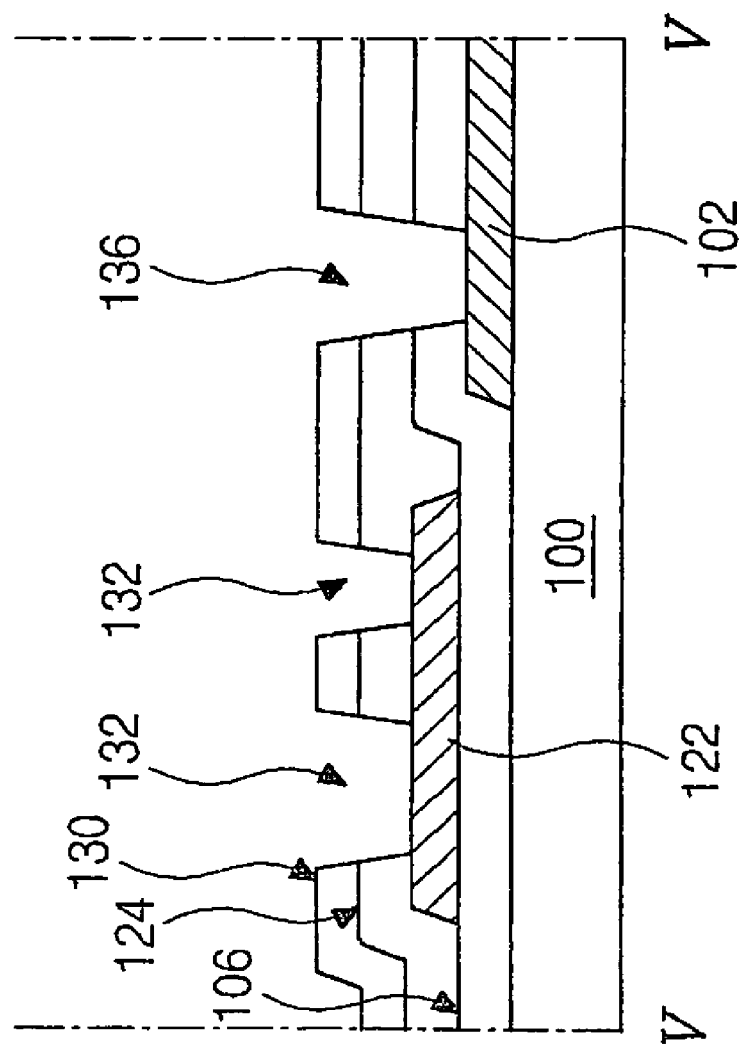
Figure 5G:
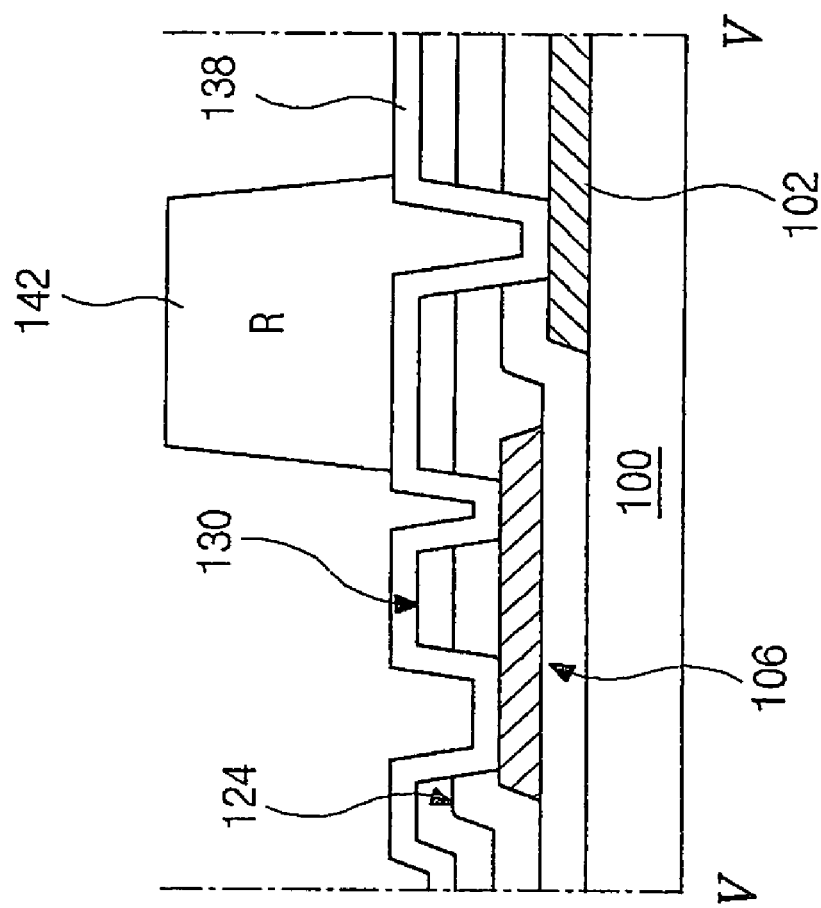
Figure 5H:
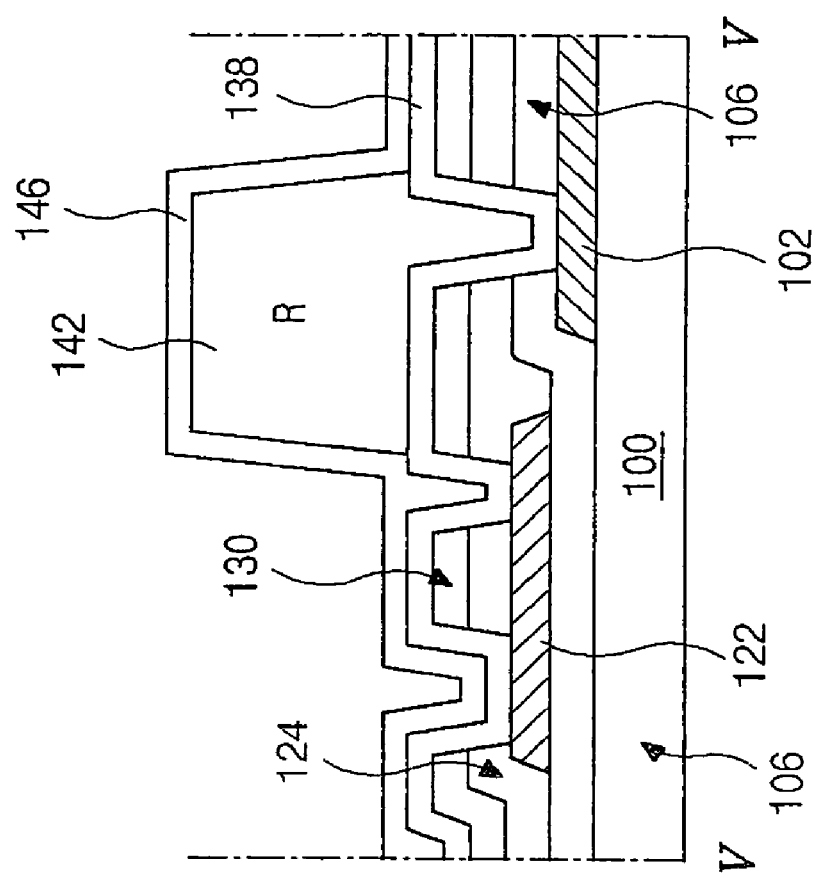
Figure 5I:
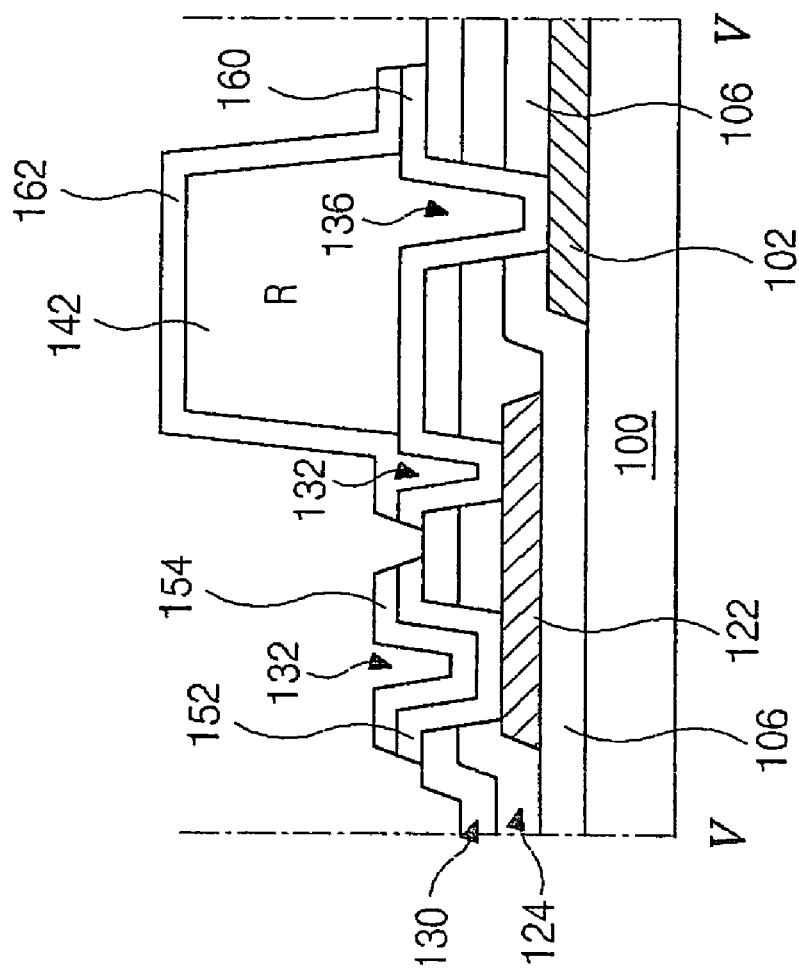
Figure 6F:
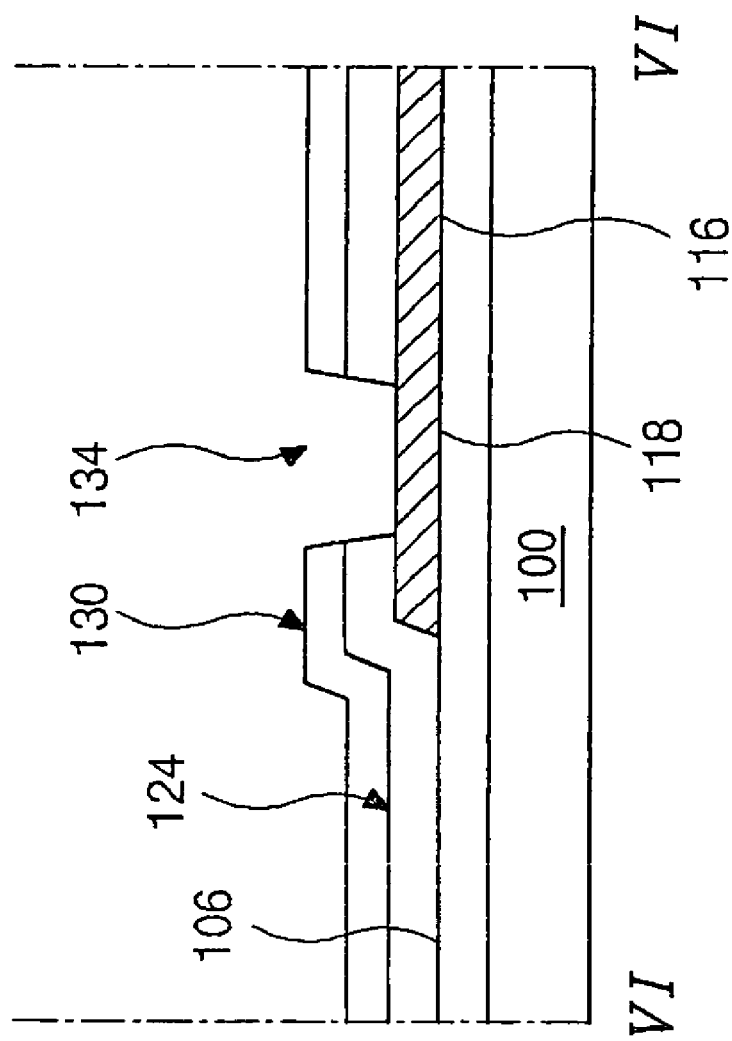

In FIGS. 4F, 5F, and 6F, the first, second and third insulation layers 106, 124 and 130 may be simultaneously patterned within the pixel region P using a fifth mask process. Thus, an end side portion of the drain electrode 114 and an end side portion of the storage metal layer 120 may be exposed. Although FIG. 4F shows that the substrate 100 is exposed by patterning the first insulation layer 106, the first insulation layer 106 may remain and only the second and third insulation layers 124 and 130 may be patterned to expose the side portions of the drain electrode 114 and storage metal layer 120. Furthermore, remaining portions of the first insulation layer 106 on the substrate 100 may control a height of a subsequently-formed color filter. At this time of patterning the first, second, and third insulation layers 106, 124, and 130 within the pixel region P, first, second, and third contact holes 132, 134, and 136 may be formed within the pad regions, i.e., within the non-display areas. The first contact holes 132 may be formed by patterning the second and third insulation layers 124 and 130, thereby exposing portions of the gate pad 122. The second contact hole 134 may also be formed by patterning the second and third insulation layers 124 and 130, thereby exposing a portion of the data pad 118. On the other hand, the third contact hole 136 may be formed by patterning the first, second, and third insulation layers 106, 124, and 130, thereby exposing an end portion of the gate line 102. As shown in FIG. 5F, the first contact holes 132 may be formed as a plurality so that one of the first contact holes adjacent to the third contact hole 136 may be used to electrically connect the gate line 102 to the gate pad 122 during a subsequent steps, as shown in FIGS. 5G-5I.

Figure 4G:
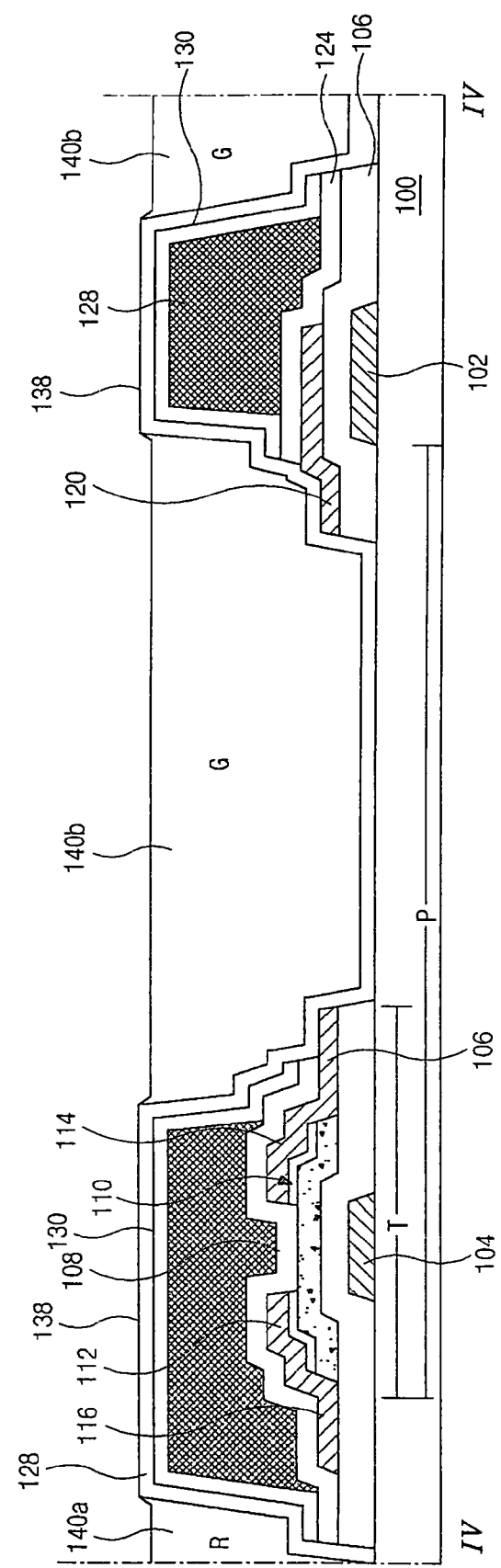

In FIGS. 4G, 5G, and 6G, a first transparent electrode layer 138 of indium tin oxide (ITO) or indium zinc oxide (IZO) may be deposited along an entire surface of the substrate 100 to cover the patterned third insulation layer 130 and to contact the exposed side portions of the drain electrode 106 and storage metal layer 120. Then, a color resin may be formed on the first transparent electrode layer 138 and developed to form color filters 140a, 140b, and 140c having red (R), green (G), and blue (B) colors. The color filters 140a, 140b, and 140c may function to display a full spectrum of colors and may be formed within the pixel regions P on the first transparent electrode layer 138. The red, green, and blue color filters 140a, 140b, and 140c may be sequentially formed by forming and developing the red, green, and blue color resins. When one of the color filters 140a, 140b, and 140c is formed, for example, when the red (R) color filter 140a is formed, a color filter pattern 142 may also be formed above the end of the gate line 102. In particular, the color filter pattern 142 may be formed to correspond to and fit into the third contact hole 136. As described above, the color filter pattern 142 may protect the aluminum-based gate line 102 and electrode 104 from the etchant and developer solution used to etch and develop the array elements.

Meanwhile, when developing the color resin, the first transparent electrode layer 138 may prevent a developing solution (i.e., a developer) used to pattern the color filters from penetrating into other underlying metallic layers. In step portions of the gate line 102 and gate electrode 104, the gate insulation layer 106 and other insulation layers may be formed having pinholes and cracks. Thus, when developing the color filters, the developer for the color filters may penetrate into the insulation layers 106, 124, and 130, thereby deteriorating the gate line 102 and the gate electrode 104 formed of aluminum-based material. By forming the first transparent electrode layer 138, the deterioration may be prevented and process stability may be provided. Therefore, the chemically weak gate line 102 and gate electrode 104 may be protected from the developer.

Figure 4H:
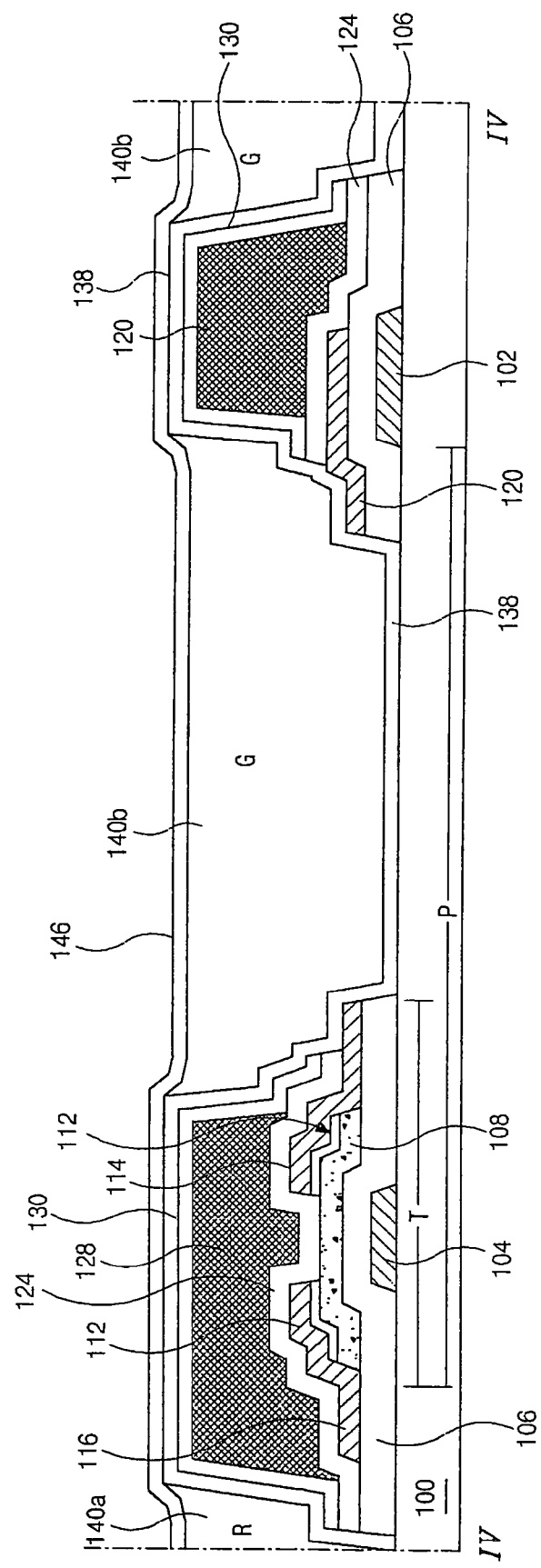
Figure 6H:
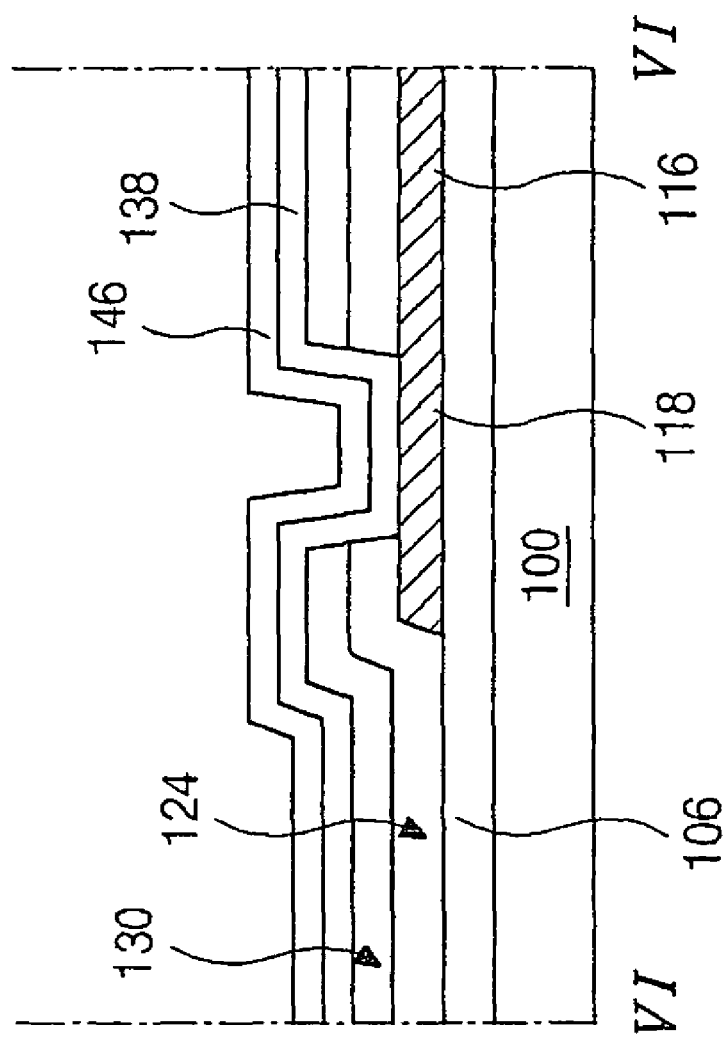

In FIGS. 4H, 5H, and 6H, a second transparent electrode layer 146 may be formed along an entire surface of the substrate 100 to cover all of the color filters 140, the color filter pattern 142, and the exposed portions of the first transparent electrode layer 138. The second transparent electrode layer 146 may include indium tin oxide or indium zinc oxide similar to materials of the first transparent electrode layer 138. As shown in FIGS. 4H and 5H, the second transparent electrode layer 146 may contact the first transparent electrode layer 138 at both sides of each color filter 140 and at both sides of the color filter pattern 142. Furthermore, as shown in FIG. 6H, the second transparent electrode layer 146 may contact the first transparent electrode layer 138 within the data pad portion.

Figure 4I:
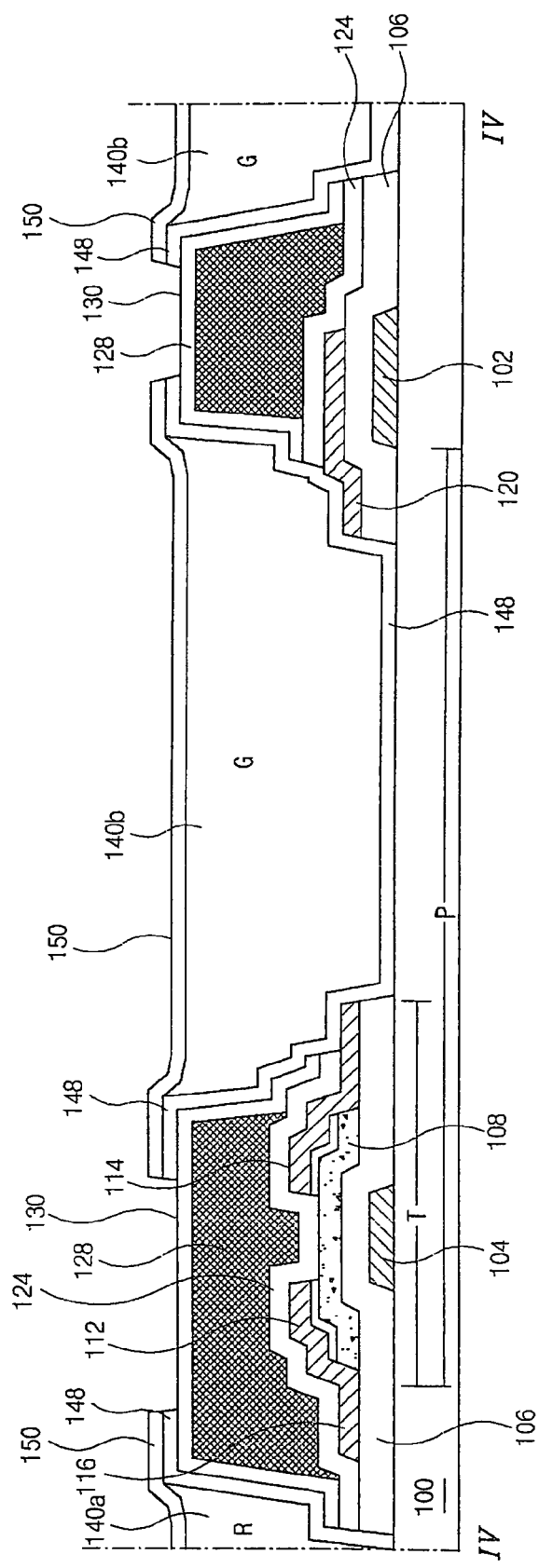
Figure 6I:
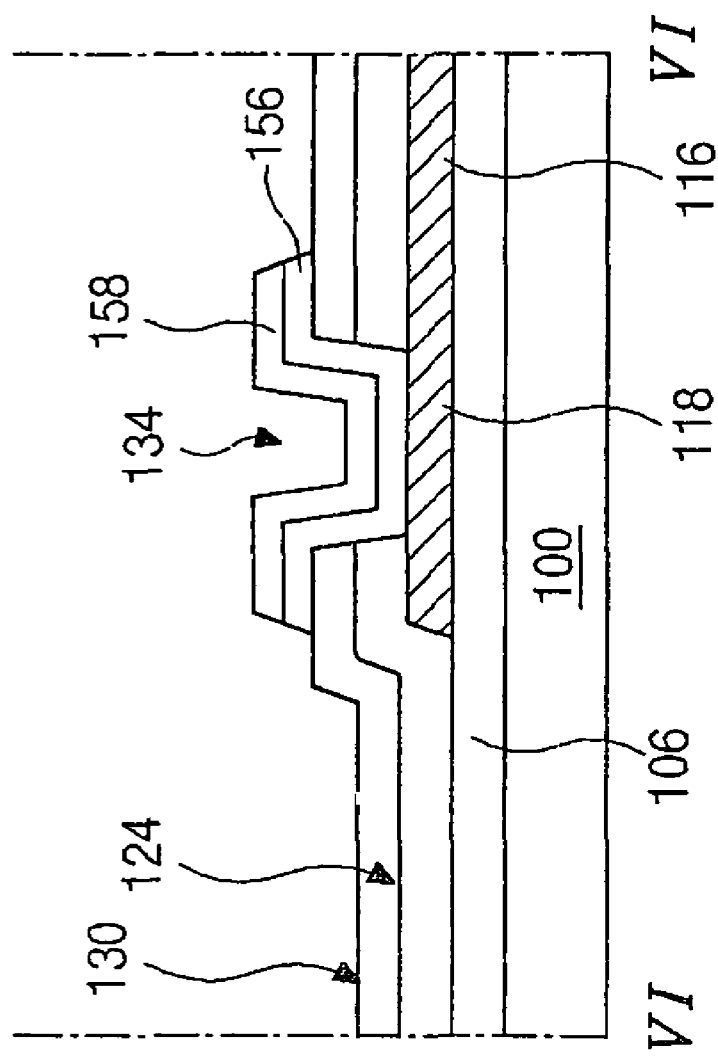

In FIGS. 4I, 5I, and 6I, the first and second transparent electrode layers 138 and 146 may be simultaneously patterned using a sixth mask process to form a double-layered pixel electrode (i.e., sandwich pixel electrode), a double-layered gate pad terminal, a double layered connecting electrode, and a double-layered data pad terminal. The double-layered pixel electrode may comprise a first pixel electrode 148 and a second pixel electrode 150. The double-layered gate pad terminal may comprise a first gate pad terminal 152 and a second gate pad terminal 154, and the double-layered data pad terminal may comprise a first data pad terminal 156 and a second data pad terminal 158. Further, the double-layered connecting electrode may comprise a first connecting electrode 160 and a second connecting electrode 162.

The first and second transparent electrode layers 138 and 146 may be simultaneously patterned using the same mask, so that the sandwich pixel electrode may be formed corresponding to each of the pixel regions P. Alternatively, the first transparent electrode layer 138 may be patterned first, and the color filters formed thereon, and then the second transparent electrode layer 146 may be patterned. Each color filter 140 may be interposed into the sandwich pixel electrode to be between the first pixel electrode 148 and the second pixel electrode 150. As shown in FIG. 4I, since the second pixel electrode 150 may contact the first pixel electrode 148 at both sides of the color filter 140, the sandwich pixel electrode may electrically communicate with the thin film transistor T and may be connected in parallel to the storage capacitor $C_{st}$ (in FIG. 3).

In FIGS. 5I and 6I, the double-layered gate pad terminal, connecting line, and data pad terminal may be formed with the double-layered pixel electrode using the same mask. The double-layered gate pad terminal may be formed directly above the gate pad 122 and may contact the gate pad 122 through one of the first contact holes 132. In addition, the double-layered data pad terminal may be formed directly above the data pad 118 and may contact the data pad 118 through the second contact hole 134. The double-layered connecting electrode may comprise the first and second connecting electrodes 160 and 162 and may be formed to overlap a portion of the gate pad 122 and an end portion of the gate line 102 so that the double-layered connecting electrode contacts the gate pad 122 and the gate line 102, respectively, through the first contact hole 132 and the third contact hole 136. Therefore, the double-layered connecting electrode may electrically connect the gate line 102 to the gate pad 122.

Meanwhile, the color filter pattern 142 may be interposed between the first and second connecting electrodes 160 and 162. If the color filter pattern 142 is not formed to fit into the third contact hole 136, the etchant solution used to etch the double-layered transparent electrode layer and the developer solution used to form the color filters may degrade the gate line 102. Specifically, the Galvanic corrosion may occur between the gate line 102 and the double-layered connecting electrode, thereby deteriorating the gate line 102.

According to the present invention, since the gate pads may be formed of the same material as the data lines, i.e., chromium (Cr), molybdenum (Mo), tungsten (W), titanium (Ti), copper (Cu), and an alloy of any combination thereof, the gate pads may not be damaged by the developer solution used to pattern the color resin and the color filters the material are relatively strong against the developer solution. Furthermore, due to the first transparent electrode layer and the color filter pattern, the aluminum-based gate line may not be damaged by the etchant and developer solution during subsequent fabrication processes.

Figure 7:
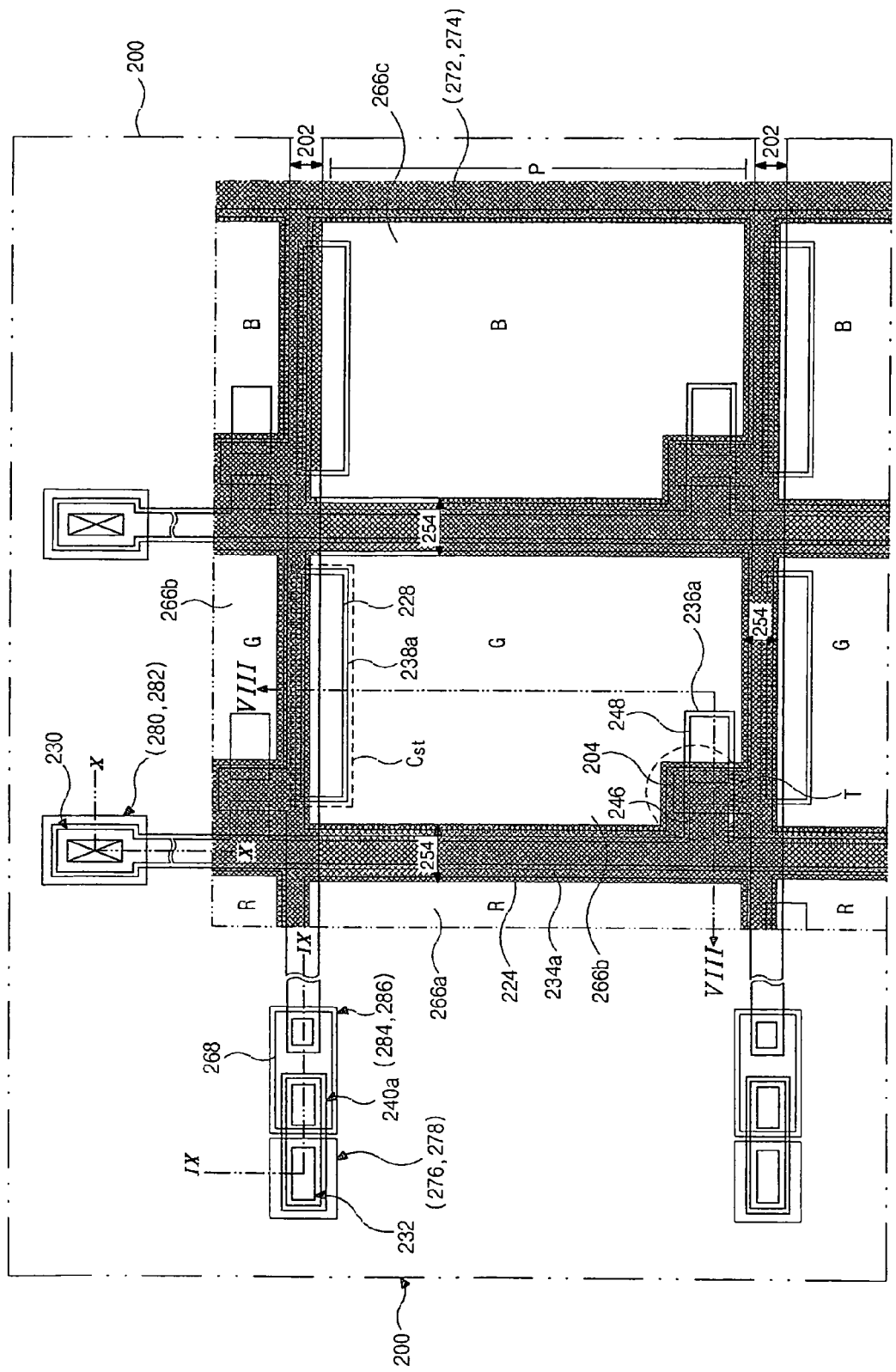
FIG. 7 is a plan view of another exemplary array substrate having a color filter on thin film transistor structure according to the present invention.

FIG. 7 is a plan view of another exemplary array substrate having a color filter on thin film transistor structure according to the present invention. In FIG. 7, an array substrate 200 may include a plurality of gate lines 202 disposed along a first direction and a plurality of data lines 224 disposed along a second direction perpendicular to the first direction, wherein the plurality of gate lines 202 and data lines 224 cross one another defining a plurality of pixel regions P. In addition, each of the data lines 224 may includes a data pad 230, and each of the gate lines 202 may include gate pad 232. A thin film transistor T may be formed at each crossing portion of the gate line 202 and the data line 224, and may include a gate electrode 204, an active layer 236a, a source electrode 246, and a drain electrode 248. Unlike the array substrate of FIG. 3, the active layer 236a and the source and drain electrodes 246 and 248 may be formed using the same mask process. Furthermore, amorphous silicon patterns 234a and 240a may be disposed beneath the data line 224, the data pad 230, and the gate pad 232.

Within the pixel regions P, a plurality of red (R), green (G), and blue (B) color filters 266a, 266b, and 266c may be formed. In addition, a double-layered pixel electrode may comprise first and second pixel electrodes 272 and 274 disposed corresponding to each of the pixel regions P, wherein the first pixel electrode 272 and the second pixel electrode 274 may have similar shapes. Although not shown in FIG. 7, the first pixel electrode 272 may be disposed beneath the color filter 266 and may contact the drain electrode 248, and the second pixel electrode 274 may be disposed on the color filter 266 and may contact the first pixel electrode 272. Moreover, each of the color filters 266 may be located between the first and second pixel electrodes 272 and 274, and the second pixel electrode 274 may electrically contact the drain electrode 248 through the first pixel electrode 272.

Meanwhile, a storage capacitor $C_{st}$ may be included within a portion of the gate line 202 and a storage metal layer 228. Thus, the portion of the gate line 202 may function as a first electrode of the storage capacitor $C_{st}$, and the storage metal layer 228 may function as a second electrode of the storage capacitor $C_{st}$. In addition, the first and second pixel electrodes 272 and 274 may electrically contact the storage metal layer 228 to be electrically connected to the storage capacitor $C_{st}$ in parallel. Thus, since the storage metal layer 228 may be formed with the data line 224, an amorphous silicon pattern 238a may also be disposed beneath the storage metal layer 228.

In FIG. 7, the array substrate 200 may includes a color filter on thin film transistor (COT) structure, wherein a black matrix 254 and the color filters 266 may be formed on the array substrate 200. The black matrix 254 may be disposed to correspond to the thin film transistors T, the gate lines 202, and the data lines 224, thereby preventing light leakage in the LCD device. The black matrix 254 may be formed of opaque organic material, thereby blocking the light incident to the thin film transistors T and protecting the thin film transistors T from external impact.

In FIG. 7, the gate pads 232 may be simultaneously formed along with the data lines 224 and pads 230 using the same material. The gate pad 232 may be formed of material that is resistant to chemical solutions used to pattern the color filters 266a, 266b, and 266c. In addition, a double-layered gate pad terminal may comprise a first gate pad terminal 276 and a second gate pad terminal 278 disposed over a portion of the gate pad 232 to electrically communicate with the gate pad 232. Furthermore, a double-layered data pad terminal may comprise a first data pad terminal 280 and a second data pad terminal 282 disposed over the data pad 230. A double-layered connecting electrode may comprise a first connecting electrode 284 and a second connecting electrode 286 disposed above a portion of the gate pad 232 and an end portion of the gate line 202. Accordingly, the double-layered connecting electrode may electrically connect the end of the gate line 202 to the gate pad 232.

A color filter pattern 268 may be interposed between the first and second gate connecting electrodes 284 and 286 to be formed over the end of the gate line 202 to protect the gate line 202 from etching and developing solutions since the gate line 202 is chemically weak. Specifically, the color filter pattern 268 may prevent etchant and developer solutions from affecting and deteriorating the gate line 202. For example, since the etchant and developer solutions may cause Galvanic corrosion between the pad terminals 276, 278, 280, and 282 and the gate line 202, the color filter pattern 268 may be placed over the end of the gate line 202, especially between the first and second connecting electrodes 284 and 286. Accordingly, the etchant and developer solutions may not damage the gate line 202 that is formed of aluminum-based material.

FIGS. 8A-8M are cross sectional views along VIII-VIII of FIG. 7 showing exemplary processing steps according to the present invention, and illustrate processing steps for forming a pixel region of an array substrate having the color filter on thin film transistor (COT) structure. FIGS. 9A-9M are cross sectional views along IX-IX of FIG. 7 showing exemplary processing steps according to the present invention, and illustrate processing steps for forming a gate pad of an array substrate having the color filter on thin film transistor (COT) structure. FIGS. 10A-10M are cross sectional views along X-X of FIG. 7 showing exemplary processing steps according to the present invention, and illustrate processing steps for forming a data pad of an array substrate having the color filter on thin film transistor (COT) structure.

Figure 8A:
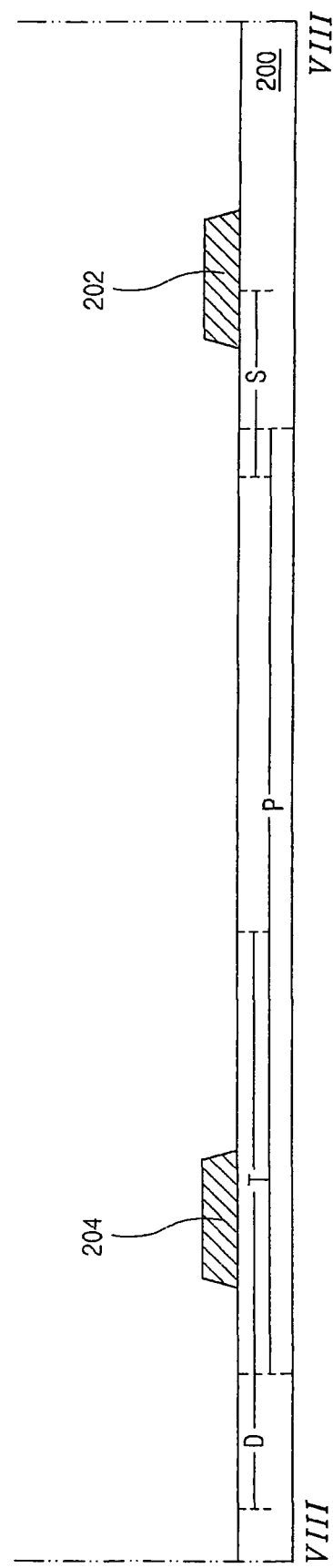
FIGS. 8A-8M are cross sectional views along VIII-VIII of FIG. 7 showing exemplary processing steps according to the present invention.
Figure 9A:
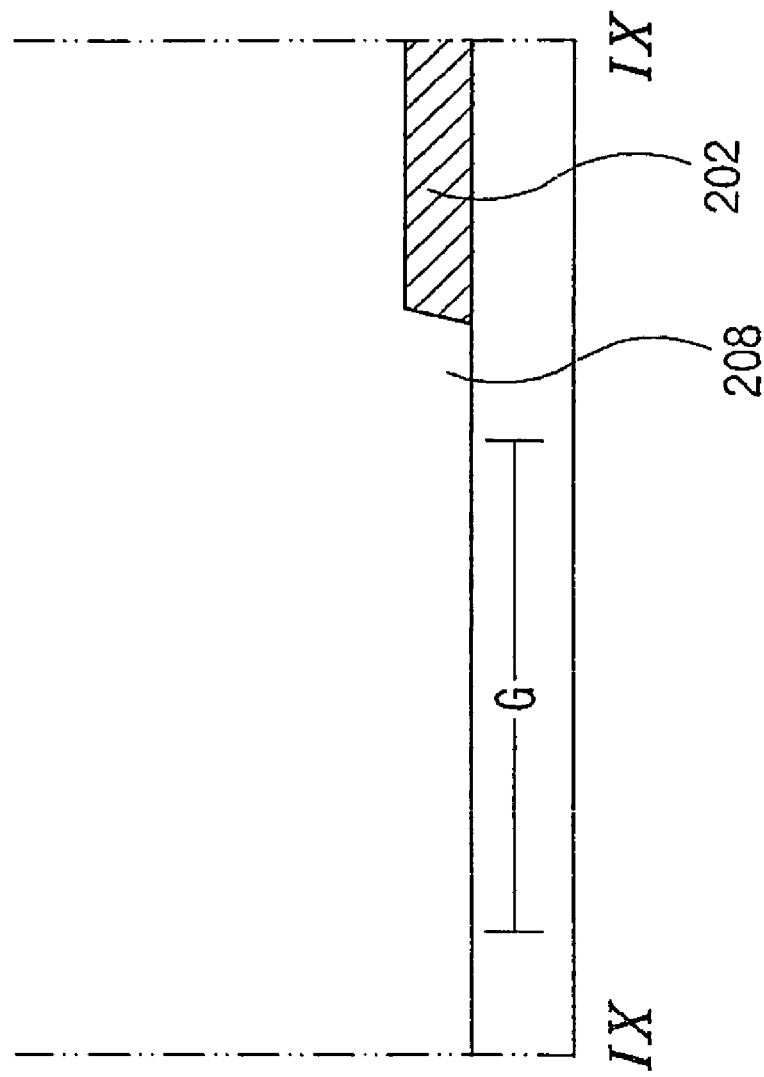
Figure 10A:
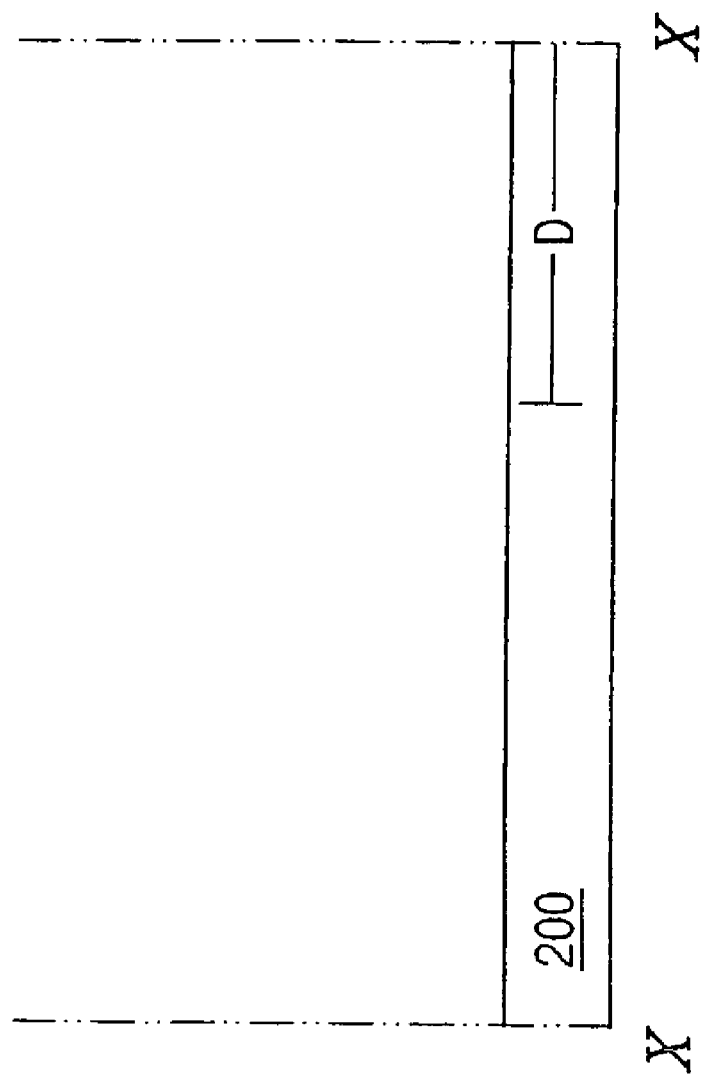

In FIGS. 8A, 9A, and 10A, a thin film transistor region T, a pixel region P, a data region D, a gate region G, and a storage region S may be defined on a substrate 200. A first metal layer may be deposited on a surface of a substrate 200, and patterned using a first mask process to form a gate line 202 and a gate electrode 204. The first metal layer may be an aluminum-based material having high conductivity and low electrical resistance in order to prevent signal delay. However, since the aluminum-based material has poor corrosion resistance and is very weak to etching/developing solutions used to pattern the insulator, color filters, and other conductive materials, the aluminum-based material may be damaged by the etching/developing solutions. For example, if a transparent conductive material is formed over the substrate 100, the etching/developing solutions may cause Galvanic corrosion between the transparent conductive material and the aluminum-based gate line 102 and electrode 104, whereby the aluminum-based elements may be damaged.

Figure 8B:
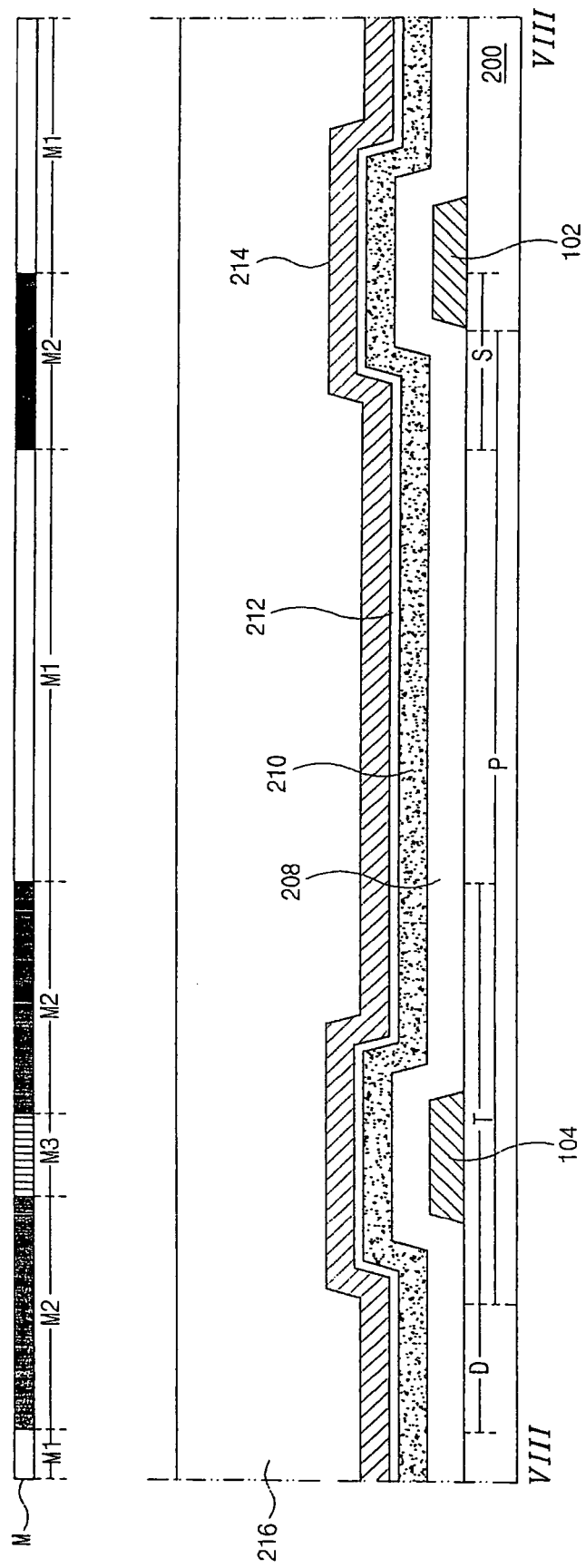

In FIGS. 8B, 9B, and 10B, a gate insulation layer 208 (i.e., a first insulation layer) may be formed on the substrate 200 to cover the gate line 202 and the gate electrode 204. The gate insulation layer 208 may be formed of inorganic material, such as silicon nitride ($SiN_X$) and silicon oxide ($SiO_2$). Next, an intrinsic amorphous silicon layer (a-Si:H) 210, an $n^+$-doped amorphous silicon layer ($n^+$a-Si:H) 212, and a second metal layer 214 may be sequentially deposited along an entire surface of the gate insulation layer 208. The second metal layer 214 may be formed of one of chromium (Cr), molybdenum (Mo), copper (Cu), tungsten (W), titanium (Ti), and an alloy of any combination thereof. Then, a photoresist 216 may be formed on the second metal layer 214.

In addition, a mask M having a transmitting portion M1, a shielding portion M2, and a half-transmitting portion M3 may be positioned over the photoresist 216 for use during a second mask process. The transmitting portion M1 may allow light to fully pass through and may correspond to the pixel region P, except for portions for thin film transistor region T and storage region S. The shielding portion M2 may thoroughly block light during the second mask process and may correspond to the data region D, the thin film transistor region T, the gate region G, and the storage region S. The half-transmitting portion M3 may include a plurality of slits or may be a semitransparent film so that only about one-half of the light may pass through. The half-transmitting portion M3 may correspond to the portion of the thin film transistor region T, especially to the gate electrode 204.

After locating the mask M, a light exposure may be performed to the photoresist 216 through the mask M. The light passing through the transmitting portion M1 fully irradiates the corresponding regions, while the light passing through the half-transmitting portion M3 weakly irradiates the corresponding regions.

Figure 8C:
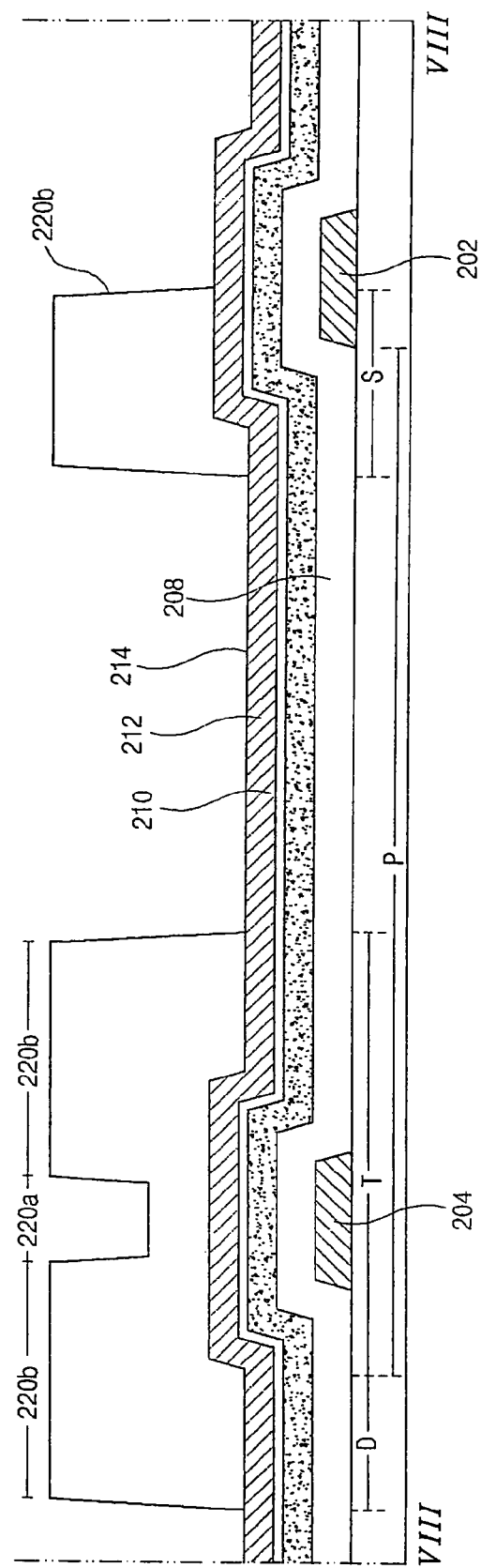
Figure 9C:
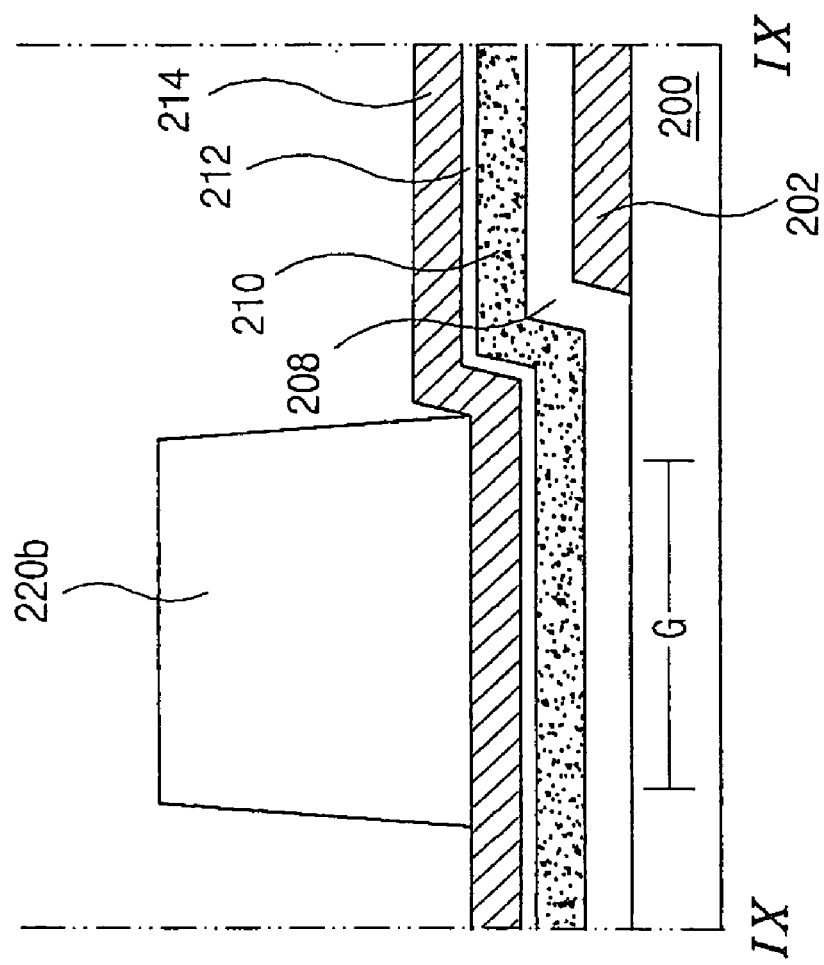

In FIGS. 8C, 9C, and 10C, after developing the photoresist 216, the portions corresponding to the shielding portion M2 of the mask M fully remain, but the portions corresponding to the transmitting portions M1 are fully removed. Furthermore, the portion corresponding to the half-transmitting portion M3 is removed and partially remains. Accordingly, after the developing process of the photoresist 216, a first photo-pattern 220a and a second photo-pattern 220b remain on the second metal layer 214, wherein all of the photo-patterns 220 correspond in position to the thin film transistor region T, the data region D, and the gate region G.

In FIG. 8C, the first photo-pattern 220a may have a height less than the second photo-pattern 220b since it was weakly irradiated by the light passed through the half-transmitting portion M3 of the mask M. Conversely, the height of the second photo-pattern 220b may be almost double the height of the first photo-pattern 220a.

Figure 8D:
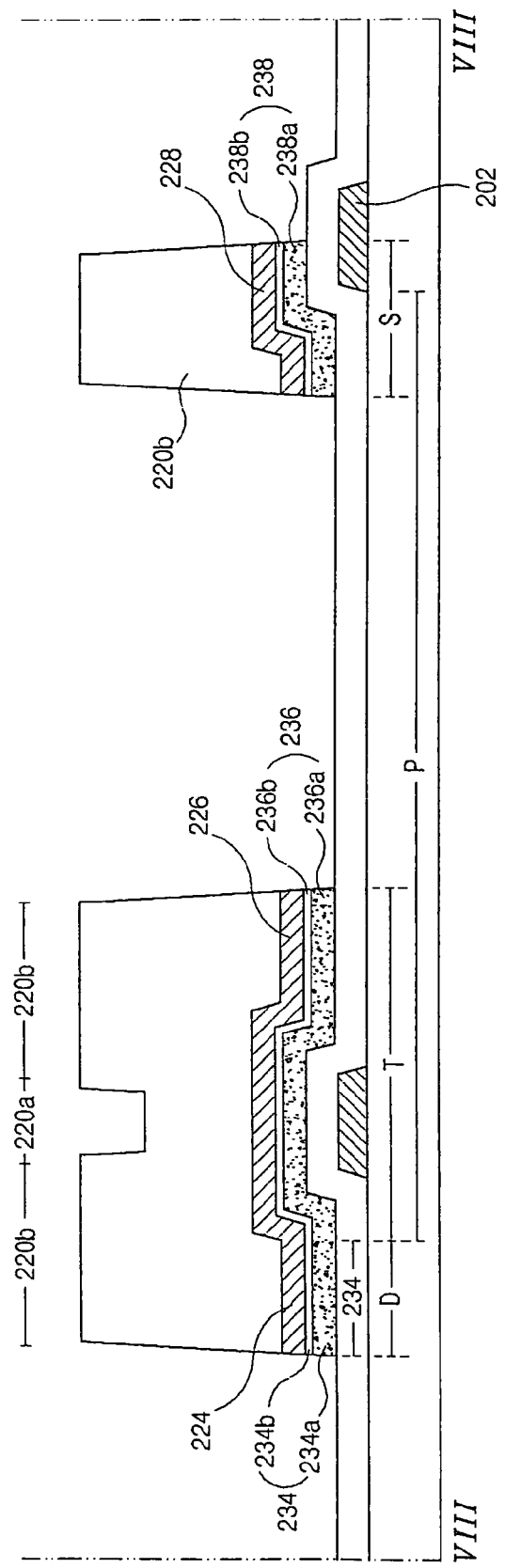
Figure 9D:
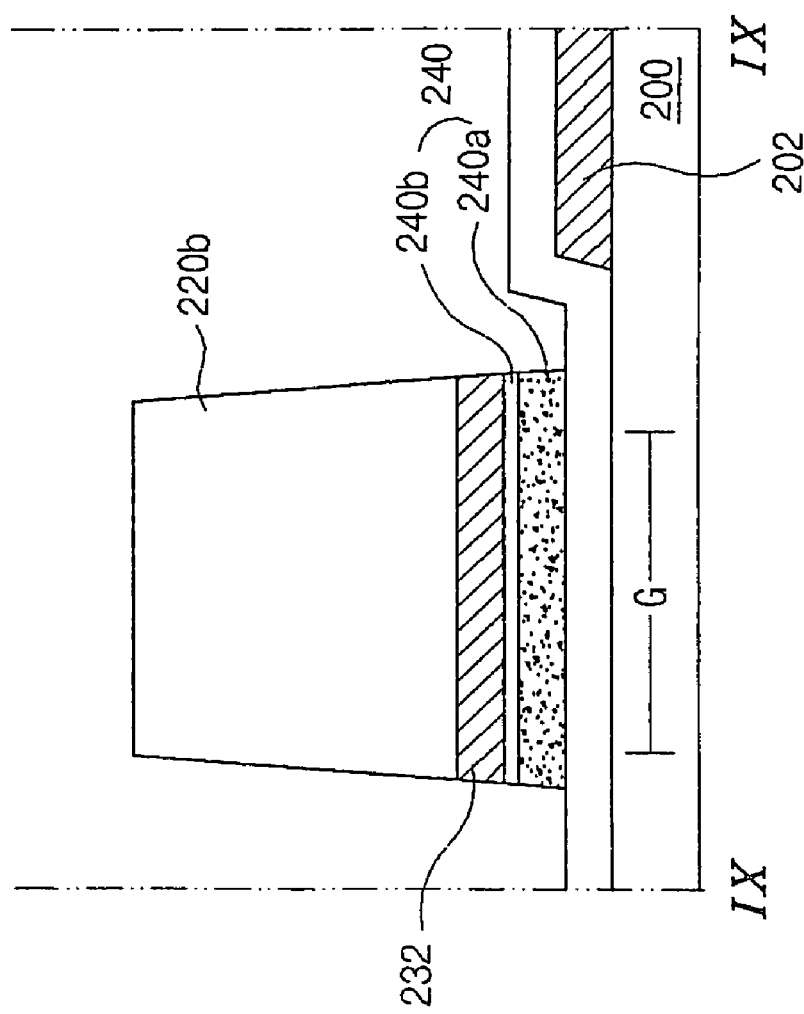
Figure 10D:
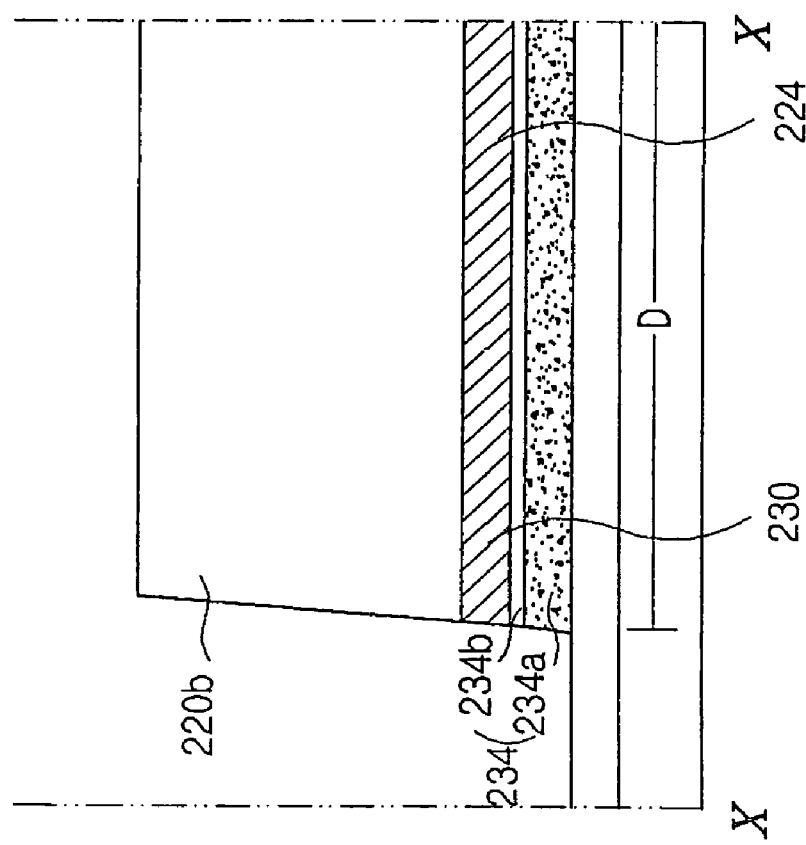

In FIGS. 8D, 9D, and 10D, the exposed portions of the second metal layer 214, the $n^+$-doped amorphous silicon layer 212, and the intrinsic amorphous silicon layer 210 may be simultaneously etched. Accordingly, a data line 224, a source-drain metal layer 226, a storage metal layer 228, a data pad 230, and a gate pad 232 may be formed beneath the photo-patterns 220. Thus, the data line 224 and the data pad 230 correspond to the data region D, the gate pad 232 may have an island shape and corresponds to the gate region G, the storage metal layer 228 may also have an island shape and corresponds to the storage region S, and the source-drain metal layer 226 may extend from the data line 224 and corresponds to the thin film transistor region T.

Since the $n^+$-doped amorphous silicon layer 212 and the intrinsic amorphous silicon layer 210 may be simultaneously etched with the second metal layer 214, first, second, third, and fourth semiconductor patterns 234, 236, 238, and 240 may be formed beneath the data line 224, the data pad 230, the source-drain metal layer 226, the storage metal layer 228, and the gate pad 232, respectively. The first semiconductor pattern 234 may correspond to the data line 224 and the data pad 230, the second semiconductor pattern 236 may correspond to the source-drain metal layer 225, the third semiconductor pattern 238 may correspond to the storage metal layer 228, and the fourth semiconductor pattern 240 may correspond to the gate pad 232. The first, second, third, and fourth semiconductor patterns 234, 236, 238, and 240 may comprise the intrinsic amorphous silicon patterns 234a, 236a, 238a, and 240a, and the $n^+$-doped amorphous silicon patterns 234b, 236b, 238b, and 240b.

Figure 8E:
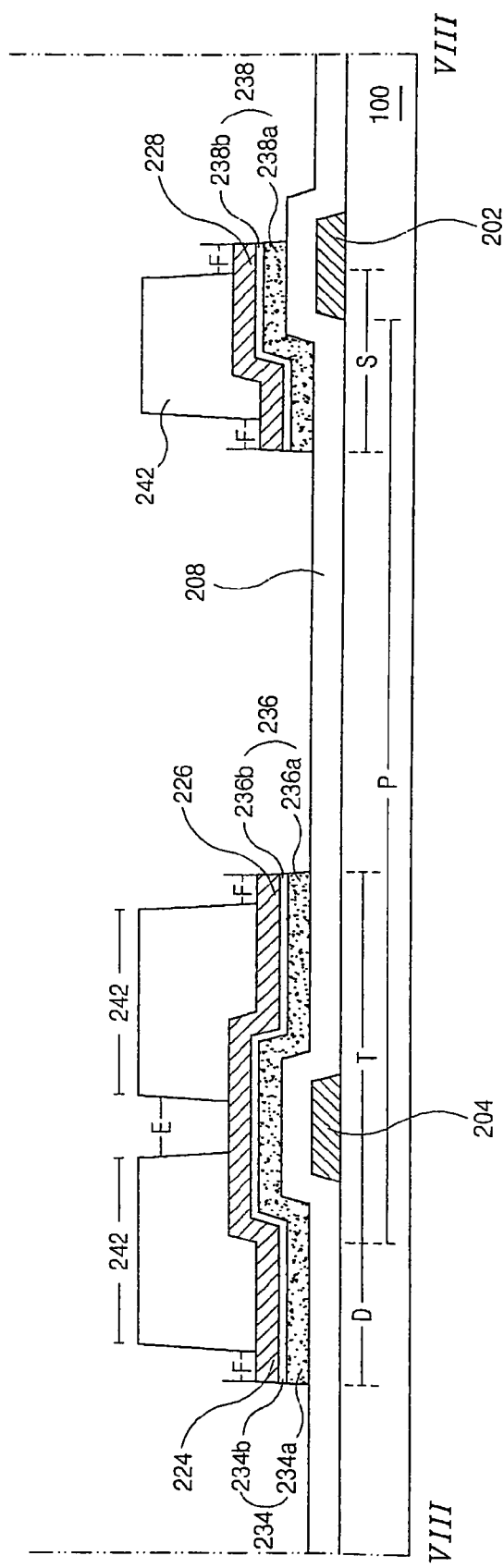
Figure 9E:
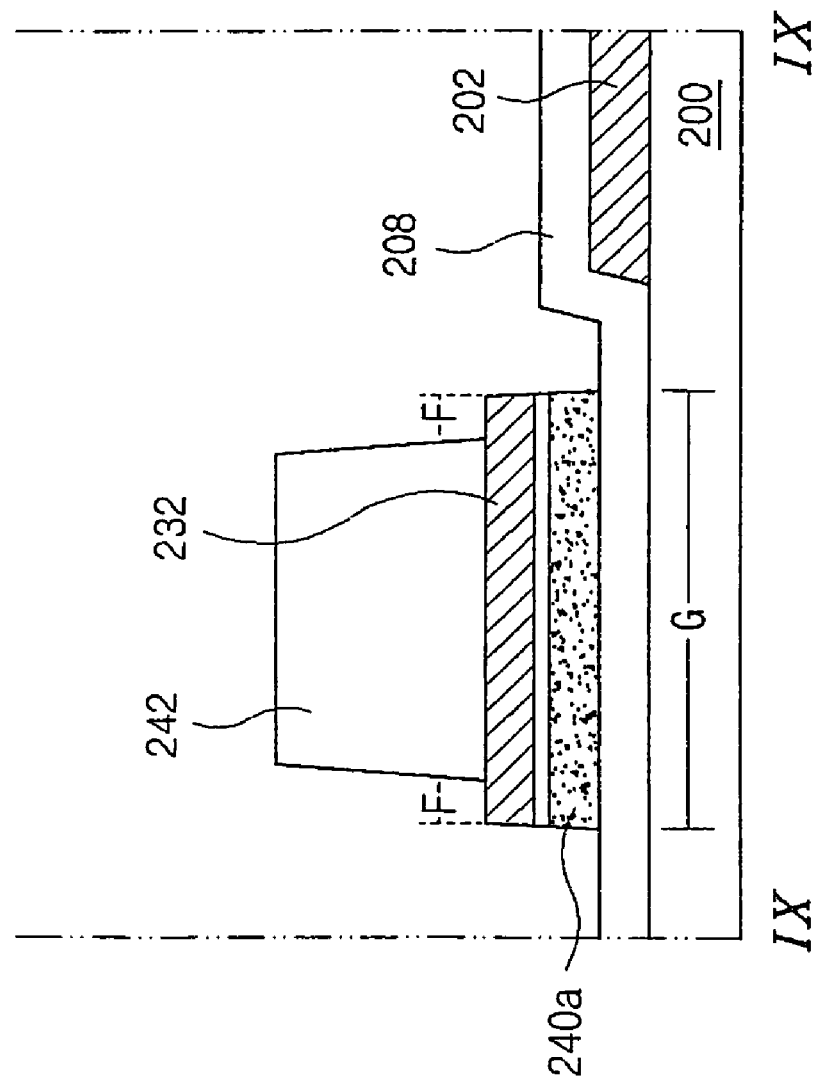

In FIGS. 8E, 9E, and 10E, the photo-patterns 220a and 220b may undergo an ashing process to form an active channel of the thin film transistor. The ashing process may include dry etching processes to partially remove the photo-patterns 220a and 220b. During the ashing process, the first photo-pattern 220a may be completely removed, and the second photo-pattern 220b may be partially removed as much as the first photo-pattern 220a. Accordingly, while completely removing the first photo-pattern 220a, the second photo-pattern 220b may be partially removed so that a height and width of the second photo-pattern 220b may be reduced. As a result, a center portion E of the source-drain metal layer 226 may be exposed, and side portions F of the data line 224, storage metal layer 228, data pad 230, and gate pad 232 may be exposed. Thus, photo-patterns 242 may have smaller widths and heights than the second photo-pattern 220b and may expose the side portions F of the data line 224 and the storage metal layer 228. In addition, the center portion E corresponding to the gate electrode 204 may be completely exposed.

Figure 8F:
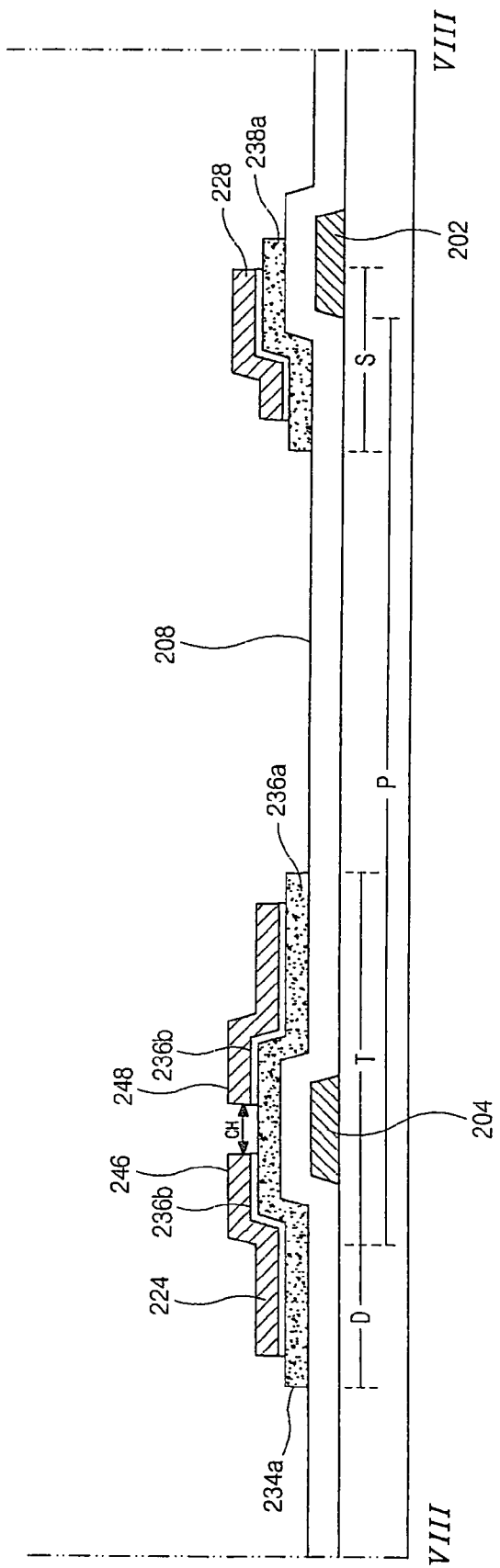
Figure 9F:
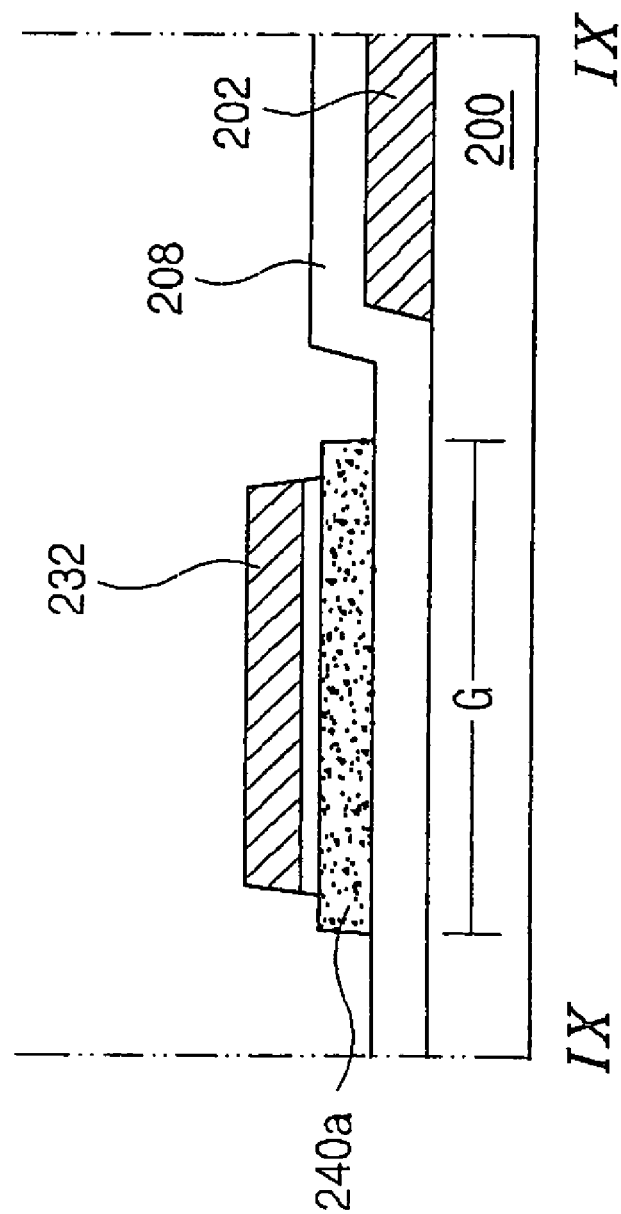
Figure 10F:
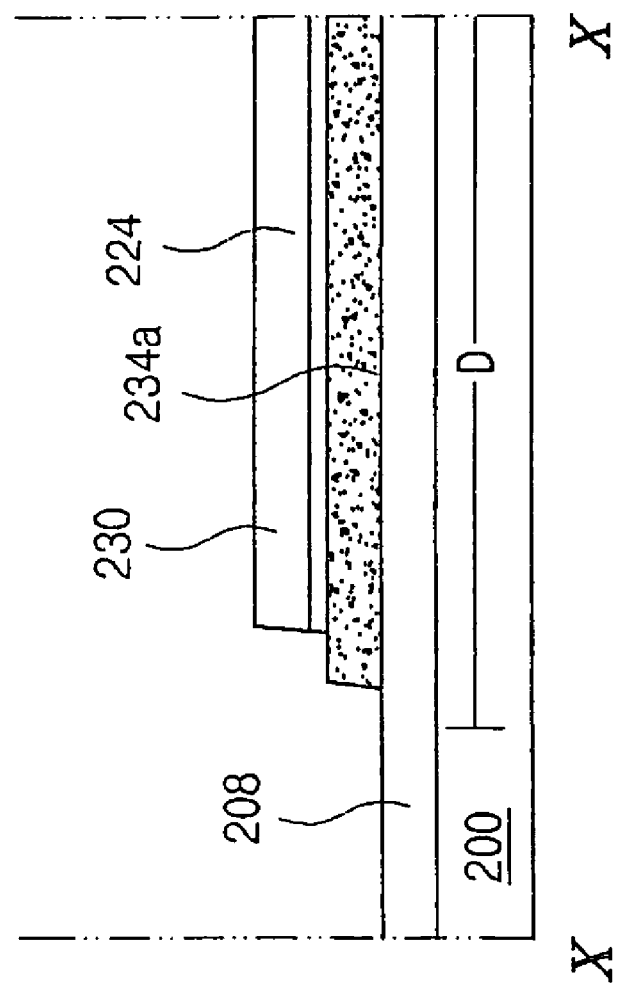

In FIGS. 8F, 9F and 10F, the exposed portions E and F may be removed until the intrinsic amorphous silicon patterns 234a, 236a, 238a, and 240a are exposed. Then, the ashed photo-patterns 242 may be removed from the source-drain metal layer 226, storage metal layer 228, data pad 230, and gate pad 232. Accordingly, a source electrode 246 and a drain electrode 248 may be formed over an active layer 236a (i.e., the intrinsic amorphous silicon pattern). An active channel between the source and drain electrodes 246 and 248 may also be formed over the active layer 236a above the gate electrode 204. The source electrode 246 may extend from the data line 224, and the drain electrode 248 may be spaced apart from the source electrode 246 across the gate electrode 204. As shown in FIG. 7, the storage metal layer 238 may have an island shape.

In FIGS. 9F and 10F, the gate pad 232 and the data pad 230 may be completely exposed within the gate region G and the data region 1), respectively. The data pad 230 may be disposed at the end of the data line 224 as a single body so that the data pad 230 electrically communicates with the data line 224. The gate pad 232 may have an island shape and may be disposed next to the gate line 202, but may be electrically isolated from the gate line 202.

In FIGS. 8F, 9F, and 10F, since the portions E and F of the metal layer and the n⁺-doped amorphous silicon layer may be simultaneously removed, the intrinsic amorphous silicon patterns 234a, 236a, 238a, and 240a may be exposed around the patterned metal layers 224, 246, 248 228, 230, and 232. The intrinsic amorphous silicon pattern 236a corresponding to the thin film transistor region T may be referred to as an active layer, and the n⁺-doped amorphous silicon patterns 236b on the active layer 236a may be referred to as ohmic contact layers.

Meanwhile, the storage metal layer 228 may overlap a portion of the gate line 202, wherein the storage capacitor $C_{st}$ (in FIG. 7) may comprise portions of gate line 202, the storage metal layer 228, and the interposed first insulating layer 208. Furthermore, as shown in FIG. 7, the thin film transistor T may comprise the gate electrode 204, the active layer 236a, the ohmic contact layers 236b, the source electrode 246, and the drain electrode 248.

Figure 8G:
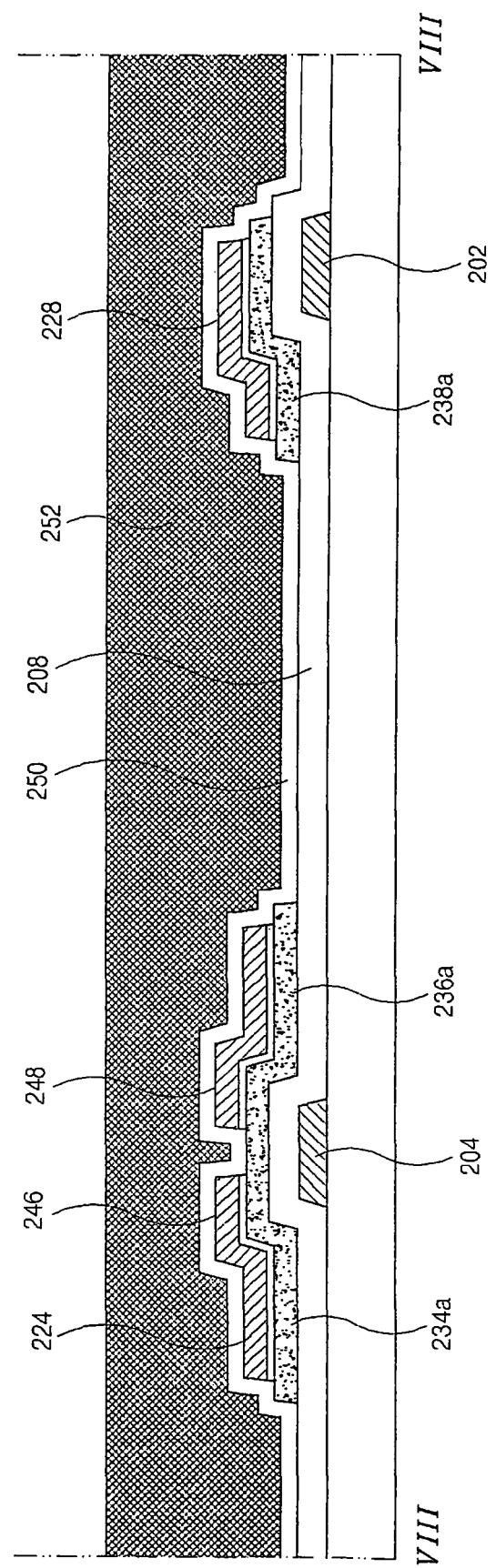
Figure 9G:
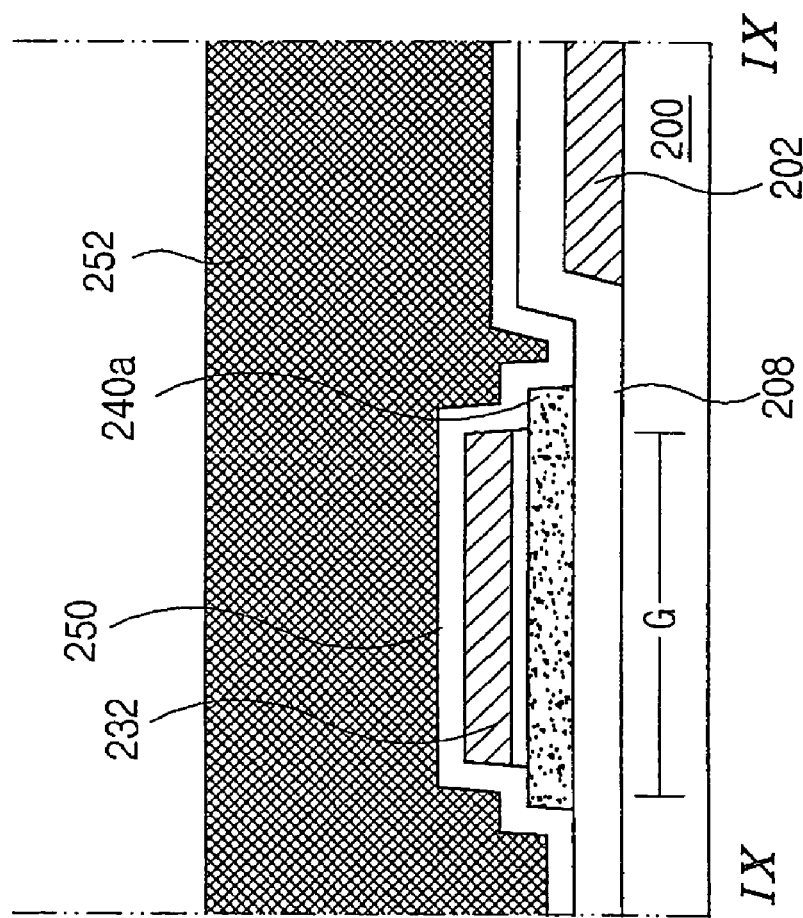
Figure 10G:
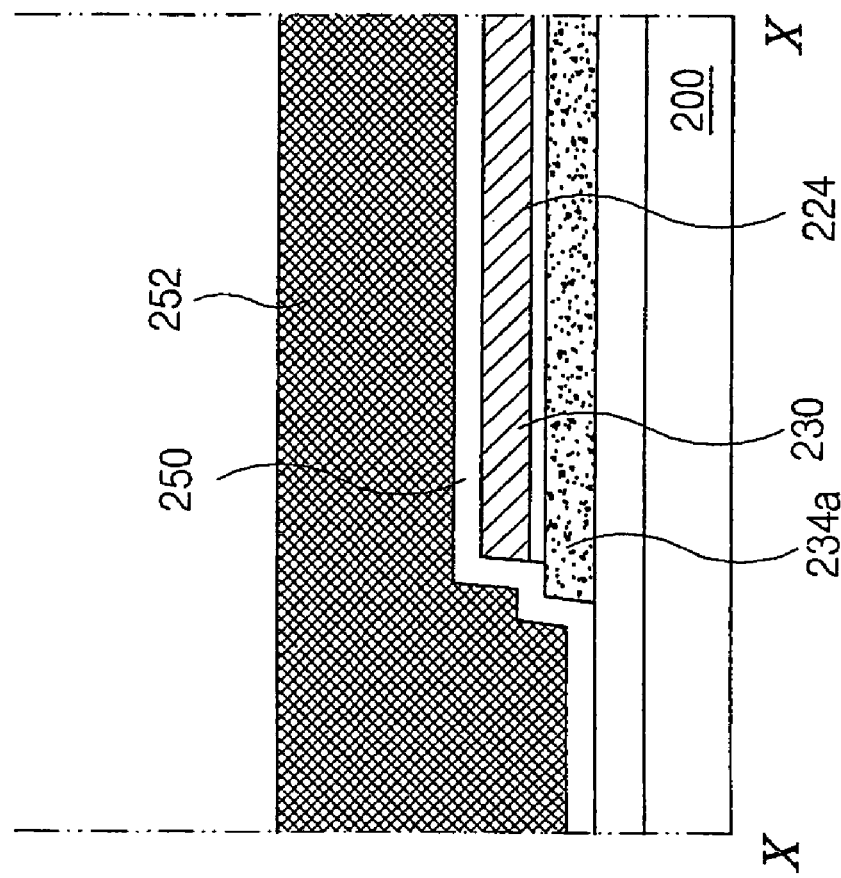

In FIGS. 8G, 9G, and 10G, a second insulation layer 250 may be deposited along an entire surface of the substrate 200 to cover the patterned second metal layer. The second insulation layer 250 may be formed of silicon nitride ($SiN_x$) or silicon oxide ($SiO_2$) to enhance adhesion of a subsequently-formed organic layer on the substrate 200 by preventing poor contact properties between the active layer 236a and the organic layer. If poor contact properties do not occur between the active layer 236a and the organic layer, the second insulation layer 250 may not be necessary. Then, an opaque organic material 252 having a low dielectric constant may be deposited on the second insulation layer 250 having a black color to function as a black matrix.

Figure 8H:
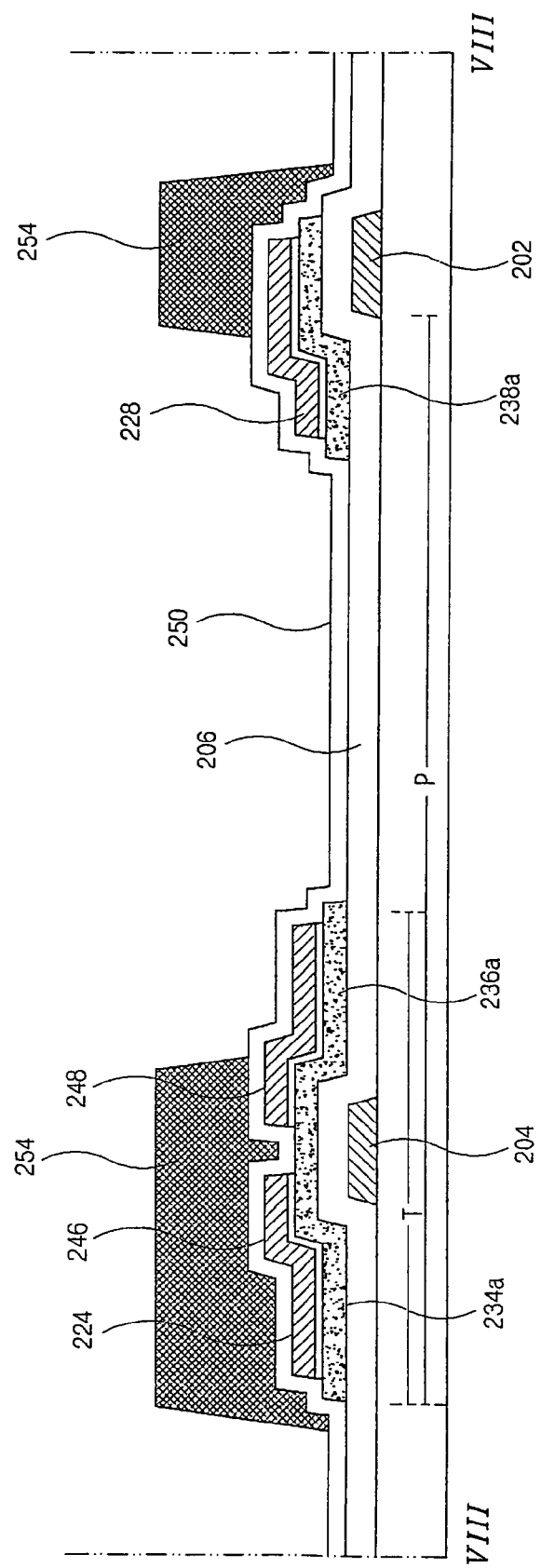
Figure 9H:
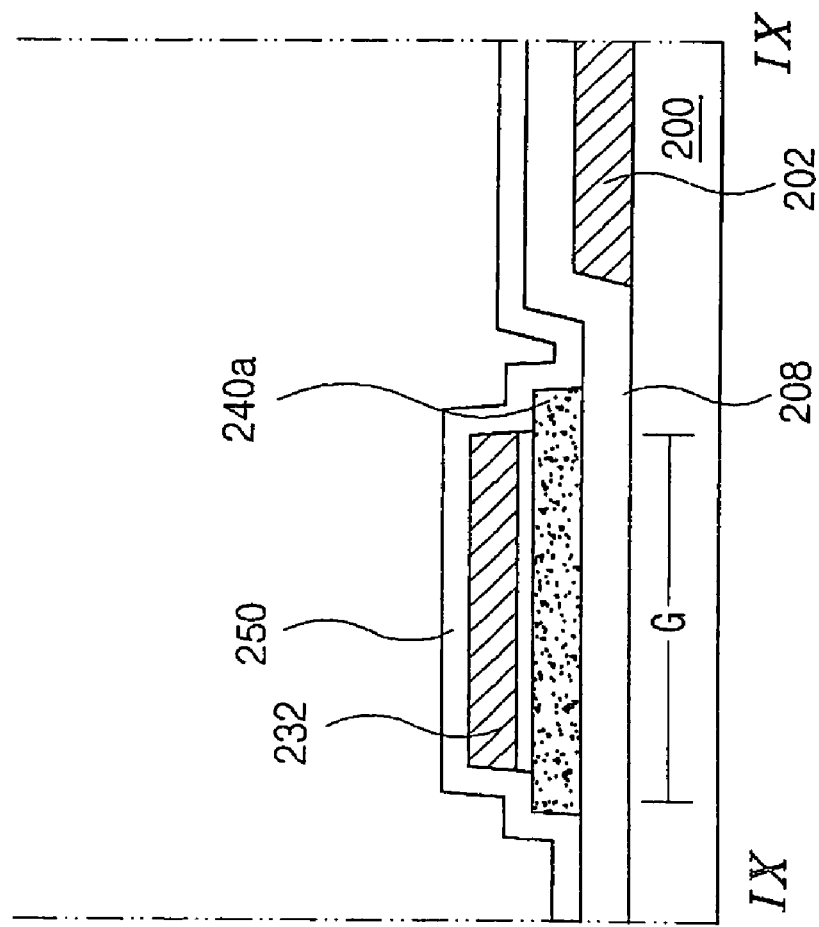
Figure 10H:
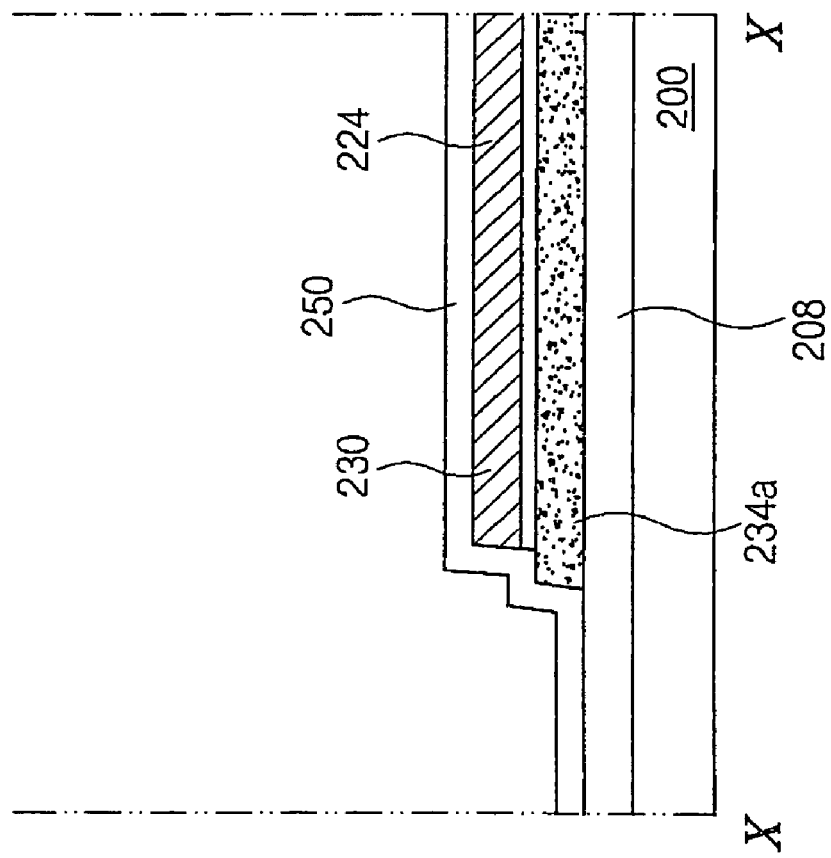

In FIGS. 8H, 9H, and 10H, the opaque organic material 252 formed on the second insulation layer 250 may be patterned using a third mask process to form a black matrix 254. As shown in FIGS. 7 and 8H, the black matrix 254 may be formed over the thin film transistor T, the gate line 202, and the data line 224 all of which may be disposed within a display area. Since the black matrix 254 may be formed an organic material, it may protect the thin film transistor T. In addition, the black matrix 254 may cover a portion of the storage metal layer 228, thereby protecting the storage capacitor.

Figure 8I:
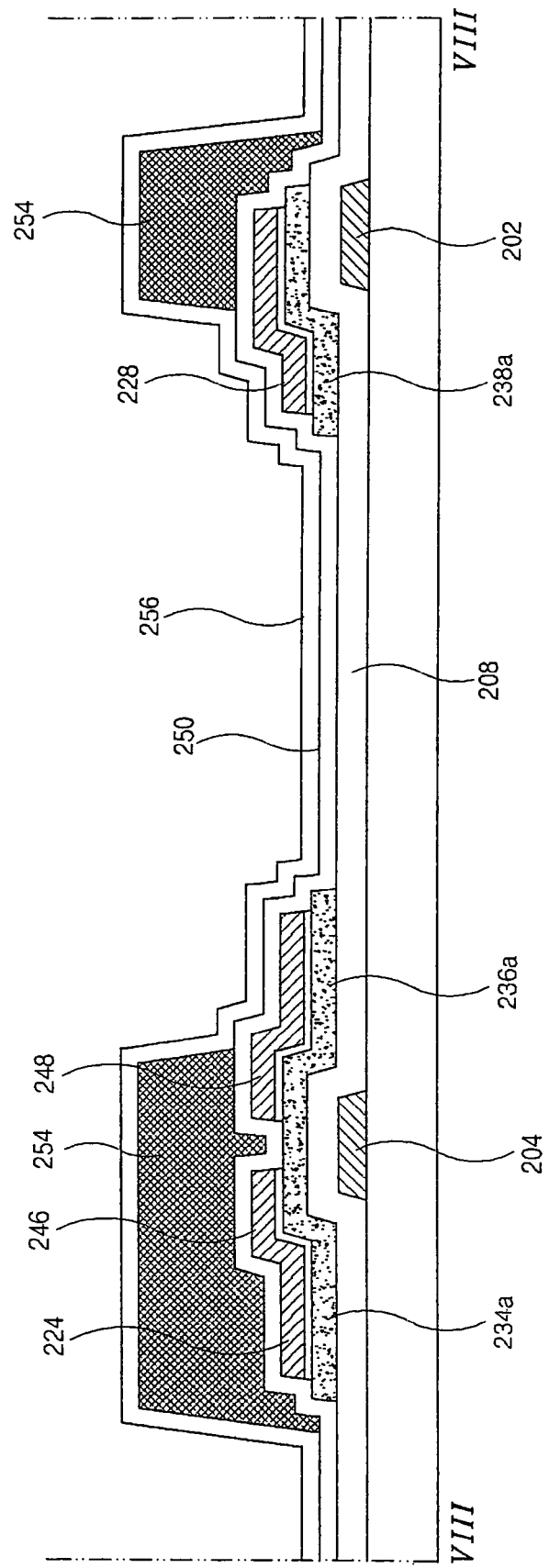
Figure 9I:
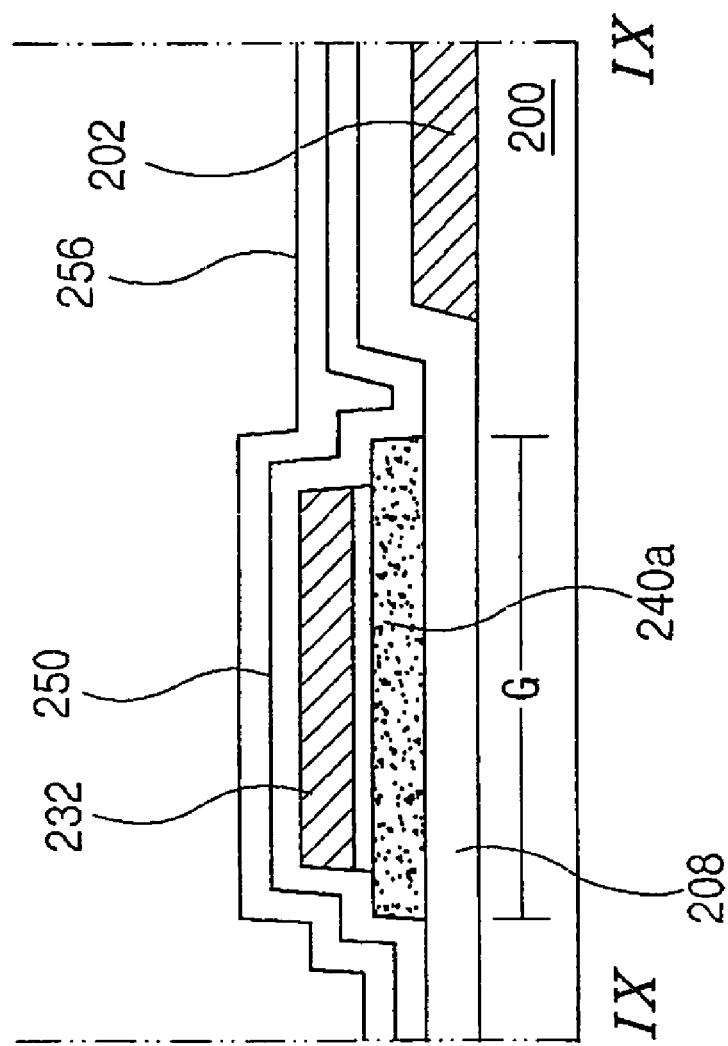
Figure 10I:
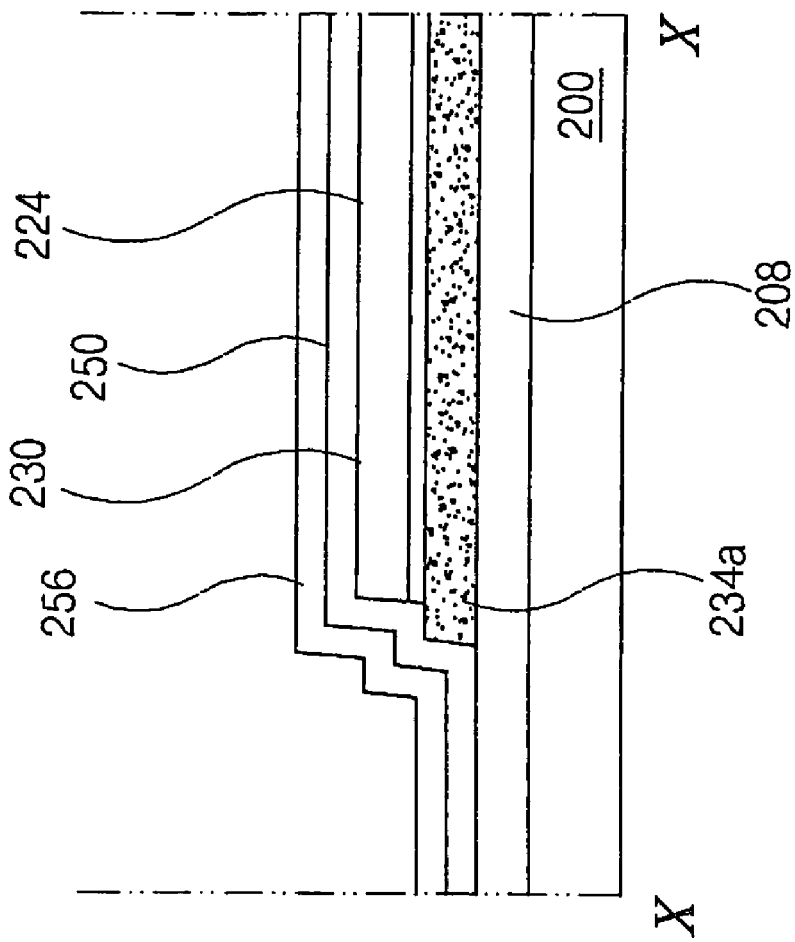

In FIGS. 8I, 9I, and 10I, a third insulation layer 256 may be formed along an entire surface of the substrate 200 to cover the black matrix 254. The third insulating layer 256 may be formed of inorganic insulating material, such as silicon nitride ($SiN_x$) or silicon oxide ($SiO_2$).

Figure 8J:
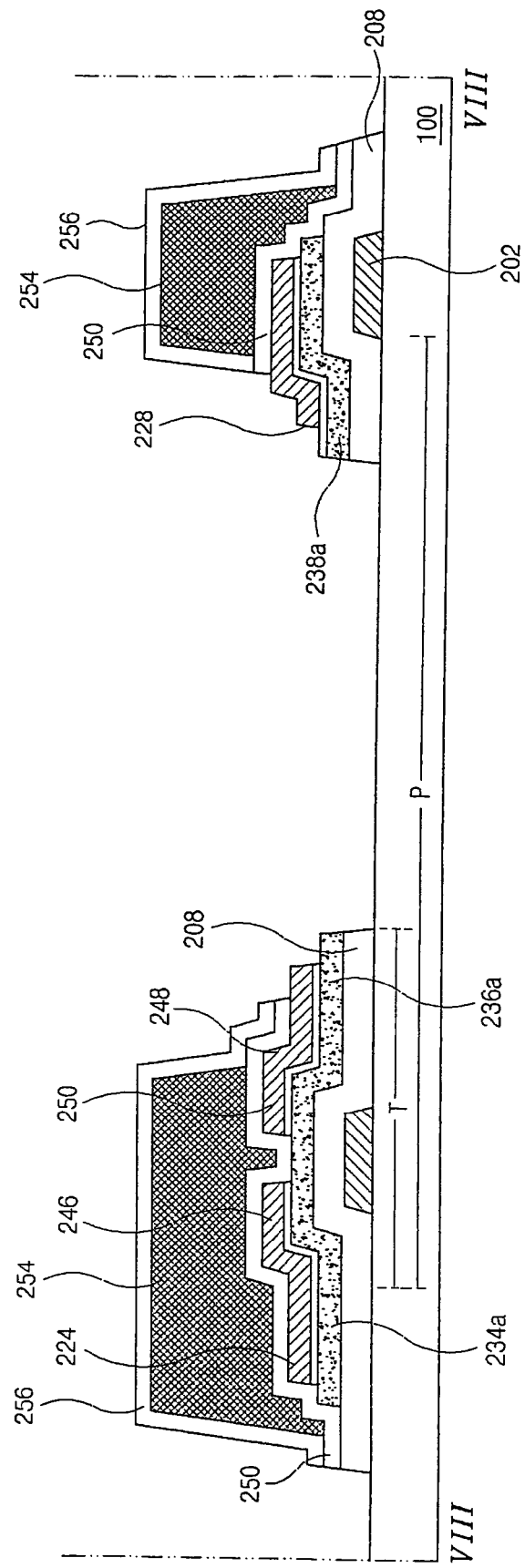
Figure 9J:
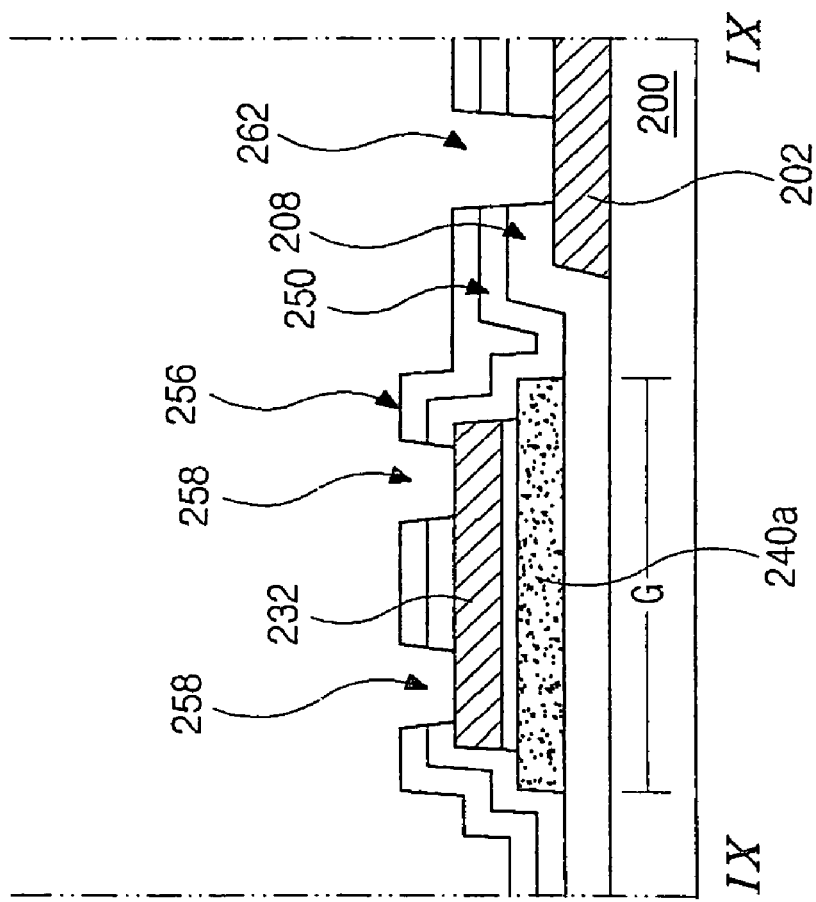
Figure 9K:
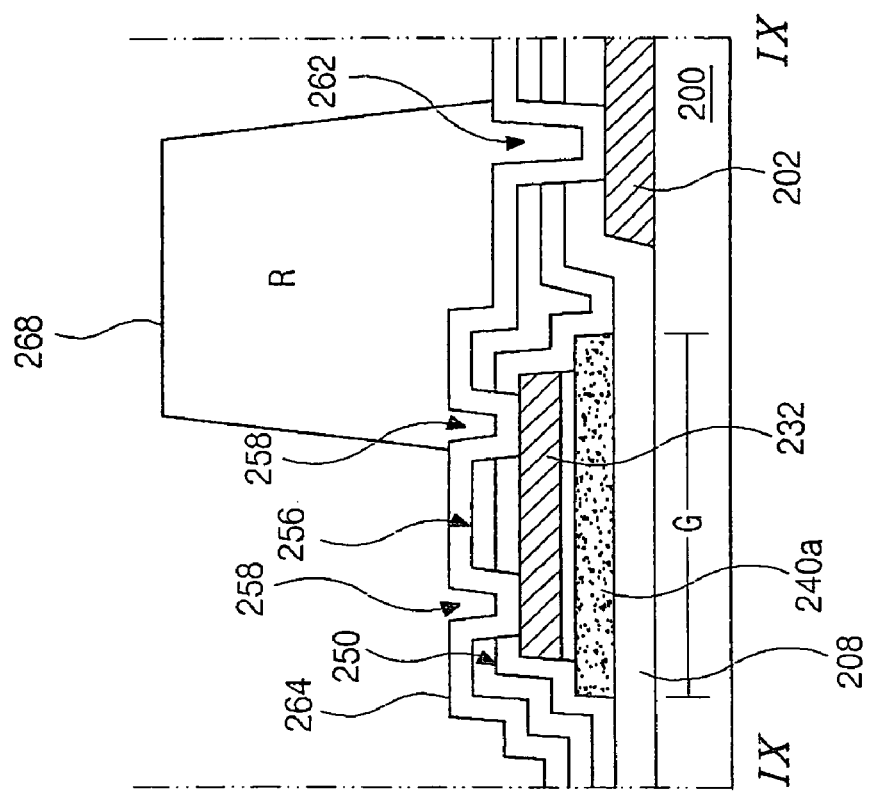
Figure 9L:
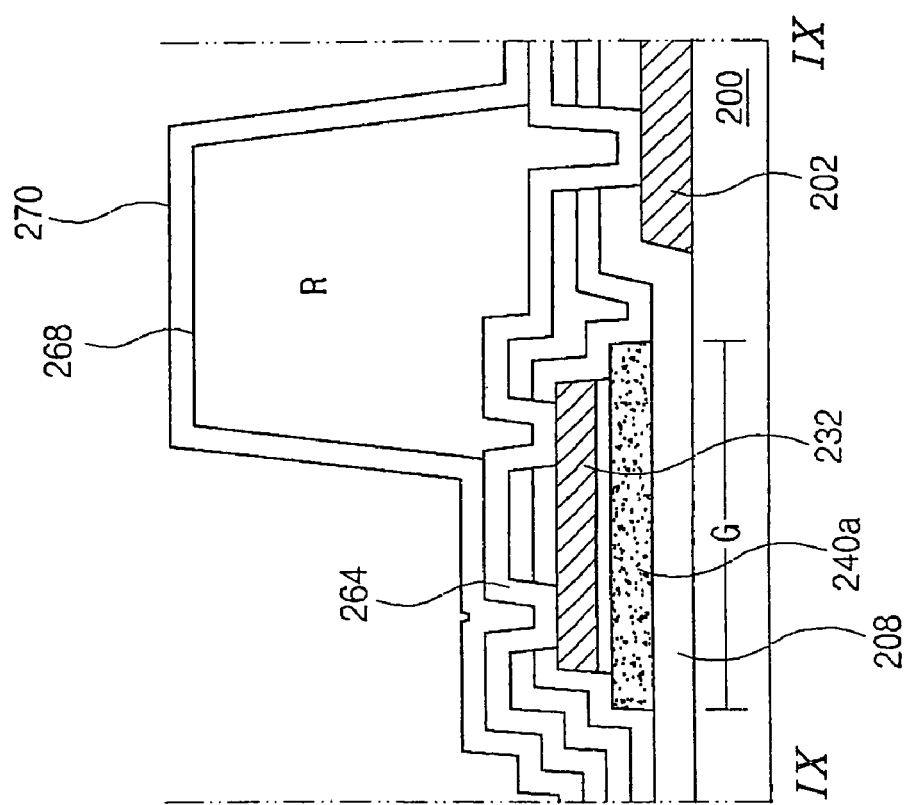
Figure 9M:
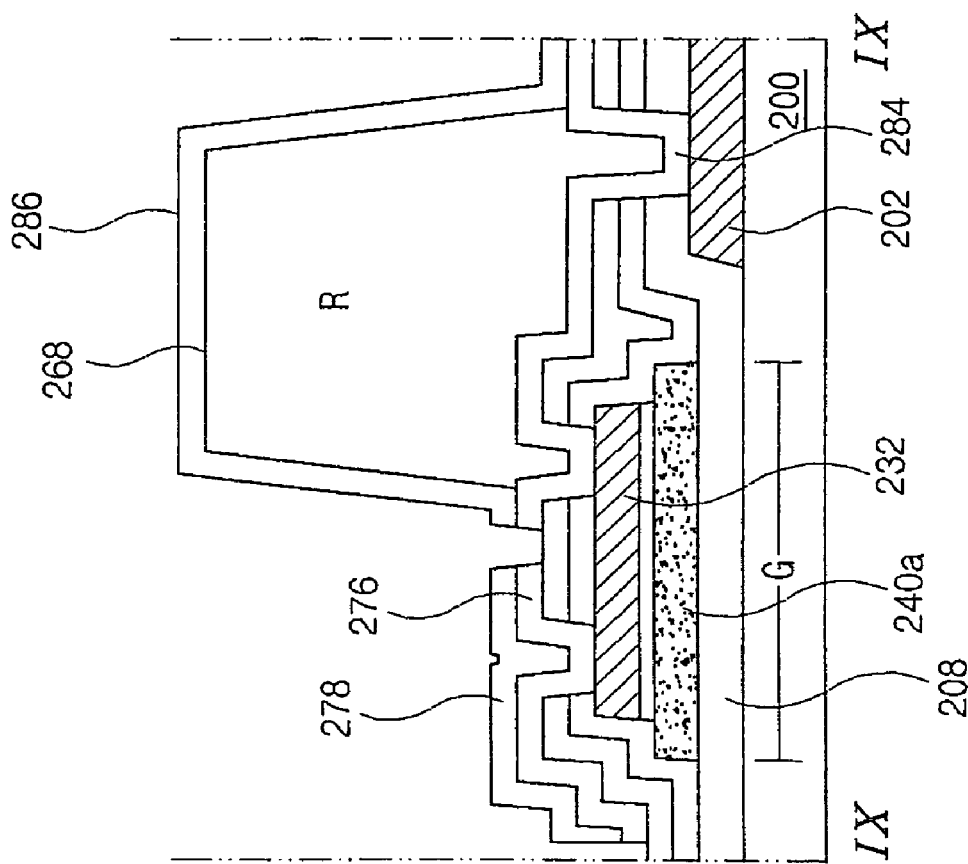
Figure 10J:
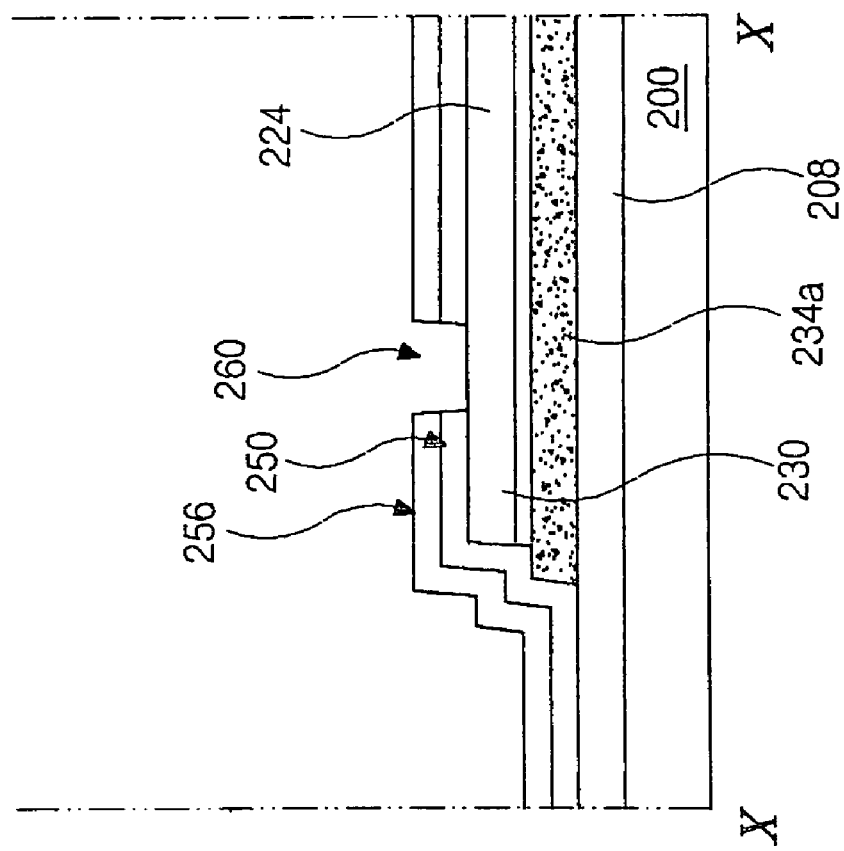

In FIGS. 8J, 9J, and 10J, the first, second, and third insulation layers 208, 250, and 256 may be simultaneously patterned using a fourth mask process within the pixel region P and within the gate and data pad regions, thereby exposing an end side portion of the drain electrode 248 and an end side portion of the storage metal layer 228. Although FIG. 8J shows that the substrate 200 may be exposed by patterning the first insulation layer 208, the first insulation layer 208 may remain and only the second and third insulation layers 250 and 256 may be patterned to expose the side portions of the drain electrode 248 and storage metal layer 228. Furthermore, remaining portions of the first insulation layer 208 on the substrate 200 may control a height of a color filter to be formed during later processes. During patterning of the first, second, and third insulation layers 208, 250, and 256 within the pixel region P, first, second, and third contact holes 258, 260, and 262 may be formed within the pad regions (i.e., within non-display areas). The first contact holes 258 may be formed by patterning the second and third insulation layers 250 and 256, thereby exposing portions of the gate pad 232. The second contact hole 260 may also be formed by patterning the second and third insulation layers 250 and 256, thereby exposing a portion of the data pad 230. On the other hand, the third contact hole 262 may be formed by patterning the first, second, and third insulation layers 208, 250s and 256, thereby exposing an end portion of the gate line 202. The first contact holes 258 may be formed as a plurality so that one of the first contact holes 258 adjacent to the third contact hole 262 may be used to electrically connect the gate line 202 to the gate pad 232 during later processing steps, as shown in FIGS. 9K-9M.

Figure 8K:
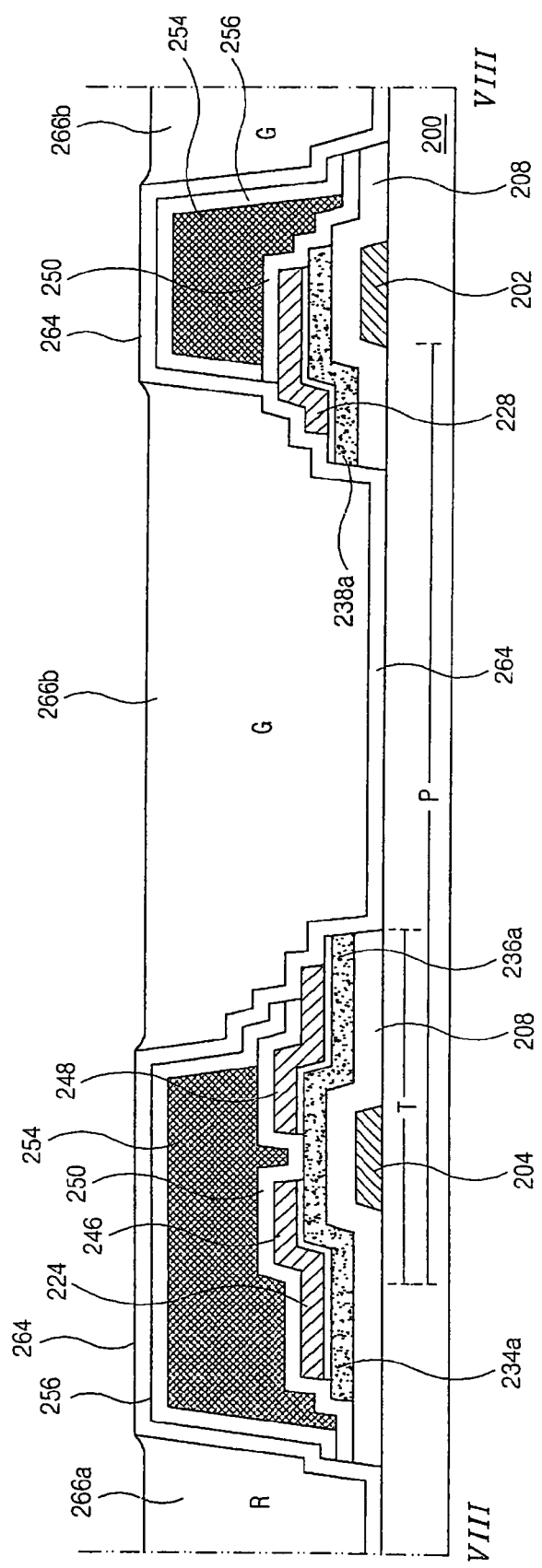
Figure 10K:
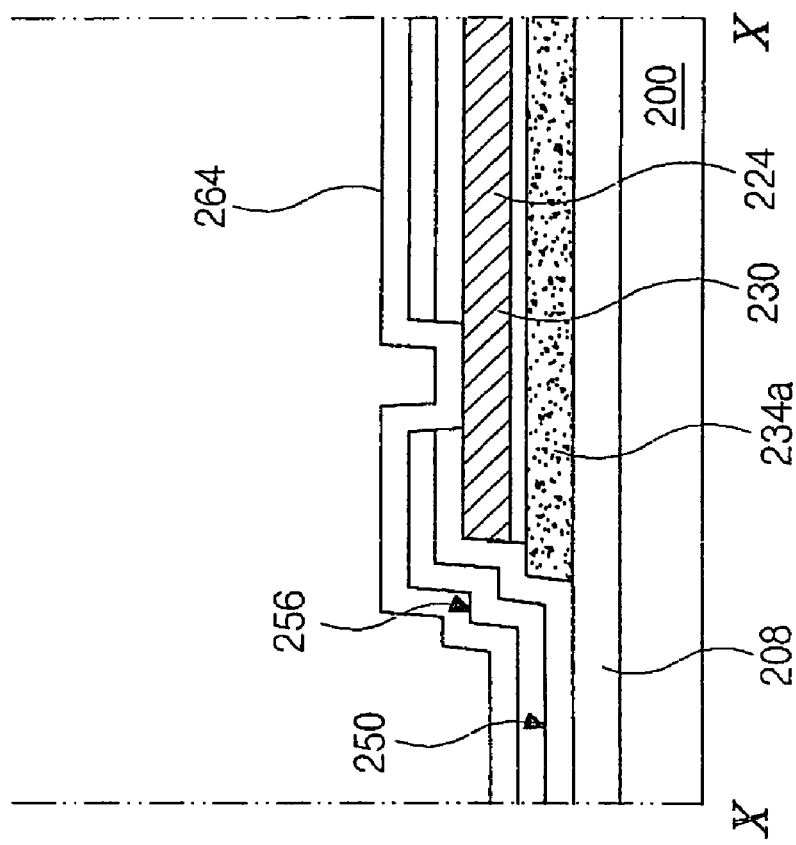

In FIGS. 8K, 9K, and 10K, a first transparent electrode layer 264 of indium tin oxide (ITO) or indium zinc oxide (IZO) may be deposited along an entire surface of the substrate 200 to cover the patterned third insulation layer 256 and to contact the exposed side portions of the drain electrode 248 and storage metal layer 228.

Next, color resin may be formed on the first transparent electrode layer 264 and developed to form color filters 266a, 266b, and 266c having red (R), green (G), and blue (B) colors. The color filters 266a, 266b, and 266c function to display a full spectrum of colors and may be formed within the pixel regions P on the first transparent electrode layer 264. The red, green, and blue color filters 266a, 266b, and 266c may be sequentially formed by forming and developing the red, green, and blue color resins. When one of the color filters 266a, 266b, and 26c is formed, for example, when the red (R) color filter 266a is formed, a color filter pattern 268 may also be formed above the end of the gate line 202 and over a portion of the gate pad 232. Particularly, the color filter pattern 268 may be formed to correspond to and fit into the third contact hole 262. As described above, the color filter pattern 268 may protect the aluminum-based gate line 202 and electrode 204 from the etchant and developer solutions used to etch and develop the array elements.

Meanwhile, when developing the color resin, the first transparent electrode layer 264 may prevent the developing solution (i.e., a developer) used to pattern the color resins from penetrating into other underlying metallic layers. In step portions of the gate line 202 and gate electrode 204, the gate insulation layer 208 and other insulation layers may be formed having pinholes and cracks. Therefore, when developing the color resins, the developer for the color resins may penetrate into the insulation layers 208, 250, and 256, thereby deteriorating the gate line 202 and the gate electrode 204 formed of aluminum-based material. By forming the first transparent electrode layer 264, such deterioration may be prevented and process stability may be achieved. Therefore, the chemically weak gate line 202 and electrode 204 may be protected from the developer solution.

Figure 8L:
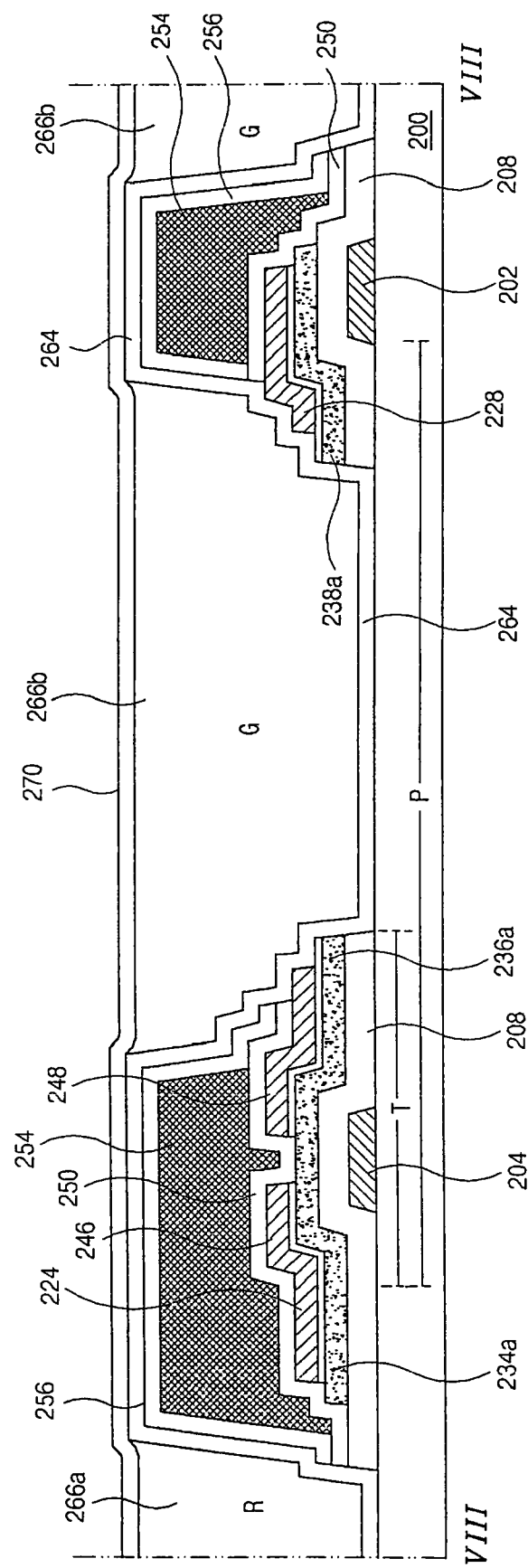
Figure 10L:
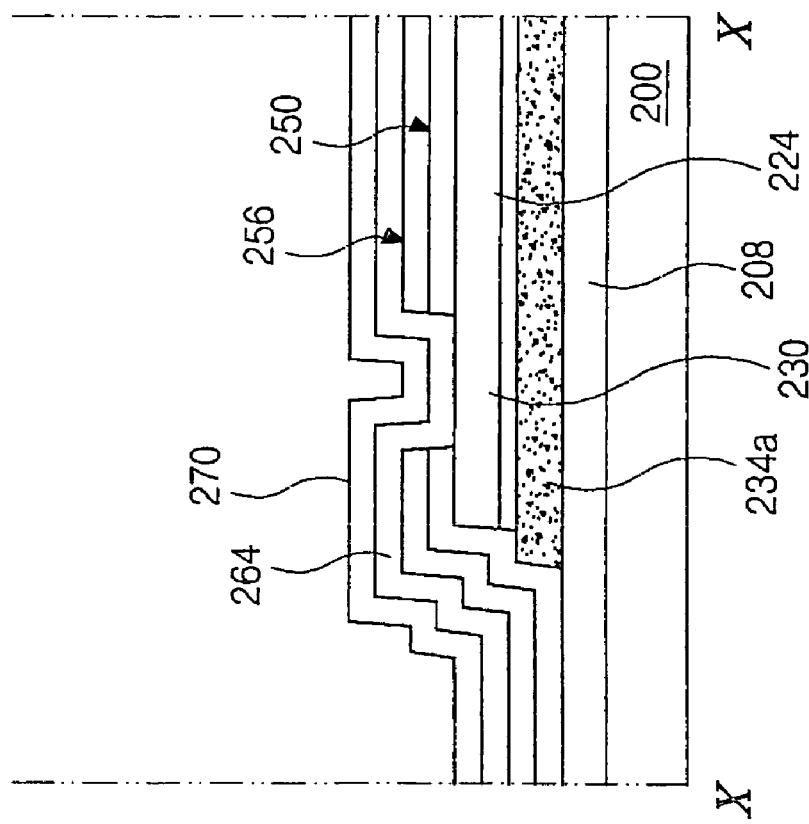

In FIGS. 8L, 9L, and 10L, a second transparent electrode layer 270 may be formed along an entire surface of the substrate 200 to cover the color filters 266, the color filter pattern 268, and the exposed portions of the first transparent electrode layer 264. The second transparent electrode layer 270 may include indium tin oxide or indium zinc oxide similar to materials of the first transparent electrode layer 264. As shown in FIGS. 8L and 9L, the second transparent electrode layer 270 may contact the first transparent electrode layer 264 at both sides of each color filter 266 and at both sides of the color filter pattern 268. Furthermore, as shown in FIG. 10L, the second transparent electrode layer 270 may overlap and contact the first transparent electrode layer 264 within the data pad portion.

Figure 8M:
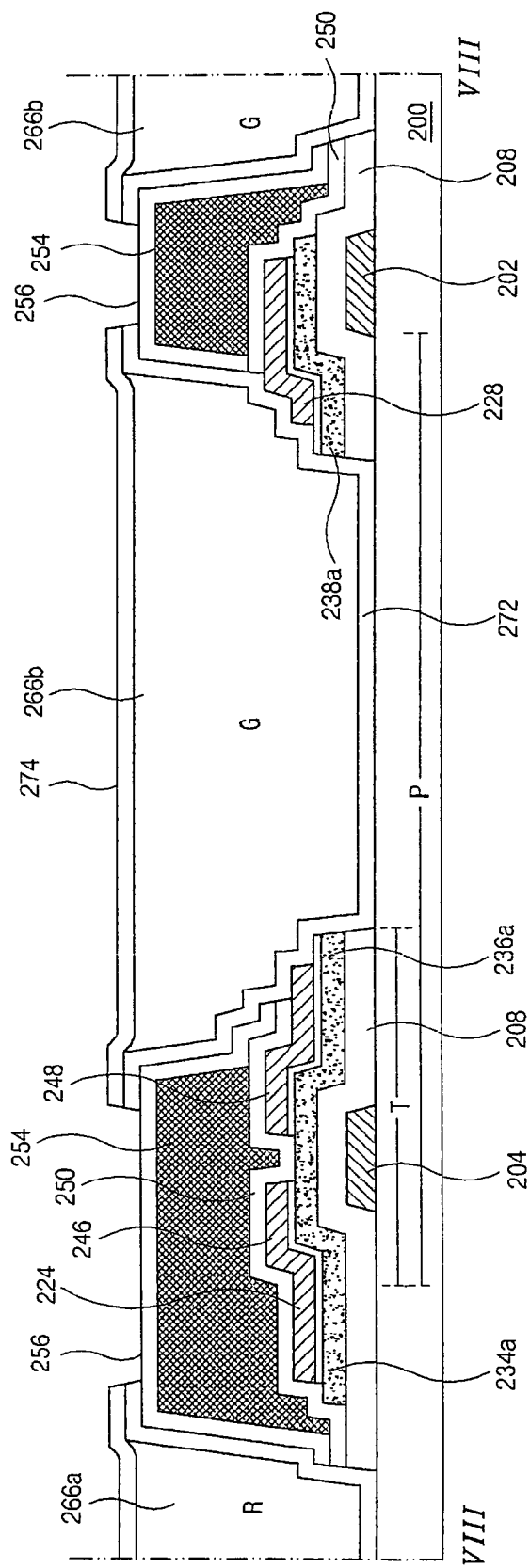
Figure 10M:
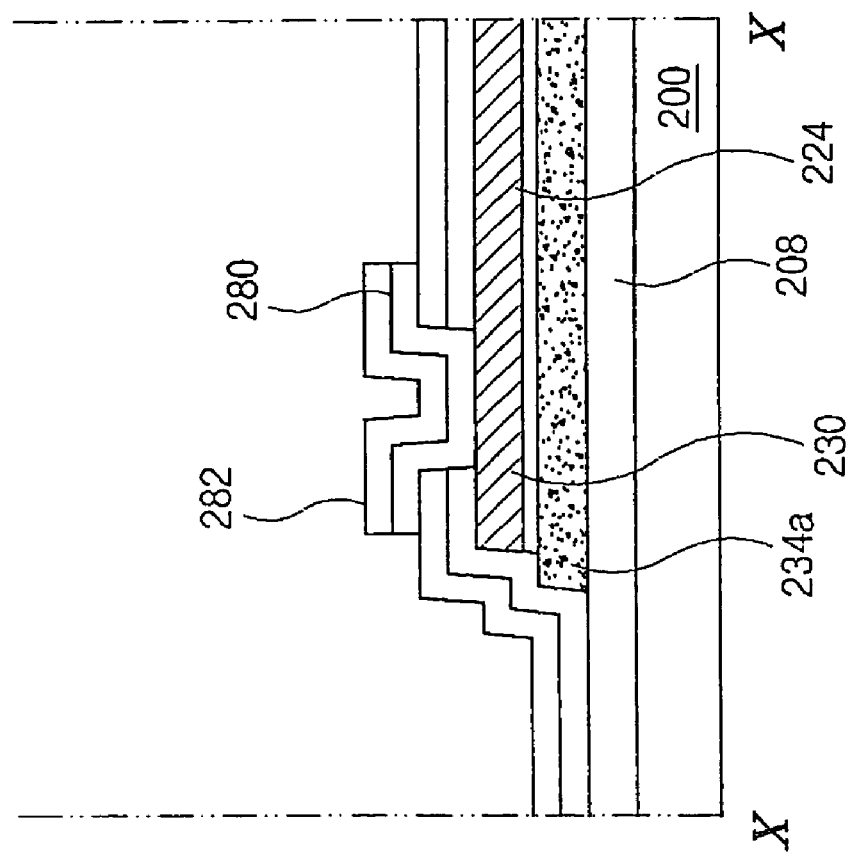

In FIGS. 8M, 9M, and 10M, the first and second transparent electrode layers 264 and 270 may be simultaneously patterned using a fifth mask process to form a double-layered pixel electrode (i.e., sandwich pixel electrode), a double-layered gate pad terminal, a double layered connecting electrode, and a double-layered data pad terminal. The double-layered pixel electrode may comprise a first pixel electrode 272 and a second pixel electrode 274, the double-layered gate pad terminal may comprise a first gate pad terminal 276 and a second gate pad terminal 278, and the double-layered data pad terminal may comprise a first data pad terminal 280 and a second data pad terminal 282. Furthermore, the double-layered connecting electrode may comprise a first connecting electrode 284 and a second connecting electrode 286.

In addition, the first and second transparent electrode layers 264 and 270 may be simultaneously patterned using the same mask so that the sandwich pixel electrode may be formed to correspond to each of the pixel regions P. Alternatively, the first transparent electrode layer 264 may be patterned first, and the color filters formed thereon, and then the second transparent electrode layer 270 may be patterned. Each color filter 266 may be interposed into the sandwich pixel electrode in between the first pixel electrode 272 and the second pixel electrode 274. As shown in FIG. 8M, since the second pixel electrode 274 may contact the first pixel electrode 272 at both sides of the color filter 266, the sandwich pixel electrode may electrically communicate with the thin film transistor T and may be connected in parallel to the storage capacitor $C_{st}$ (in FIGS. 9J and 9K).

As shown in FIGS. 9M and 10M, the double-layered gate pad terminal, connecting line, and data pad terminal may be formed with the double-layered pixel electrode using the same mask. The double-layered gate pad terminal may be disposed directly above the gate pad 232 and may contact the gate pad 232 through one of the first contact holes 258. In addition, the double-layered data pad terminal may be disposed directly above the data pad 230 and may contact the data pad 230 through the second contact hole 260 (in FIG. 10J). The double-layered connecting electrode may comprise the first and second connecting electrodes 284 and 286 and may be disposed to overlap a portion of the gate pad 232 and an end portion of the gate line 202 so that the double-layered connecting electrode may contact the gate pad 232 and the gate line 202, respectively, through the first contact hole 258 and the third contact hole 262. Therefore, the double-layered connecting electrode may electrically connect the gate line 202 to the gate pad 232.

Meanwhile, the color filter pattern 268 may be interposed between the first and second connecting electrodes 284 and 286. Accordingly, if the color filter pattern 268 is not formed to fit into the third contact hole 262, the etchant and developer solutions may degrade the gate line 202. For example, Galvanic corrosion may occur between the gate line 202 and the double-layered connecting electrode, thereby deteriorating the gate line 202.

According to the present invention, since the gate pads may be formed of the same material as the data lines, i.e., chromium (Cr), molybdenum (Mo), copper (Cu), tungsten (W), titanium (Ti), and an alloy of any combination thereof, the gate pads may not be damaged by the developer solution that patterns the color resin and forms the color filters since they are relatively strong against the developer solution. Furthermore, due to the first transparent electrode layer and the color filter pattern, the aluminum-based gate line may not be damaged by the etchant and developer solutions during later processing steps.

According to the present invention, the array substrate only requires five mask processes, as described with reference to FIGS. 8A-8M, 9A-9M, and 10A-10M. Thus, work efficiency may be increased and production costs may be reduced. In addition, since the black matrix and color filters may be formed in the array substrate, an aligning margin may not need to be considered when designing and aligning the lower and upper substrates, thereby increasing an aperture ratio. Furthermore, the gate line and electrode, which are chemically weak, may be protected from developer and etchant solution, thereby stabilizing and simplifying the fabrication process of the array substrate and reducing production costs.

Figure 11:
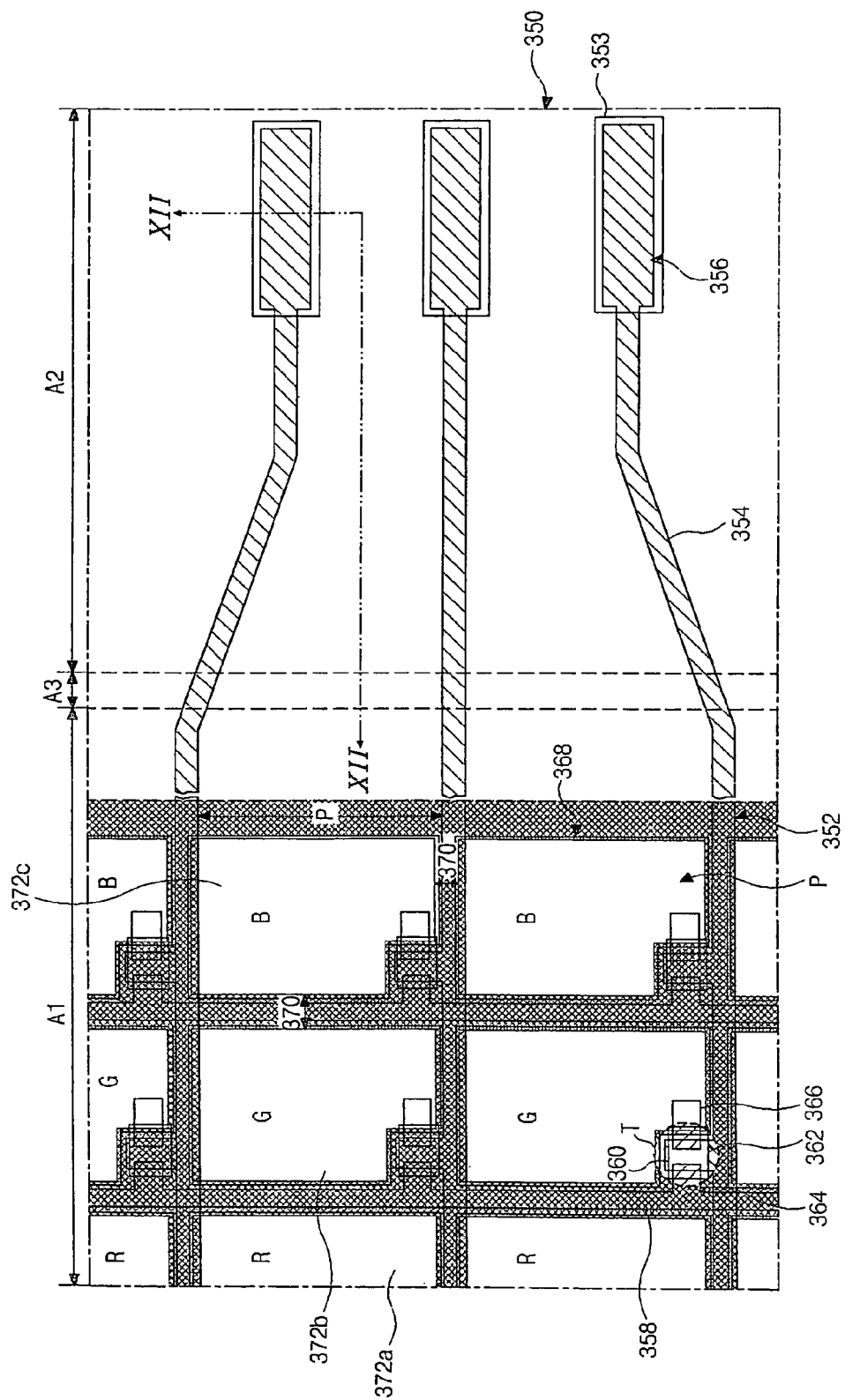
FIG. 11 is a plan view of exemplary peripheral portions of an array substrate having a color filter on a thin film transistor (COT) structure according to the present invention.

FIG. 11 is a plan view of exemplary peripheral portions of an array substrate having a color filter on a thin film transistor (COT) structure according to the present invention, and illustrates a display area and a non-display area thereof. In FIG. 11, the array substrate may have a similar configurations of a color filter on a thin film transistor (COT) structure, as the above-mentioned array substrate. As shown in FIG. 11, an array substrate 350 may be divided into a display area A1, a non-display area A2, and a boundary area A3. Within the display area A1, gate lines 352 may be disposed along a first direction and data lines 358 may be disposed along a second direction crossing the gate lines 352, thereby defining pixel regions P at the crossings of the gate and data lines 352 and 358. Gate pads 356 may be disposed within the non-display area A2, and each of the gate pads 356 may be connected to the gate line 352 by a gate link line 354. Although not shown in FIG. 11, the data line 358 may also have a connection with a data pad through a data link line. A gate pad terminal 353 may have an island shape and may be disposed above each of the gate pad 356. In addition, the gate pad terminal 353 may be connected to the external driving circuits and may function to receive driving signals from the external driving circuits.

A thin film transistor T may be disposed near the crossings of the gate and data lines 352 and 358, and may include a gate electrode 360, an active layer 362, and source and drain electrodes 364 and 366. In addition, a pixel electrode 368 of a transparent conductive material may be located within the pixel region P. A black matrix 370 may be disposed to correspond to a position of the gate line 352, the data line 358, and the thin film transistors T, and may include openings that correspond to the pixel regions P. On the pixel electrodes 368, are disposed color filters 372a, 372b, and 372c that may have red (R), green (G), and blue (B) colors. Each of the color filters 372a, 372b, and 372c may correspond to the pixel region P.

Figure 12:
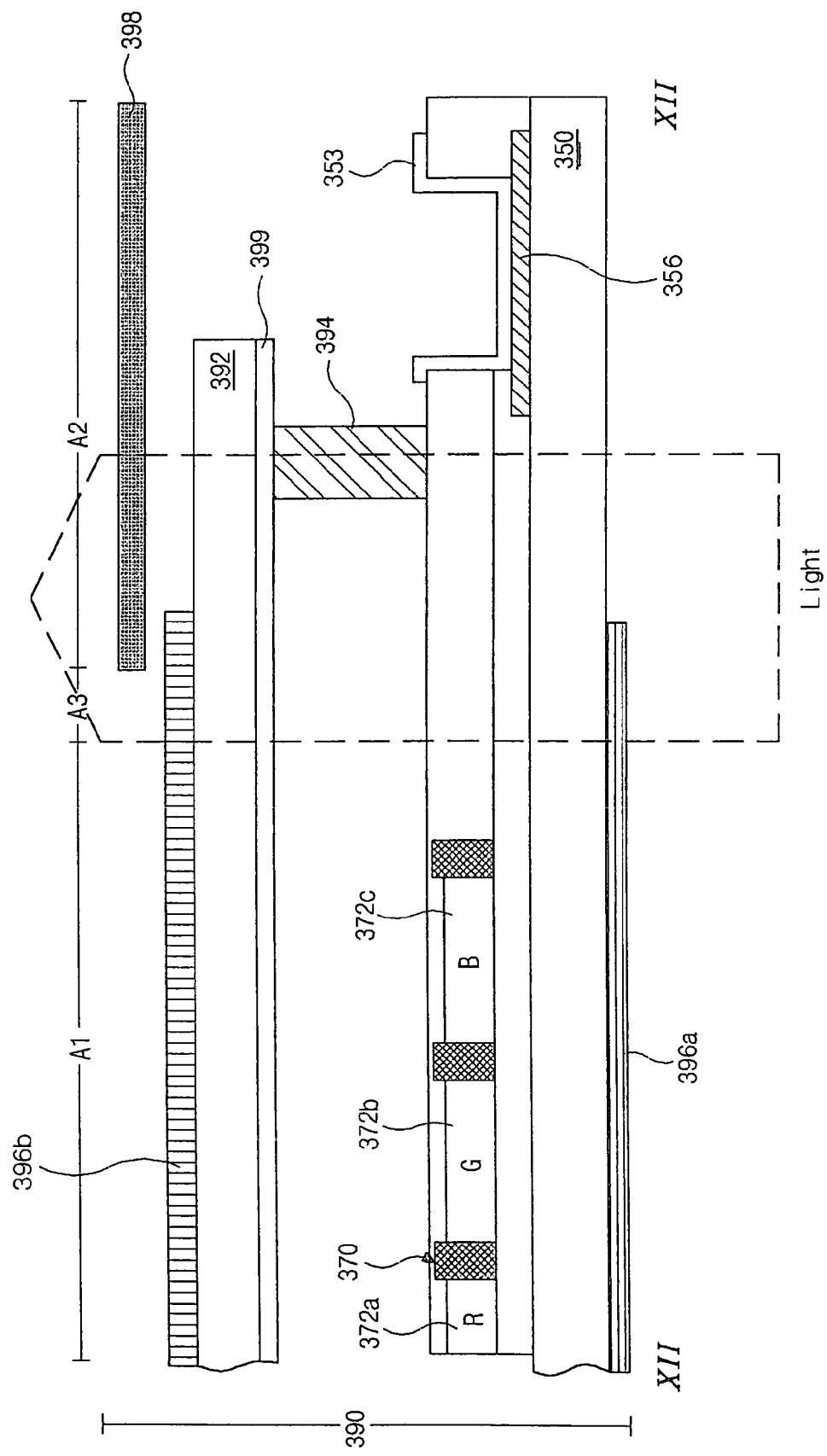
FIG. 12 is a cross sectional view along XII-XII of FIG. 11 showing an exemplary liquid crystal display device having a color filter on a thin film transistor (COT) structure according to the present invention.

FIG. 12 is a cross sectional view along XII-XII of FIG. 11 showing an exemplary liquid crystal display device having a color filter on a thin film transistor (COT) structure according to the present invention. In FIG. 12, the liquid crystal display device 390 having the COT structure may include a first substrate (i.e., the array substrate) 350 and a second substrate 392 that are attached to each other using a sealant 394. The sealant 394 may be located at a non-display area A2 disposed around the first and second substrates 350 and 392. The gate pad 356 and the gate pad terminal 353 may be located within the non-display area A2 and the gate pad terminal 353 may be exposed to provide connection with the external driving circuits. In addition, first and second polarizers 396a and 396b may be provided on outer parts of the first and second substrates 350 and 392. In the liquid crystal display device 390, a top cover 398 may be disposed over the second substrate 392 to cover a non-display area A3. A common electrode 399 of a transparent conductive material may be disposed on the inner part of the second substrate 392. Located over the first substrate 350 are the color filters 372a, 372b, and 372c and the black matrix 370. Although not show in FIG. 12, other array elements may also be disposed over the first substrate 350.

Figure 13:
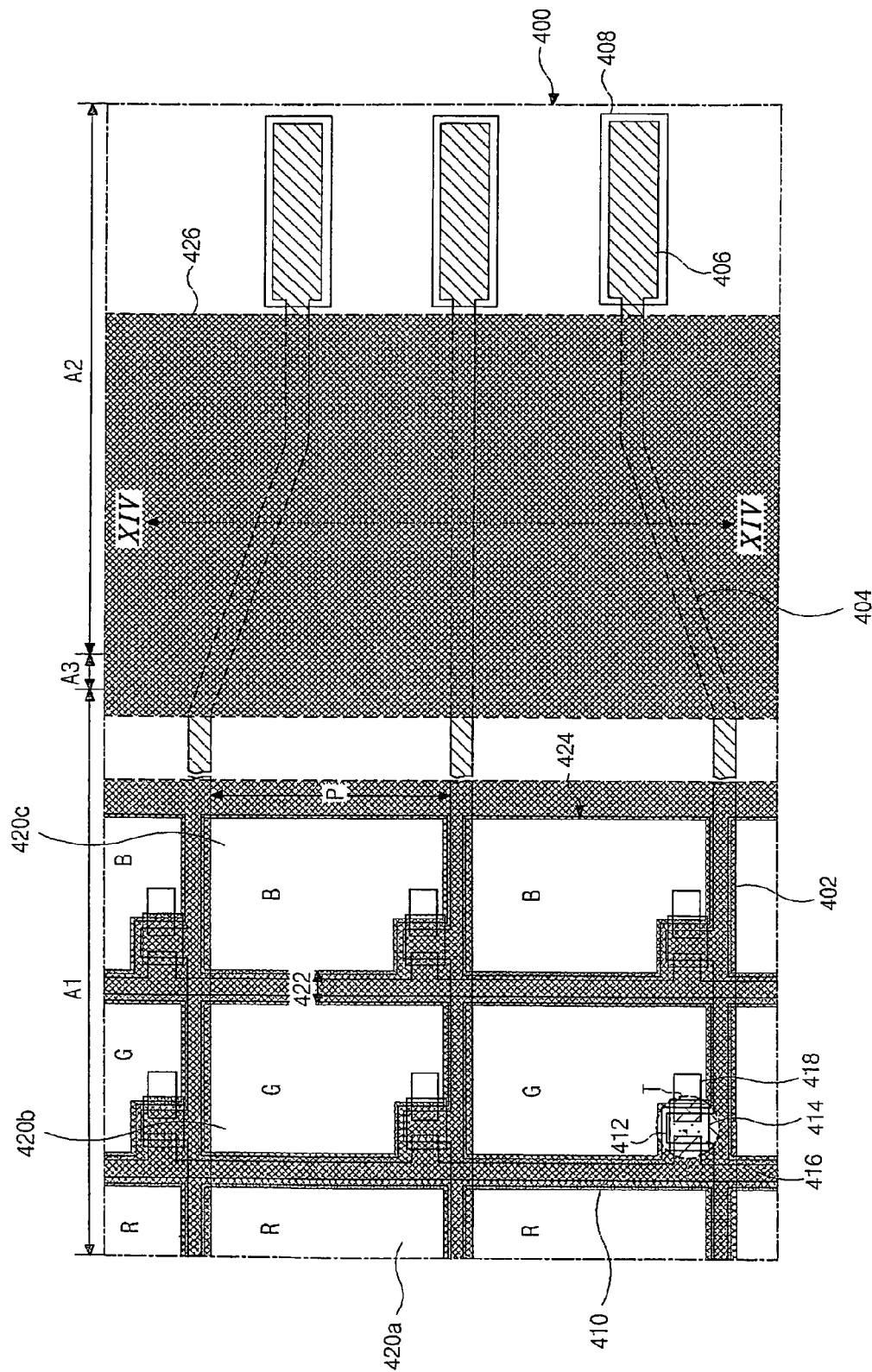
FIG. 13 is a plan view of other exemplary peripheral portions of an array substrate having a color filter on a thin film transistor (COT) structure according to the present invention.

FIG. 13 is a plan view of other exemplary peripheral portions of an array substrate having a color filter on a thin film transistor (COT) structure according to the present invention. Like the array substrate of FIG. 11, an array substrate 400 of FIG. 13 may also be divided into a display area A1, a non-display area A2, and a boundary area A3. The array substrate 400 of FIG. 13 may be very similar to the array substrate 350 of FIG. 11, but may include an additional element.

Within the display area A1, gate lines 402 may be disposed along a first direction and data lines 410 may be disposed along a second direction crossing the gate lines 402, wherein the crossings of the gate and data lines 402 and 410 may define pixel regions P. Gate pads 406 may be disposed within the non-display area A2, and each of the gate pads 406 may be connected to the gate line 402 by a gate link line 404. Although not shown in FIG. 13, the data line 410 may also have a connection with a data pad through a data link line. A gate pad terminal 408 may have an island shape and may be disposed above each of the gate pad 406, wherein the gate pad terminal 408 may be formed of a transparent conductive material, and may be connected to the external driving circuits to receive driving signals from the external driving circuits.

Near the crossing of the gate and data lines 402 and 410, disposed is a thin film transistor T that includes a gate electrode 412, an active layer 414 and source and drain electrodes 416 and 418. In addition, a pixel electrode 424 of a transparent conductive material may be located within the pixel region P, and a black matrix 422 may be disposed corresponding to position of the gate line 402, the data line 410, and the thin film transistors T, wherein the black matrix 422 may have openings that correspond to the pixel regions P. Disposed on the pixel electrodes 424 are color filters 420a, 420b, and 420c that have red (R), green (G), and blue (B) colors, wherein each of the color filters 420a, 420b, and 420c may correspond to the pixel region P.

Meanwhile, the array substrate 400 of FIG. 13 may have a light-shielding pattern 426 that covers the gate link line 404. For example, the light-shielding pattern 426 may cover the non-display area A2 except for the regions for gate pads 406, and may completely cover the boundary area A3. The light-shielding pattern 426 may usually be formed at the same process with the black matrix 422 that is in the display area A1. Alternatively, the light-shielding pattern 426 may be formed during the process of forming the color filters 420a, 420b, and 420c. If the light-shielding pattern 426 is formed with the color filters 420a, 420b, and 420c, then the light-shielding pattern 426 may consist of more than two color filters.

Figure 14A:
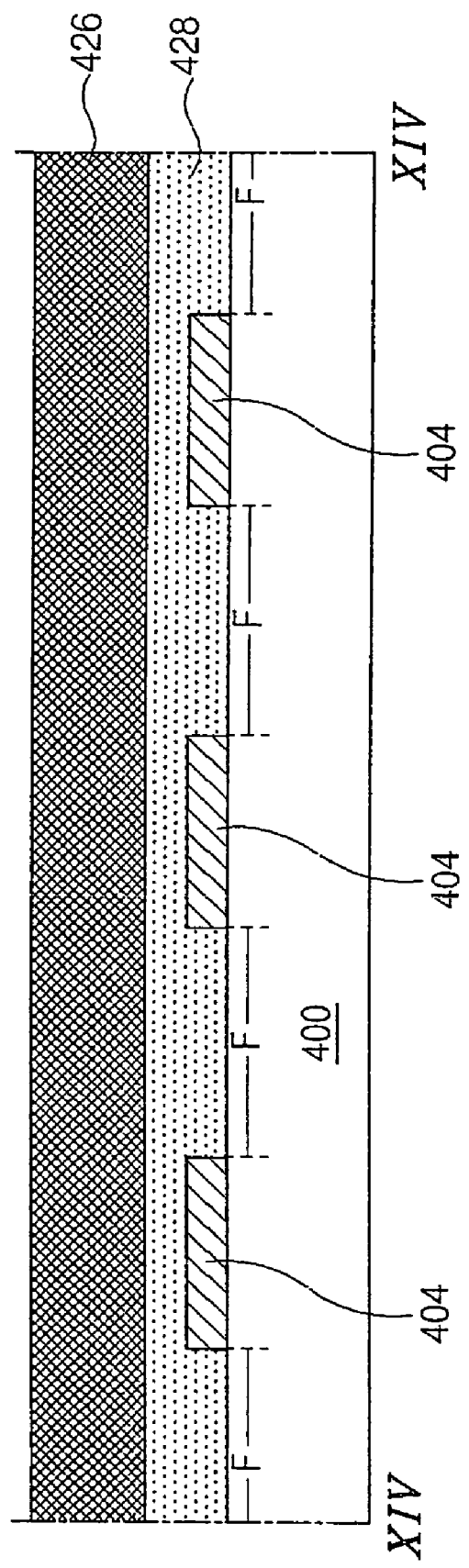
FIGS. 14A and 14B are cross sectional views along XIV-XIV of FIG. 13 according to the present invention.
Figure 14B:
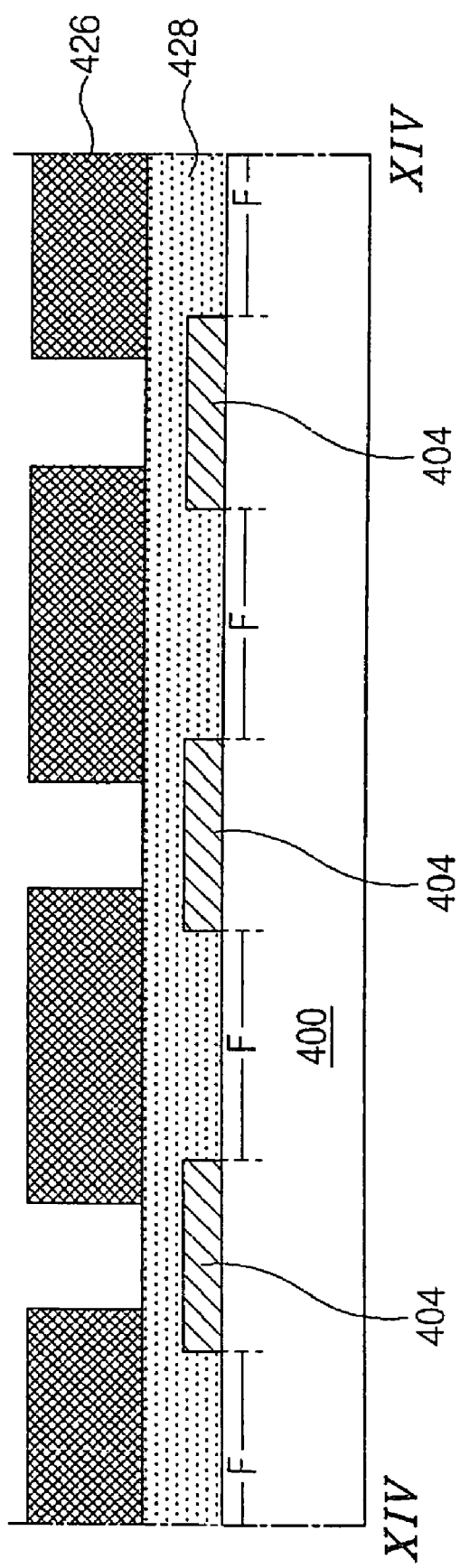

FIGS. 14A and 14B are cross sectional views along XIV-XIV of FIG. 13 according to the present invention. In FIG. 14A, gate link lines 404 may be formed on the substrate 400 with be separating from each other. As described with reference to FIG. 13, each of the gate link lines 404 may connect the gate line 402 to the gate pad 406. In addition, a gate insulating layer 428 may be formed on the substrate 400 to cover the gate link lines 404. Although FIG. 14A shows that the gate insulating layer 428 is a single layer, the gate insulating layer 428 may consist of a double or triple layer structure. A light-shielding pattern 426 may be formed on the gate insulating layer 428 to fully cover the gate link lines 404. Specifically, the light-shielding pattern 426 may cover spaces F among the gate link lines 404. Since the gate link lines 404 may be formed of opaque material and may not allow light to pass through, the light-shielding pattern 426 may cover the spaces F regardless of covering the gate link lines 404. Meanwhile, as shown in FIG. 14B, the light-shielding pattern 426 may be formed to only cover the spaces F.

In FIGS. 14A and 14B, the light-shielding pattern 426 may correspond to the spaces F among the gate link lines 404, and may prevent light leakage. Thus, the liquid crystal display device adopting such array substrate may have high image quality and resolution.

The region wherein the light-shielding pattern is disposed may be location for sealant to attach the first and second substrates together, as shown in FIG. 12. However, the sealant may have poor interfacial characteristics with organic material or resin so that the sealant may peal away from the array substrate having the light-shielding layer. This is due to the light-shielding layer usually being formed of the organic material or black resin.

Figure 15:
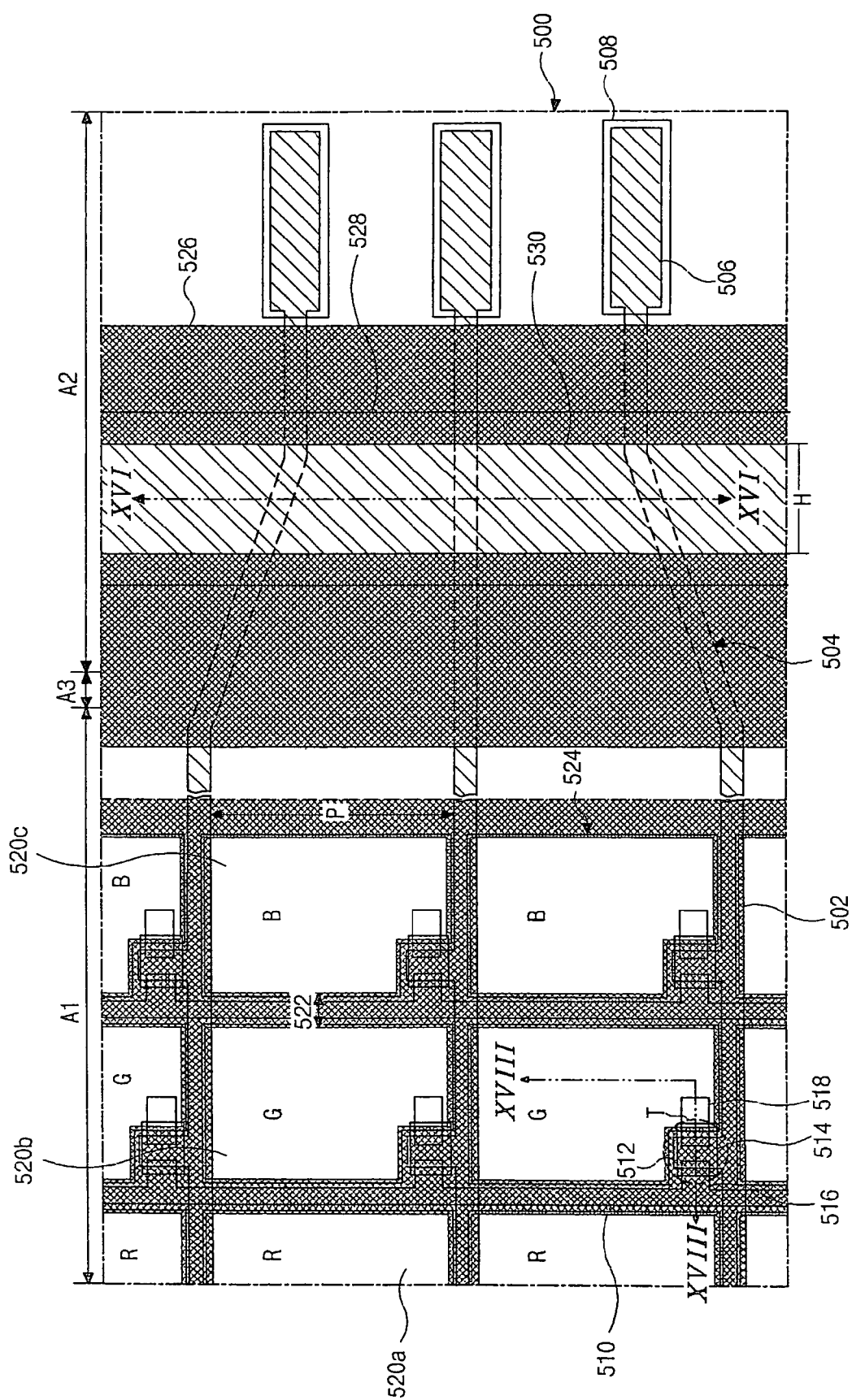
FIG. 15 is a plan view of other exemplary peripheral portions of an array substrate having a color filter on a thin film transistor (COT) structure according to the present invention.

FIG. 15 is a plan view of other exemplary peripheral portions of an array substrate having a color filter on a thin film transistor (COT) structure according to the present invention. In FIG. 15, the array substrate may be similar to the array substrate 400 of FIG. 13. As shown in FIG. 15, the array substrate 500 may be divided into three areas: a display area A1; a non-display area A2; and a boundary area A3. Within the display area A1, gate lines 502 may be disposed along a first direction and data lines 510 may be disposed along a second direction crossing the gate lines 502, wherein the crossings of the gate and data lines 502 and 510 define pixel regions P. In addition, gate pads 506 may be disposed within the non-display area A2, wherein each of the gate pads 506 may be connected to the gate line 502 by a gate link line 504. Although not shown in FIG. 15, the data line 510 may have a connection with a data pad through a data link line. A gate pad terminal 508 having an island shape may be disposed above each of the gate pad 506, and may be formed of a transparent conductive material. Although not shown in FIG. 15, the gate pad terminal 508 may be connected to external driving circuits and may receive driving signals from the external driving circuits.

A thin film transistor T may be disposed near the crossings of the gate and data lines 502 and 510, and may include a gate electrode 512, an active layer 514, and source and drain electrodes 516 and 518. In addition, a pixel electrode 524 of a transparent conductive material may be located within the pixel region P, and a black matrix 522 may be disposed corresponding to the gate line 502, the data line 510, and the thin film transistors T, and may include openings that correspond to the pixel regions P. Disposed on the pixel electrodes 524 are color filters 520a, 520b, and 520c that have red (R), green (G), and blue (B) colors, wherein each of the color filters 520a, 520b, and 520c may correspond to the pixel region P.

Meanwhile, the array substrate 500 of FIG. 15 may include a light-shielding pattern 526 that covers the gate link line 504. For example, the light-shielding pattern 526 may cover the non-display area A2, except the region for gate pads 506, and may completely cover the boundary area A3. The light-shielding pattern 526 may be formed at the same process with the black matrix 522 that is within the display area A1. Alternatively, the light-shielding pattern 526 may be formed during the process of forming the color filters 520a, 520b, and 520c. If the light-shielding pattern 526 is formed with the color filters 520a, 520b and 520c, then the light-shielding pattern 526 may consist of more than two color filters.

Disposed on the light-shielding pattern 526 is an inorganic insulator 528, and a seal pattern 530 may be located on the inorganic insulator 528. Although FIG. 15 shows that the inorganic insulator 528 and the seal pattern 530 may have different widths, the insulator 528 and pattern 530 may have the same widths. In addition, the configuration and structure of the inorganic insulator 528 and the seal pattern 530 may be changeable.

Figure 16A:
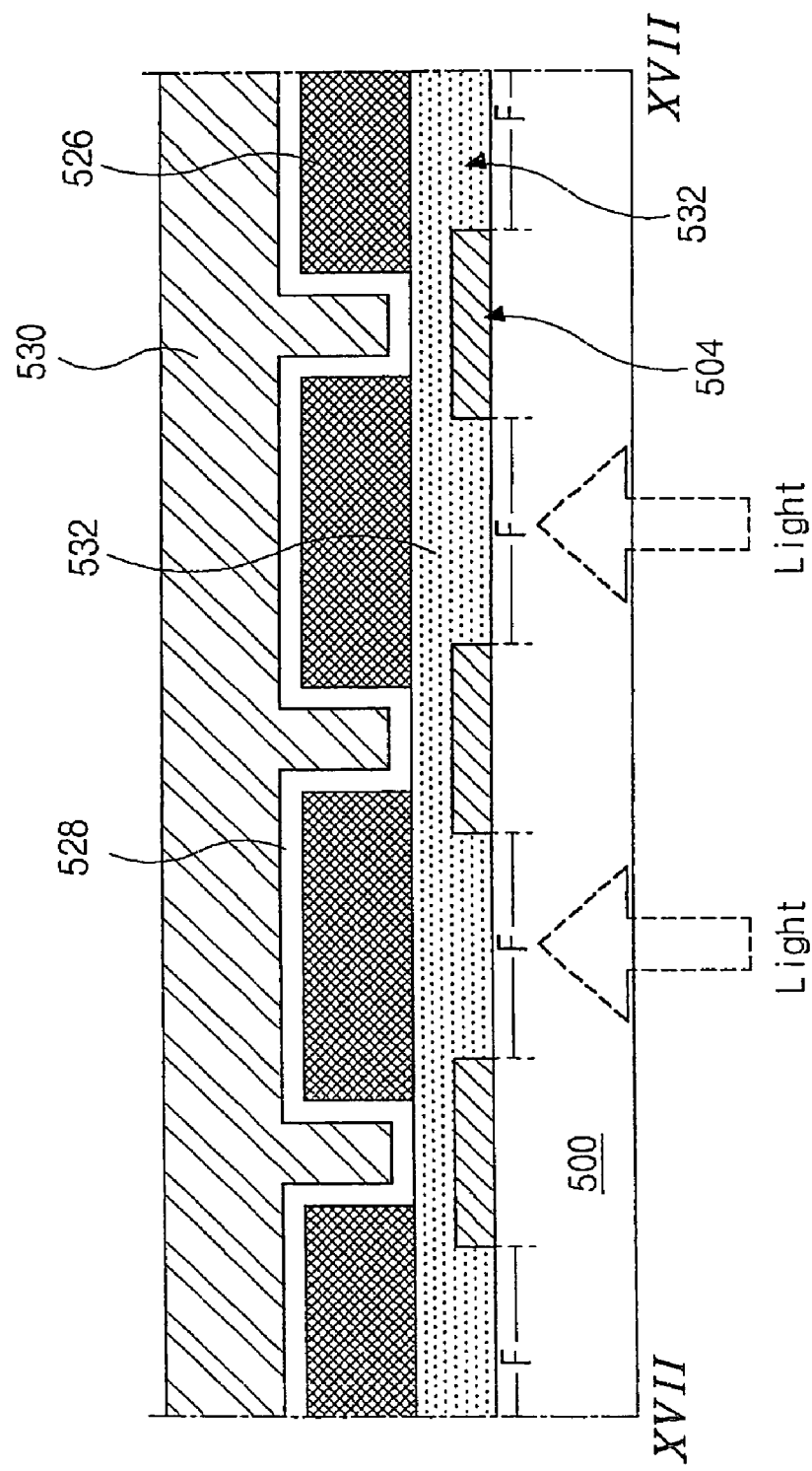
FIGS. 16A and 16B are cross sectional views along XVI-XVI of FIG. 15 according to the present invention.
Figure 16B:
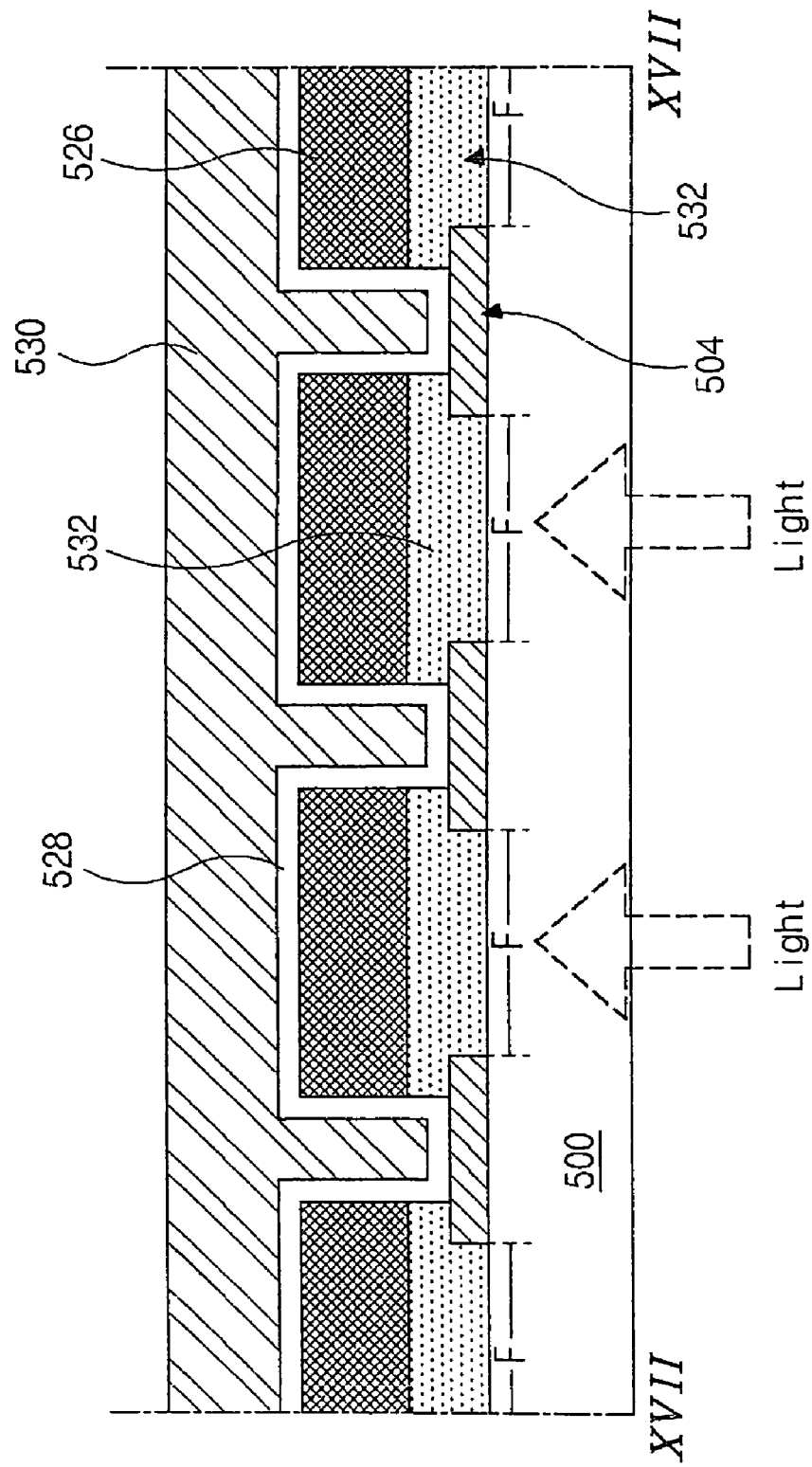

FIGS. 16A and 16B are cross sectional views along XVI-XVI of FIG. 15 according to the present invention. In FIG. 16A, the gate link lines 504 may be formed on the substrate 500 and may be spaced apart from each other. As described with reference to FIG. 15, each of the gate link lines 504 may connect the gate line 502 to the gate pad 506, and a gate insulating layer 532 may be formed on the substrate 500 to cover the gate link lines 504. Although FIG. 16A shows that the gate insulating layer 532 is a single layer, the gate insulating layer 532 may consist of a double or triple layer structure, and a light-shielding pattern 526 may be formed on the gate insulating layer 532. In FIG. 16A, the light-shielding pattern 526 may have openings that correspond to the gate line lines 504, wherein the light-shielding pattern 526 corresponds to spaces F among the gate line lines 504 and may only cover the spaces F. Accordingly, the light-shielding pattern 526 may cover the regions where the light leakage may occur in the liquid crystal display device.

The light-shielding pattern 526 may be formed at the same process with the black matrix 522 that is within the display area A1 of FIG. 15. Alternatively, the light-shielding pattern 526 may be formed during the process of forming the color filters 520a, 520b, and 520c. If the light-shielding pattern 526 is formed with the color filters 520a, 520b, and 520c, then the light-shielding pattern 526 may consist of more than two color filters. Although FIG. 16A shows the light-shielding pattern 526 having the openings, the light-shielding pattern may be formed to fully cover the gate link lines 504. The inorganic insulator 528 may be formed over the gate insulating layer 532 to cover the light-shielding pattern 526, and may include silicon nitride ($SiN_x$) or silicon oxide ($SiO_2$). Then, a seal pattern 530 may be formed on the inorganic insulator 528.

In FIG. 16B, the gate link lines 504 may be formed on the substrate 500 and may be spaced apart from each other. As described with reference to FIG. 15, each of the gate link lines 504 may connect the gate line 502 to the gate pad 506, and a gate insulating layer 532 may be formed on the substrate 500 to cover the gate link lines 504. Although FIG. 16B shows that the gate insulating layer 532 is a single layer, the gate insulating layer 532 may consist of a double or triple layer structure.

After forming the gate insulating layer 532, the gate insulating layer 532 may be patterned to expose the gate line lines 504, as shown in FIG. 16B. Then, a light-shielding pattern 526 may be formed on the gate insulating layer 532 to include openings that correspond to the gate line lines 504, wherein the light-shielding pattern 526 corresponds to the spaces F among the gate link lines 504 and only covers the spaces F. Specifically, the light-shielding pattern 526 may be formed to correspond to the patterned gate insulating layer 532. Accordingly, the light-shielding pattern 526 may cover the regions where the light leakage may occur in the liquid crystal display device. The light-shielding pattern 526 may be formed at the same process with the black matrix 522 that is within the display area A1 of FIG. 15. Alternatively, the light-shielding pattern 526 may be formed during the process of forming the color filters 520a, 520b, and 520c. If the light-shielding pattern 526 is formed with the color filters 520a, 520b, and 520c, then the light-shielding pattern 526 may consist of more than two color filters. In addition, the inorganic insulator 528 may be formed over the gate insulating layer 532 to cover the light-shielding pattern 526, and may include silicon nitride ($SiN_x$) or silicon oxide ($SiO_2$). Then, the seal pattern 530 may be formed on the inorganic insulator 528.

In FIG. 16B, since the gate insulating layer 532 may be patterned, the seal pattern 530 may be increased to increase a contact area with the gate insulating layer 528, as compared with that of FIG. 16A.

Figure 17:
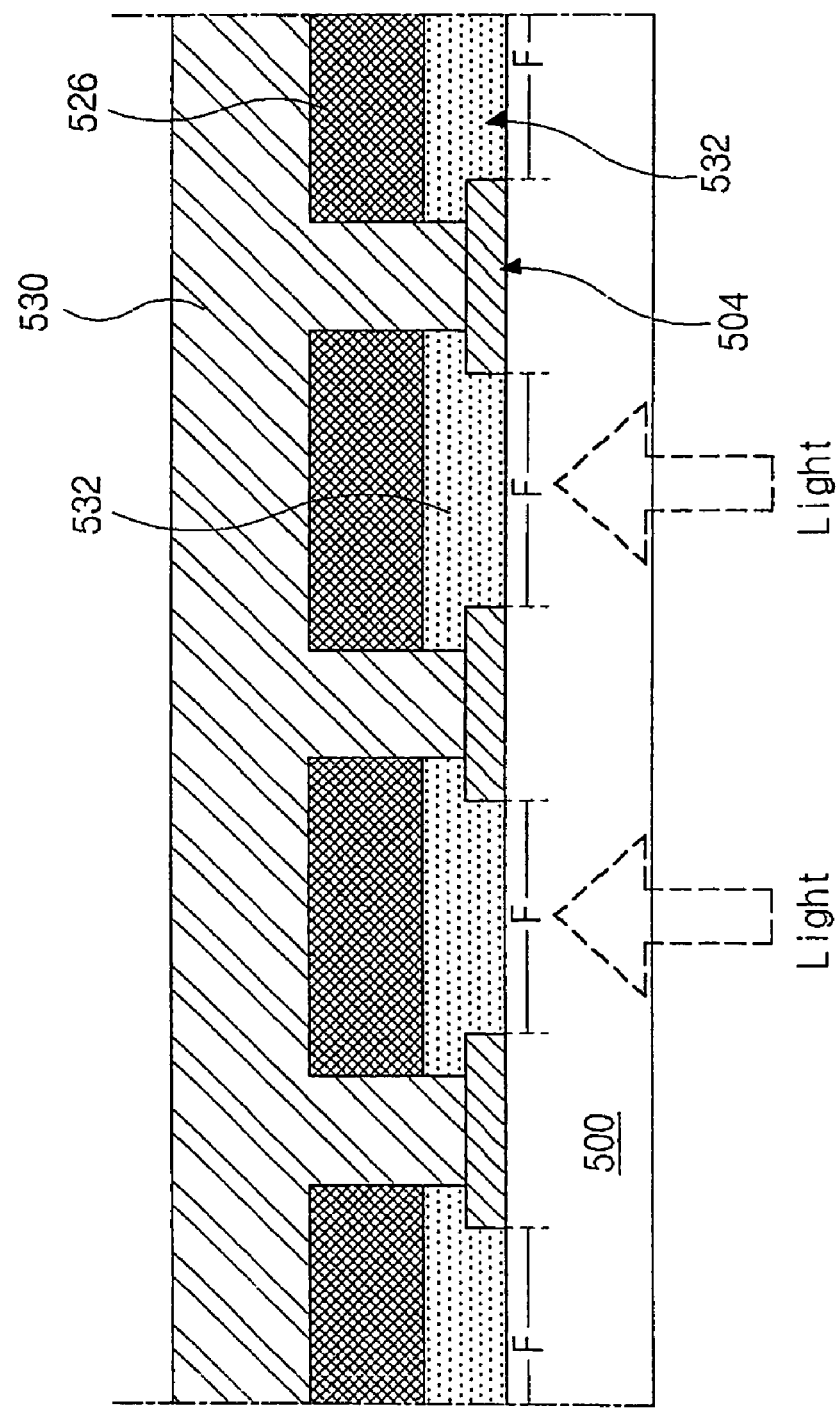
FIG. 17 is a cross sectional view of an exemplary seal pattern structure according to the present invention.

FIG. 17 is a cross sectional view of an exemplary seal pattern structure according to the present invention. Although FIG. 17 may be similar to FIG. 16B, no inorganic insulator may be provided. In FIG. 17, gate link lines 504 may be formed on a substrate 500 and may be spaced apart from each other. As described with reference to FIG. 15, each of the gate link lines 504 may connect the gate line 502 to the gate pad 506. In addition, a gate insulating layer 532 may be formed on the substrate 500 to cover the gate link lines 504. Although FIG. 17 shows that the gate insulating layer 532 is a single layer, the gate insulating layer 532 may consisting of a double or triple layer structure.

After forming the gate insulating layer 532, the gate insulating layer 532 may be patterned to expose the gate line lines 504, as shown in FIG. 17. Thereafter, a light-shielding pattern 526 may be formed on the gate insulating layer 532 to have openings that correspond to the gate link lines 504. Thus, the light-shielding pattern 526 may correspond to the spaces F among the gate line lines 504 and may only cover the spaces F. For example, the light-shielding pattern 526 may be formed to correspond to the patterned gate insulating layer 532. Accordingly, the light-shielding pattern 526 may cover the regions where the light leakage may occur in the liquid crystal display device. The light-shielding pattern 526 may be formed at the same process with the black matrix 522 that is within the display area A1 of FIG. 15. Alternatively, the light-shielding pattern 526 may be formed during the process of forming the color filters 520a, 520b, and 520c. If the light-shielding pattern 526 is formed with the color filters 520a, 520b, and 520c, then the light-shielding pattern 526 may consisting of more than two color filters. The light-shielding pattern 526 may be formed on the patterned gate insulating layer using a printing method.

After forming the light-shielding pattern 526, the seal pattern 530 may be formed over the light-shielding pattern 526 and may directly contact the light-shielding pattern 526 and the exposed portions of the gate link line 504. Unlike FIGS. 16A and 16B, the inorganic insulator may not be interposed between the light-shielding pattern 526 and the seal pattern 530, as shown in FIG. 17. Although the inorganic insulator may not be adopted in FIG. 17, the seal pattern 530 may have enough adhesion strength since the seal pattern may have the increased contact area with the previously formed layer elements.

Figure 18A:
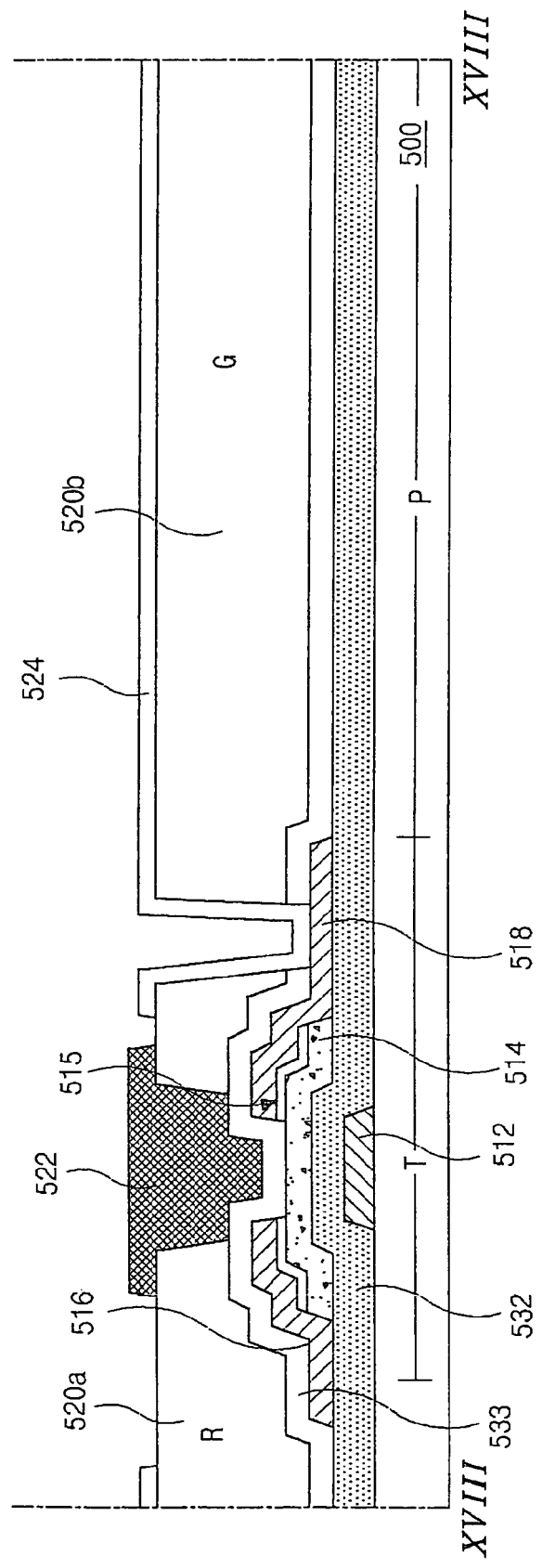
FIGS. 18A to 18C are cross sectional views along XVIII-XVIII of FIG. 15 according to the present invention.
Figure 18B:
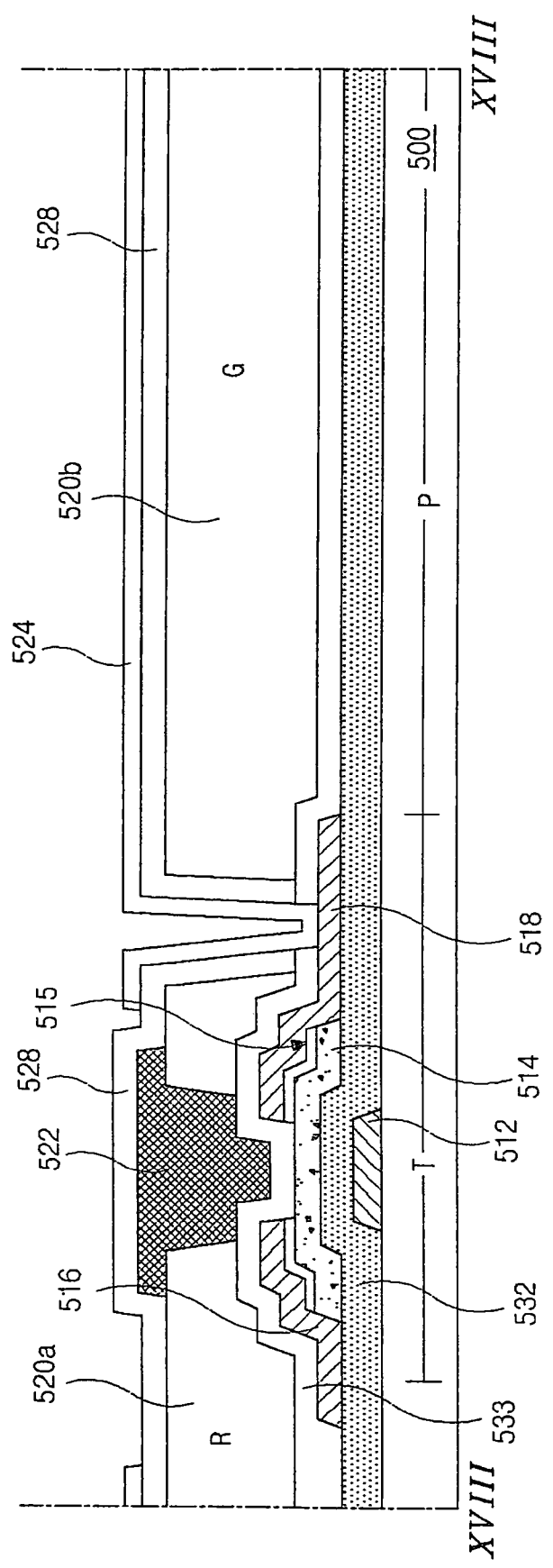
Figure 18C:
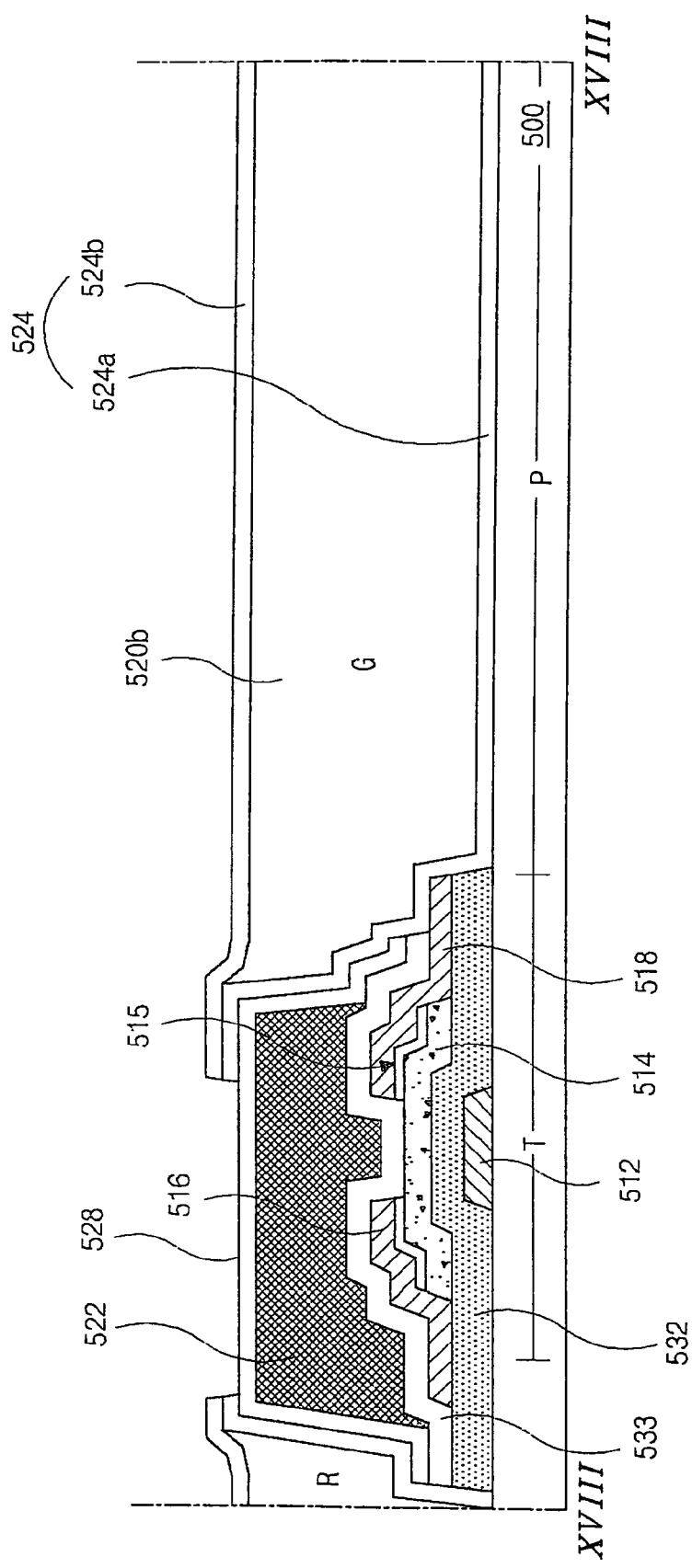

FIGS. 18A to 18C are cross sectional views along XVIII-XVIII of FIG. 15 according to the present invention. In FIG. 18A, the gate electrode 512 may be formed on the substrate 500, and the gate insulating layer 532 may be formed along an entire surface of the substrate 500 to cover the gate electrode 512. An active layer 514 and an ohmic contact layer 515 may be sequentially formed on the gate insulating layer 532, especially over the gate electrode 512. The source electrode 516 may be formed on one portion of the ohmic contact layer 515, and the drain electrode 518 may be formed on the other portion of the ohmic contact layer 515, thereby forming the thin film transistor T and the source and drain electrodes 516 and 518 may be spaced apart from each other. After forming the source and drain electrodes 516 and 518, an interlayer insulator 533 may be formed along an entire surface of the substrate 500 so that the interlayer insulator 533 covers the source and drain electrodes 516 and 518. The interlayer insulator 533 may include inorganic material, such as silicon nitride or silicon oxide, and may protect the exposed active layer 514.

Within the pixel regions P, which may be defined by the crossings of the gate and data lines 502 and 510, as shown in FIG. 15, the color filters 520a and 520b having red (R) and green (G) colors may be formed on the interlayer insulator 533, wherein each of the color filters 520 may corresponds to each pixel region P. After forming the color filters 520, the black matrix 522 may be formed on the interlayer insulator 533 and over the thin film transistor T. When forming the color filters 520 or forming the black matrix 522, the light-shielding pattern 526 of FIGS. 15-17 may also be formed as described herein before. If the light-shielding pattern 526 is formed with the color filters 520, then the light-shielding pattern 526 may consist of the two or three color filters. After forming the black matrix 522, a drain contact hole that exposes a portion of the drain electrode 518 may be formed by simultaneously patterning the interlayer insulator 533 and the color filters 520. At this time of patterning the interlayer insulator 533 and the color filters 520, the gate insulating layer 532 of FIG. 17 may be patterned to expose the portions of the gate link lines 504. Furthermore, the gate insulating layer 532 of FIG. 17 may be a double layer structure including the interlayer insulator 533. A pixel electrode 524 of a transparent conductive material may be formed on the color filter 520b within the pixel region P, wherein the pixel electrode 524 may contact the drain electrode 518 through the contact hole that penetrates both the color filter 520b and the interlayer insulator 533.

In FIG. 18B, the gate electrode 512 may be formed on the substrate 500, and then the gate insulating layer 532 may be formed along an entire surface of the substrate 500 to cover the gate electrode 512. Then, an active layer 514 and an ohmic contact layer 515 may be sequentially formed on the gate insulating layer 532, especially over the gate electrode 512. The source electrode 516 may be formed on one portion of the ohmic contact layer 515, and the drain electrode 518 may be formed on the other portion of the ohmic contact layer 515, thereby forming the thin film transistor T. After forming the source and drain electrodes 516 and 518, an interlayer insulator 533 may be formed along an entire surface of the substrate 500 so that the interlayer insulator 533 covers the source and drain electrodes 516 and 518. The interlayer insulator 533 may include inorganic material, such as silicon nitride or silicon oxide, and may protect the exposed active layer 514.

Within the pixel regions P, which may be defined by the crossings of the gate and data lines 502 and 510, as shown in FIG. 15, the color filters 520a and 520b having red (R) and green (G) colors may be formed on the interlayer insulator 533, wherein each of the color filters 520 may corresponds to each of the pixel regions P. After forming the color filters 520, the black matrix 522 may be formed on the interlayer insulator 533 and over the thin film transistor T, wherein the black matrix 522 may cover the active layer 514. As described herein before, the light-shielding pattern 526 of FIGS. 15-17 may also be formed during the formation of color filter 520 and the formation of the black matrix 522. If the light-shielding pattern 526 of FIGS. 15-17 is formed with the color filters 520, then the light-shielding pattern 526 may consist of two or three color filters. The inorganic insulator 528 may be formed along an entire surface of the substrate 500 to cover the black matrix 522 and the color filters 520a and 520b. A drain contact hole that exposes a portion of the drain electrode 518 may be formed by simultaneously patterning the inorganic insulator 528 and the interlayer insulator 533. During patterning of the inorganic insulator 528 and the interlayer insulator 533, the gate insulating layer 532 of FIG. 17 may be patterned to expose the portions of the gate link lines 504. Furthermore, the gate insulating layer 532 of FIG. 17 can be a double layer including the interlayer insulator 533.

In FIG. 18C, the thin film transistor T may have the structure similar to those of FIGS. 18A and 18B. However, the pixel electrode and the black matrix of FIG. 18C may be different from those of FIGS. 18A and 18B. In FIG. 18C, the gate electrode 512 may be formed on the substrate 500, and the gate insulating layer 532 may be formed along an entire surface of the substrate 500 to cover the gate electrode 512. An active layer 514 and an ohmic contact layer 515 may be sequentially formed on the gate insulating layer 532, especially over the gate electrode 512. The source electrode 516 may be formed on one portion of the ohmic contact layer 515, and the drain electrode 518 may be formed on the other portion of the ohmic contact layer 515, thereby forming the thin film transistor T. After forming the source and drain electrodes 516 and 518, an interlayer insulator 533 may be formed along an entire surface of the substrate 500 so that the interlayer insulator 533 may cover the source and drain electrodes 516 and 518. The interlayer insulator 533 may include an inorganic material, such as silicon nitride or silicon oxide, and may protect the exposed active layer 514. In addition, a black matrix 522 may be formed on the interlayer insulator 533 to cover the thin film transistor T, except for a portion of the drain electrode 518. As described herein before, the light-shielding pattern 526 of FIGS. 15-17 may also be formed during the formation of the black matrix 522.

After forming the black matrix 522, the inorganic insulator 528 may be formed along an entire surface of the substrate 500 to cover the black matrix 522. The gate insulating layer 532, the interlayer insulator 533, and the inorganic insulator 528 may be simultaneously patterned within the pixel regions P to expose the portion of the drain electrode 518. As a result of patterning, the substrate 500 may be exposed within the pixel region P. Then, a first transparent conductive layer 524a may be formed along an entire surface of the substrate 500 to cover the patterned inorganic insulator 528, wherein the first transparent conductive layer 524a may contact the drain electrode 518. Then, the color filters 520a and 520b may be formed on the first transparent conductive layer 524a, wherein each of the color filters 520 may correspond to the pixel regions P. A second transparent conductive layer 524b may be formed on the color filters 520a and 520b to contact the first transparent conductive layer 524a. Then, the first and second transparent conductive layers 524a and 524b may be simultaneously patterned to form a double-layered pixel electrode 524.

According to the present invention, the light-shielding pattern may be disposed over the gate link lines, as shown in FIGS. 13 and 15. However, the light-shielding pattern may be formed over the data link lines. Since the light-shielding pattern of the present invention may prevent the light leakage along peripheries of the substrate, the liquid crystal display device can have high resolution of images.

It will be apparent to those skilled in the art that various modifications and variations can be made in the array substrate having a color filter on a thin film transistor (COT) structure and a method of fabricating array substrate having a color filter on a thin film transistor (COT) structure of the present invention without departing from the spirit or scope of the inventions. Thus, it is intended that the present invention covers the modifications and variations of this invention provided they come within the scope of the appended claims and their equivalents.

What is claimed is:

1. A method of fabricating a liquid crystal display device, the method comprising:
    preparing a first substrate and a second substrate, the first substrate having a display area, a non-display area and a boundary area, the boundary area disposed between the display area and the non-display area;
    forming a plurality of gate lines on the first substrate within the display area;
    forming a plurality of gate pads on the first substrate within the non-display area;
    forming a plurality of gate link lines on the first substrate disposed in the non-display area and in the boundary area connecting the gate lines to the gate pads;
    forming a plurality of data lines crossing the gate lines to define a plurality of pixel regions;
    forming a plurality of thin film transistors adjacent to the crossing of the gate and data lines;
    forming a first insulating layer on the thin film transistors;
    forming a color filter layer on the first insulating layer in the pixel region;
    forming a second insulating layer on the color filter layer;
    forming a contact hole passing through at least the first and second insulating layers;
    forming a light-shielding pattern in the non-display area and the boundary area corresponding to the gate link lines and spaces between the gate link lines;
    forming a pixel electrode on the second insulating layer in the pixel region, the pixel electrode electrically connected to a drain electrode of the thin film transistor through the contact hole; and
    attaching the first and second substrates together.

2. The method according to claim 1, wherein the second insulating layer is formed of an inorganic insulating material.

3. The method according to claim 2, wherein the first insulating layer is formed of an inorganic insulating material.

4. The method according to claim 1, wherein the color filter layer is directly formed on the first insulating layer.

5. The method according to claim 1, wherein the second insulating layer is directly formed on the color filter layer.

6. The method according to claim 1, further comprising forming a black matrix on the first insulating layer over the thin film transistor.

7. The method according to claim 6, wherein the black matrix is formed of an organic material.

* * * * *